(12) United States Patent
Vorbach et al.

(10) Patent No.: US 7,822,881 B2
(45) Date of Patent: Oct. 26, 2010

(54) PROCESS FOR AUTOMATIC DYNAMIC RELOADING OF DATA FLOW PROCESSORS (DFPS) AND UNITS WITH TWO- OR THREE-DIMENSIONAL PROGRAMMABLE CELL ARCHITECTURES (FPGAS, DPGAS, AND THE LIKE)

(76) Inventors: Martin Vorbach, Hagebuttenweg 36, D-76149 Karlsruhe (DE); Robert Münch, Hagebuttenweg 36, D-76149 Karlsruhe (DE)

( * ) Notice: Subject to any disclaimer, the term of this patent is extended or adjusted under 35 U.S.C. 154(b) by 0 days.

(21) Appl. No.: 11/246,617

(22) Filed: Oct. 7, 2005

(65) Prior Publication Data

US 2006/0031595 A1 Feb. 9, 2006

Related U.S. Application Data

(63) Continuation of application No. 10/265,846, filed on Oct. 7, 2002, now Pat. No. 7,028,107, which is a continuation of application No. 09/613,217, filed on Jul. 10, 2000, now Pat. No. 6,477,643, which is a continuation of application No. 08/947,002, filed on Oct. 8, 1997, now Pat. No. 6,088,795.

(30) Foreign Application Priority Data

Dec. 27, 1996 (DE) ............................... 196 54 846

(51) Int. Cl.
*G06F 3/00* (2006.01)
*G06F 15/76* (2006.01)

(52) U.S. Cl. .................. 710/8; 710/1; 710/10; 711/147; 711/152; 711/153; 712/10; 712/16; 712/23; 716/16

(58) Field of Classification Search ........................ None
See application file for complete search history.

(56) References Cited

U.S. PATENT DOCUMENTS 2,067,477 A 1/1937 Cooper (Continued)

FOREIGN PATENT DOCUMENTS

DE 42 21 278 1/1994

(Continued)

OTHER PUBLICATIONS

Arabi et al., "PLD Integrates Dedicated High-speed Data Buffering, Complex State Machine, and Fast Decode Array," conference record on WESCON '93, Sep. 28, 1993, pp. 432-436.

(Continued)

*Primary Examiner*—Eron J Sorrell
*Assistant Examiner*—Dean Phan
(74) *Attorney, Agent, or Firm*—Kenyon & Kenyon LLP

(57) ABSTRACT

In a data-processing method, first result data may be obtained using a plurality of configurable coarse-granular elements, the first result data may be written into a memory that includes spatially separate first and second memory areas and that is connected via a bus to the plurality of configurable coarse-granular elements, the first result data may be subsequently read out from the memory, and the first result data may be subsequently processed using the plurality of configurable coarse-granular elements. In a first configuration, the first memory area may be configured as a write memory, and the second memory area may be configured as a read memory. Subsequent to writing to and reading from the memory in accordance with the first configuration, the first memory area may be configured as a read memory, and the second memory area may be configured as a write memory.

4 Claims, 21 Drawing Sheets

U.S. PATENT DOCUMENTS

| | | | |
|---|---|---|---|
| 3,242,998 A | 3/1966 | Gubbins | |
| 3,681,578 A | 8/1972 | Stevens | |
| 3,757,608 A | 9/1973 | Willner | |
| 3,855,577 A | 12/1974 | Vandierendonck | |
| 4,233,667 A | 11/1980 | Devine et al. | |
| 4,414,547 A | 11/1983 | Knapp et al. | |
| 4,498,134 A | 2/1985 | Hansen et al. | |
| 4,498,172 A | 2/1985 | Bhavsar | |
| 4,566,102 A | 1/1986 | Hefner | |
| 4,571,736 A | 2/1986 | Agrawal et al. | |
| 4,590,583 A | 5/1986 | Miller | |
| 4,591,979 A | 5/1986 | Iwashita | |
| 4,623,997 A | 11/1986 | Tulpule | |
| 4,663,706 A | 5/1987 | Allen et al. | |
| 4,667,190 A * | 5/1987 | Fant | 345/568 |
| 4,682,284 A | 7/1987 | Schrofer | |
| 4,686,386 A | 8/1987 | Tadao | |
| 4,706,216 A | 11/1987 | Carter | |
| 4,720,778 A | 1/1988 | Hansen et al. | |
| 4,720,780 A | 1/1988 | Dolecek | |
| 4,739,474 A | 4/1988 | Holsztynski | |
| 4,761,755 A | 8/1988 | Ardini et al. | |
| 4,791,603 A | 12/1988 | Henry | |
| 4,811,214 A | 3/1989 | Nosenchuck et al. | |
| 4,852,043 A | 7/1989 | Guest | |
| 4,852,048 A | 7/1989 | Morton | |
| 4,860,201 A | 8/1989 | Stolfo et al. | |
| 4,870,302 A | 9/1989 | Freeman | |
| 4,882,687 A | 11/1989 | Gordon | |
| 4,884,231 A | 11/1989 | Mor et al. | |
| 4,891,810 A | 1/1990 | de Corlieu et al. | |
| 4,901,268 A | 2/1990 | Judd | |
| 4,910,665 A | 3/1990 | Mattheyses et al. | |
| 4,918,440 A | 4/1990 | Furtek et al. | |
| 4,959,781 A | 9/1990 | Rubinstein et al. | |
| 4,967,340 A | 10/1990 | Dawes | |
| 4,972,314 A | 11/1990 | Getzinger et al. | |
| 4,992,933 A | 2/1991 | Taylor | |
| 5,010,401 A * | 4/1991 | Murakami et al. | 375/240.16 |
| 5,014,193 A | 5/1991 | Garner et al. | |
| 5,015,884 A | 5/1991 | Agrawal et al. | |
| 5,021,947 A | 6/1991 | Campbell et al. | |
| 5,023,775 A | 6/1991 | Poret | |
| 5,034,914 A * | 7/1991 | Osterlund | 710/52 |
| 5,036,473 A | 7/1991 | Butts et al. | |
| 5,041,924 A * | 8/1991 | Blackborow et al. | 360/69 |
| 5,043,978 A | 8/1991 | Nagler et al. | |
| 5,047,924 A | 9/1991 | Fujioka et al. | |
| 5,055,997 A | 10/1991 | Sluijter et al. | |
| 5,065,308 A | 11/1991 | Evans | |
| 5,072,178 A | 12/1991 | Matsumoto | |
| 5,081,375 A | 1/1992 | Pickett et al. | |
| 5,099,447 A * | 3/1992 | Myszewski | 708/607 |
| 5,103,311 A | 4/1992 | Sluijter et al. | |
| 5,109,503 A | 4/1992 | Cruickshank et al. | |
| 5,113,498 A | 5/1992 | Evan et al. | |
| 5,115,510 A | 5/1992 | Okamoto et al. | |
| 5,123,109 A | 6/1992 | Hillis | |
| 5,125,801 A | 6/1992 | Nabity et al. | |
| 5,128,559 A | 7/1992 | Steele | |
| 5,142,469 A | 8/1992 | Weisenborn | |
| 5,144,166 A | 9/1992 | Camarota et al. | |
| 5,193,202 A | 3/1993 | Jackson et al. | |
| 5,203,005 A | 4/1993 | Horst | |
| 5,204,935 A | 4/1993 | Mihara et al. | |
| 5,208,491 A | 5/1993 | Ebeling et al. | |
| 5,212,716 A | 5/1993 | Ferraiolo et al. | |
| 5,212,777 A | 5/1993 | Gove et al. | |
| 5,218,302 A | 6/1993 | Loewe et al. | |
| 5,226,122 A | 7/1993 | Thayer et al. | |
| RE34,363 E | 8/1993 | Freeman | |
| 5,233,539 A | 8/1993 | Agrawal et al. | |
| 5,237,686 A * | 8/1993 | Asano et al. | 718/105 |
| 5,243,238 A | 9/1993 | Kean | |
| 5,247,689 A | 9/1993 | Ewert | |
| RE34,444 E | 11/1993 | Kaplinsky | |
| 5,274,593 A | 12/1993 | Proebsting | |
| 5,276,836 A | 1/1994 | Fukumaru et al. | |
| 5,287,472 A | 2/1994 | Horst | |
| 5,287,511 A | 2/1994 | Robinson et al. | |
| 5,287,532 A | 2/1994 | Hunt | |
| 5,294,119 A | 3/1994 | Vincent et al. | |
| 5,301,284 A | 4/1994 | Estes et al. | |
| 5,301,344 A | 4/1994 | Kolchinsky | |
| 5,303,172 A | 4/1994 | Magar et al. | |
| 5,311,079 A | 5/1994 | Ditlow et al. | |
| 5,327,125 A | 7/1994 | Iwase et al. | |
| 5,336,950 A | 8/1994 | Popli et al. | |
| 5,343,406 A | 8/1994 | Freeman et al. | |
| 5,347,639 A | 9/1994 | Rechtschaffen et al. | |
| 5,349,193 A | 9/1994 | Mott et al. | |
| 5,353,432 A | 10/1994 | Richek et al. | |
| 5,355,508 A | 10/1994 | Kan | |
| 5,361,373 A | 11/1994 | Gilson | |
| 5,365,125 A | 11/1994 | Goetting et al. | |
| 5,379,444 A | 1/1995 | Mumme | |
| 5,386,154 A | 1/1995 | Goetting et al. | |
| 5,386,518 A | 1/1995 | Reagle et al. | |
| 5,392,437 A | 2/1995 | Matter et al. | |
| 5,408,643 A | 4/1995 | Katayose | |
| 5,410,723 A | 4/1995 | Schmidt et al. | |
| 5,412,795 A | 5/1995 | Larson | |
| 5,418,952 A | 5/1995 | Morley et al. | |
| 5,418,953 A | 5/1995 | Hunt et al. | |
| 5,421,019 A | 5/1995 | Holsztynski et al. | |
| 5,422,823 A | 6/1995 | Agrawal et al. | |
| 5,425,036 A | 6/1995 | Liu et al. | |
| 5,426,378 A | 6/1995 | Ong | |
| 5,428,526 A | 6/1995 | Flood et al. | |
| 5,430,687 A | 7/1995 | Hung et al. | |
| 5,440,245 A | 8/1995 | Galbraith et al. | |
| 5,440,538 A | 8/1995 | Olsen et al. | |
| 5,442,790 A | 8/1995 | Nosenchuck | |
| 5,444,394 A | 8/1995 | Watson et al. | |
| 5,448,186 A | 9/1995 | Kawata | |
| 5,450,022 A | 9/1995 | New | |
| 5,455,525 A | 10/1995 | Ho et al. | |
| 5,457,644 A * | 10/1995 | McCollum | 708/230 |
| 5,465,375 A | 11/1995 | Thepaut et al. | |
| 5,469,003 A * | 11/1995 | Kean | 326/39 |
| 5,473,266 A | 12/1995 | Ahanin et al. | |
| 5,473,267 A | 12/1995 | Stansfield | |
| 5,475,583 A | 12/1995 | Bock et al. | |
| 5,475,803 A | 12/1995 | Stearns et al. | |
| 5,475,856 A | 12/1995 | Kogge | |
| 5,477,525 A | 12/1995 | Okabe | |
| 5,483,620 A | 1/1996 | Pechanek et al. | |
| 5,485,103 A | 1/1996 | Pedersen et al. | |
| 5,485,104 A | 1/1996 | Agrawal et al. | |
| 5,489,857 A | 2/1996 | Agrawal et al. | |
| 5,491,353 A | 2/1996 | Kean | |
| 5,493,239 A | 2/1996 | Zlotnick | |
| 5,497,498 A | 3/1996 | Taylor | |
| 5,504,439 A | 4/1996 | Tavana | |
| 5,506,998 A | 4/1996 | Kato et al. | |
| 5,510,730 A | 4/1996 | El Gamal et al. | |
| 5,511,173 A | 4/1996 | Yamaura et al. | |
| 5,513,366 A | 4/1996 | Agarwal et al. | |
| 5,521,837 A | 5/1996 | Frankle et al. | |
| 5,522,083 A | 5/1996 | Gove et al. | |
| 5,525,971 A | 6/1996 | Flynn | |
| 5,530,873 A | 6/1996 | Takano | |
| 5,530,946 A | 6/1996 | Bouvier et al. | |
| 5,532,693 A | 7/1996 | Winters et al. | |

| Patent | Date | Name |
|---|---|---|
| 5,532,957 A | 7/1996 | Malhi |
| 5,535,406 A * | 7/1996 | Kolchinsky .................. 712/10 |
| 5,537,057 A | 7/1996 | Leong et al. |
| 5,537,580 A | 7/1996 | Giomi et al. |
| 5,537,601 A | 7/1996 | Kimura et al. |
| 5,541,530 A | 7/1996 | Cliff et al. |
| 5,544,336 A | 8/1996 | Kato et al. |
| 5,548,773 A | 8/1996 | Kemeny et al. |
| 5,550,782 A | 8/1996 | Cliff et al. |
| 5,555,434 A | 9/1996 | Carlstedt |
| 5,559,450 A | 9/1996 | Ngai et al. |
| 5,561,738 A | 10/1996 | Kinerk et al. |
| 5,570,040 A | 10/1996 | Lytle et al. |
| 5,572,710 A | 11/1996 | Asano et al. |
| 5,574,930 A | 11/1996 | Halverson, Jr. et al. |
| 5,581,731 A | 12/1996 | King et al. |
| 5,583,450 A | 12/1996 | Trimberger et al. |
| 5,586,044 A | 12/1996 | Agrawal et al. |
| 5,587,921 A | 12/1996 | Agrawal et al. |
| 5,588,152 A | 12/1996 | Dapp et al. |
| 5,590,345 A | 12/1996 | Barker et al. |
| 5,590,348 A | 12/1996 | Phillips et al. |
| 5,596,742 A | 1/1997 | Agarwal et al. |
| 5,600,265 A | 2/1997 | El Gamal et al. |
| 5,600,597 A | 2/1997 | Kean et al. |
| 5,600,845 A | 2/1997 | Gilson |
| 5,606,698 A | 2/1997 | Powell |
| 5,608,342 A | 3/1997 | Trimberger |
| 5,611,049 A | 3/1997 | Pitts |
| 5,617,547 A | 4/1997 | Feeney et al. |
| 5,617,577 A | 4/1997 | Barker et al. |
| 5,619,720 A | 4/1997 | Garde et al. |
| 5,625,806 A | 4/1997 | Kromer |
| 5,625,836 A | 4/1997 | Barker et al. |
| 5,627,992 A | 5/1997 | Baror |
| 5,634,131 A | 5/1997 | Matter et al. |
| 5,635,851 A | 6/1997 | Tavana |
| 5,642,058 A | 6/1997 | Trimberger et al. |
| 5,646,544 A | 7/1997 | Iadanza |
| 5,646,545 A | 7/1997 | Trimberger et al. |
| 5,649,176 A | 7/1997 | Selvidge et al. |
| 5,649,179 A | 7/1997 | Steenstra et al. |
| 5,652,529 A | 7/1997 | Gould et al. |
| 5,652,894 A | 7/1997 | Hu et al. |
| 5,655,069 A | 8/1997 | Ogawara et al. |
| 5,655,124 A | 8/1997 | Lin |
| 5,656,950 A | 8/1997 | Duong et al. |
| 5,657,330 A | 8/1997 | Matsumoto |
| 5,659,785 A | 8/1997 | Pechanek et al. |
| 5,659,797 A | 8/1997 | Zandveld et al. |
| 5,675,262 A | 10/1997 | Duong et al. |
| 5,675,743 A | 10/1997 | Mavity |
| 5,675,757 A | 10/1997 | Davidson et al. |
| 5,680,583 A | 10/1997 | Kuijsten |
| 5,682,491 A | 10/1997 | Pechanek et al. |
| 5,687,325 A | 11/1997 | Chang |
| 5,694,602 A | 12/1997 | Smith |
| 5,696,791 A | 12/1997 | Yeung |
| 5,696,976 A | 12/1997 | Nizar et al. |
| 5,701,091 A | 12/1997 | Kean |
| 5,705,938 A | 1/1998 | Kean |
| 5,706,482 A | 1/1998 | Matsushima et al. |
| 5,713,037 A | 1/1998 | Wilkinson et al. |
| 5,717,943 A | 2/1998 | Barker et al. |
| 5,732,209 A | 3/1998 | Vigil et al. |
| 5,734,869 A | 3/1998 | Chen |
| 5,734,921 A | 3/1998 | Dapp et al. |
| 5,737,516 A | 4/1998 | Circello et al. |
| 5,737,565 A | 4/1998 | Mayfield |
| 5,742,180 A | 4/1998 | Detton et al. |
| 5,745,734 A | 4/1998 | Craft et al. |
| 5,748,872 A | 5/1998 | Norman |
| 5,748,979 A | 5/1998 | Trimberger |
| 5,752,035 A | 5/1998 | Trimberger |
| 5,754,459 A | 5/1998 | Telikepalli |
| 5,754,820 A | 5/1998 | Yamagami |
| 5,754,827 A | 5/1998 | Barbier et al. |
| 5,754,871 A | 5/1998 | Wilkinson et al. |
| 5,760,602 A | 6/1998 | Tan |
| 5,761,484 A | 6/1998 | Agarwal et al. |
| 5,773,994 A | 6/1998 | Jones |
| 5,778,439 A | 7/1998 | Trimberger et al. |
| 5,781,756 A | 7/1998 | Hung |
| 5,784,636 A | 7/1998 | Rupp |
| 5,794,059 A | 8/1998 | Barker et al. |
| 5,794,062 A | 8/1998 | Baxter |
| 5,801,547 A | 9/1998 | Kean |
| 5,801,715 A | 9/1998 | Norman |
| 5,801,958 A | 9/1998 | Dangelo et al. |
| 5,802,290 A | 9/1998 | Casselman |
| 5,804,986 A | 9/1998 | Jones |
| 5,815,004 A | 9/1998 | Trimberger et al. |
| 5,815,715 A | 9/1998 | Kucukcakar |
| 5,815,726 A | 9/1998 | Cliff |
| 5,821,774 A | 10/1998 | Veytsman et al. |
| 5,828,229 A | 10/1998 | Cliff et al. |
| 5,828,858 A | 10/1998 | Athanas et al. |
| 5,831,448 A | 11/1998 | Kean |
| 5,838,165 A | 11/1998 | Chatter |
| 5,841,973 A | 11/1998 | Kessler et al. |
| 5,844,422 A | 12/1998 | Trimberger et al. |
| 5,844,888 A | 12/1998 | Markkula, Jr. et al. |
| 5,848,238 A | 12/1998 | Shimomura et al. |
| 5,854,918 A | 12/1998 | Baxter |
| 5,857,097 A | 1/1999 | Henzinger et al. |
| 5,857,109 A | 1/1999 | Taylor |
| 5,859,544 A | 1/1999 | Norman |
| 5,860,119 A | 1/1999 | Dockser |
| 5,862,403 A * | 1/1999 | Kanai et al. ..................... 710/6 |
| 5,865,239 A | 2/1999 | Carr |
| 5,867,691 A | 2/1999 | Shiraishi |
| 5,867,723 A | 2/1999 | Chin et al. |
| 5,870,620 A | 2/1999 | Kadosumi et al. |
| 5,884,075 A | 3/1999 | Hester et al. |
| 5,887,162 A | 3/1999 | Williams et al. |
| 5,887,165 A | 3/1999 | Martel et al. |
| 5,889,533 A | 3/1999 | Lee |
| 5,889,982 A | 3/1999 | Rodgers et al. |
| 5,892,370 A | 4/1999 | Eaton et al. |
| 5,892,961 A | 4/1999 | Trimberger |
| 5,892,962 A | 4/1999 | Cloutier |
| 5,894,565 A | 4/1999 | Furtek et al. |
| 5,901,279 A | 5/1999 | Davis, III |
| 5,915,123 A | 6/1999 | Mirsky et al. |
| 5,924,119 A | 7/1999 | Sindhu et al. |
| 5,926,638 A | 7/1999 | Inoue |
| 5,927,423 A | 7/1999 | Wada et al. |
| 5,933,023 A | 8/1999 | Young |
| 5,933,642 A | 8/1999 | Greenbaum et al. |
| 5,936,424 A | 8/1999 | Young et al. |
| 5,943,242 A | 8/1999 | Vorbach et al. |
| 5,956,518 A | 9/1999 | DeHon et al. |
| 5,960,193 A | 9/1999 | Guttag et al. |
| 5,960,200 A | 9/1999 | Eager et al. |
| 5,966,143 A | 10/1999 | Breternitz, Jr. |
| 5,966,534 A | 10/1999 | Cooke et al. |
| 5,970,254 A | 10/1999 | Cooke et al. |
| 5,978,260 A | 11/1999 | Trimberger et al. |
| 5,978,583 A | 11/1999 | Ekanadham et al. |
| 5,996,083 A | 11/1999 | Gupta et al. |
| 5,999,990 A | 12/1999 | Sharrit et al. |
| 6,003,143 A | 12/1999 | Kim et al. |
| 6,011,407 A | 1/2000 | New |
| 6,014,509 A | 1/2000 | Furtek |
| 6,020,758 A | 2/2000 | Patel et al. |
| 6,020,760 A | 2/2000 | Sample et al. |

| | | | |
|---|---|---|---|
| 6,021,490 A | 2/2000 | Vorbach et al. | |
| 6,023,564 A | 2/2000 | Trimberger | |
| 6,023,742 A | 2/2000 | Ebeling et al. | |
| 6,026,481 A | 2/2000 | New et al. | |
| 6,034,538 A | 3/2000 | Abramovici | |
| 6,035,371 A | 3/2000 | Magloire | |
| 6,038,650 A | 3/2000 | Vorbach et al. | |
| 6,038,656 A | 3/2000 | Martin et al. | |
| 6,044,030 A | 3/2000 | Zheng et al. | |
| 6,047,115 A | 4/2000 | Mohan et al. | |
| 6,049,222 A | 4/2000 | Lawman | |
| 6,049,866 A | 4/2000 | Earl | |
| 6,052,773 A | 4/2000 | DeHon et al. | |
| 6,054,873 A | 4/2000 | Laramie | |
| 6,055,619 A | 4/2000 | North et al. | |
| 6,058,469 A | 5/2000 | Baxter | |
| 6,076,157 A | 6/2000 | Borkenhagen et al. | |
| 6,077,315 A | 6/2000 | Greenbaum et al. | |
| 6,081,903 A | 6/2000 | Vorbach et al. | |
| 6,084,429 A | 7/2000 | Trimberger | |
| 6,085,317 A | 7/2000 | Smith | |
| 6,086,628 A | 7/2000 | Dave et al. | |
| 6,088,795 A | 7/2000 | Vorbach et al. | |
| 6,092,174 A | 7/2000 | Roussakov | |
| 6,105,105 A | 8/2000 | Trimberger et al. | |
| 6,105,106 A | 8/2000 | Manning | |
| 6,108,760 A | 8/2000 | Mirsky et al. | |
| 6,118,724 A | 9/2000 | Higginbottom | |
| 6,119,181 A | 9/2000 | Vorbach et al. | |
| 6,122,719 A | 9/2000 | Mirsky et al. | |
| 6,125,408 A | 9/2000 | McGee et al. | |
| 6,127,908 A | 10/2000 | Bozler et al. | |
| 6,128,720 A | 10/2000 | Pechanek et al. | |
| 6,130,551 A | 10/2000 | Agrawal et al. | |
| 6,134,166 A | 10/2000 | Lytle et al. | |
| 6,137,307 A | 10/2000 | Iwanczuk et al. | |
| 6,145,072 A | 11/2000 | Shams et al. | |
| 6,150,837 A | 11/2000 | Beal et al. | |
| 6,150,839 A | 11/2000 | New et al. | |
| 6,154,048 A | 11/2000 | Iwanczuk et al. | |
| 6,154,049 A | 11/2000 | New | |
| 6,157,214 A | 12/2000 | Marshall | |
| 6,170,051 B1 | 1/2001 | Dowling | |
| 6,172,520 B1 | 1/2001 | Lawman et al. | |
| 6,173,434 B1 | 1/2001 | Wirthlin et al. | |
| 6,178,494 B1 | 1/2001 | Casselman | |
| 6,185,256 B1 | 2/2001 | Saito et al. | |
| 6,185,731 B1 | 2/2001 | Maeda et al. | |
| 6,188,240 B1 | 2/2001 | Nakaya | |
| 6,188,650 B1 | 2/2001 | Hamada et al. | |
| 6,198,304 B1 | 3/2001 | Sasaki | |
| 6,201,406 B1 | 3/2001 | Iwanczuk et al. | |
| 6,202,182 B1 | 3/2001 | Abramovici et al. | |
| 6,204,687 B1 | 3/2001 | Schultz et al. | |
| 6,211,697 B1 | 4/2001 | Lien et al. | |
| 6,212,650 B1 | 4/2001 | Guccione | |
| 6,215,326 B1 | 4/2001 | Jefferson et al. | |
| 6,216,223 B1 | 4/2001 | Revilla et al. | |
| 6,219,833 B1 | 4/2001 | Solomon et al. | |
| RE37,195 E | 5/2001 | Kean | |
| 6,230,307 B1 | 5/2001 | Davis et al. | |
| 6,240,502 B1 | 5/2001 | Panwar et al. | |
| 6,243,808 B1 | 6/2001 | Wang | |
| 6,247,147 B1 | 6/2001 | Beenstra et al. | |
| 6,252,792 B1 | 6/2001 | Marshall et al. | |
| 6,256,724 B1 | 7/2001 | Hocevar et al. | |
| 6,260,179 B1 | 7/2001 | Ohsawa et al. | |
| 6,262,908 B1 | 7/2001 | Marshall et al. | |
| 6,263,430 B1 | 7/2001 | Trimberger et al. | |
| 6,266,760 B1 | 7/2001 | DeHon et al. | |
| 6,279,077 B1 | 8/2001 | Nasserbakht et al. | |
| 6,282,627 B1 | 8/2001 | Wong et al. | |
| 6,282,701 B1 | 8/2001 | Wygodny et al. | |
| 6,285,624 B1 | 9/2001 | Chen | |
| 6,286,134 B1 | 9/2001 | Click, Jr. et al. | |
| 6,288,566 B1 | 9/2001 | Hanrahan et al. | |
| 6,289,440 B1 | 9/2001 | Casselman | |
| 6,298,472 B1 | 10/2001 | Phillips et al. | |
| 6,301,706 B1 | 10/2001 | Maslennikov et al. | |
| 6,311,200 B1 | 10/2001 | Hanrahan et al. | |
| 6,311,265 B1 | 10/2001 | Beckerle et al. | |
| 6,321,366 B1 | 11/2001 | Tseng et al. | |
| 6,321,373 B1 | 11/2001 | Ekanadham et al. | |
| 6,338,106 B1 | 1/2002 | Vorbach et al. | |
| 6,341,318 B1 | 1/2002 | Dakhil | |
| 6,347,346 B1 | 2/2002 | Taylor | |
| 6,349,346 B1 | 2/2002 | Hanrahan et al. | |
| 6,353,841 B1 | 3/2002 | Marshall et al. | |
| 6,362,650 B1 | 3/2002 | New et al. | |
| 6,370,596 B1 | 4/2002 | Dakhil | |
| 6,373,779 B1 | 4/2002 | Pang et al. | |
| 6,374,286 B1 | 4/2002 | Gee | |
| 6,378,068 B1 | 4/2002 | Foster et al. | |
| 6,381,624 B1 | 4/2002 | Colon-Bonet et al. | |
| 6,389,379 B1 | 5/2002 | Lin et al. | |
| 6,389,579 B1 | 5/2002 | Phillips et al. | |
| 6,392,912 B1 | 5/2002 | Hanrahan et al. | |
| 6,398,383 B1 | 6/2002 | Huang | |
| 6,400,601 B1 | 6/2002 | Sudo et al. | |
| 6,404,224 B1 | 6/2002 | Azegami et al. | |
| 6,405,185 B1 | 6/2002 | Pechanek et al. | |
| 6,405,299 B1 | 6/2002 | Vorbach et al. | |
| 6,421,808 B1 | 7/2002 | McGeer | |
| 6,421,809 B1 | 7/2002 | Wuytack et al. | |
| 6,421,817 B1 | 7/2002 | Mohan et al. | |
| 6,425,054 B1 | 7/2002 | Nguyen | |
| 6,425,068 B1 | 7/2002 | Vorbach et al. | |
| 6,426,649 B1 | 7/2002 | Fu et al. | |
| 6,427,156 B1 | 7/2002 | Chapman et al. | |
| 6,430,309 B1 | 8/2002 | Pressman et al. | |
| 6,434,642 B1 | 8/2002 | Camilleri et al. | |
| 6,434,695 B1 | 8/2002 | Esfahani et al. | |
| 6,434,699 B1 | 8/2002 | Jones et al. | |
| 6,437,441 B1 | 8/2002 | Yamamoto | |
| 6,438,747 B1 | 8/2002 | Schreiber et al. | |
| 6,457,116 B1 | 9/2002 | Mirsky et al. | |
| 6,477,643 B1 | 11/2002 | Vorbach et al. | |
| 6,480,937 B1 | 11/2002 | Vorbach et al. | |
| 6,480,954 B2 | 11/2002 | Trimberger et al. | |
| 6,483,343 B1 | 11/2002 | Faith et al. | |
| 6,487,709 B1 | 11/2002 | Keller et al. | |
| 6,490,695 B1 | 12/2002 | Zagorski et al. | |
| 6,496,971 B1 | 12/2002 | Lesea et al. | |
| 6,504,398 B1 | 1/2003 | Lien et al. | |
| 6,507,898 B1 | 1/2003 | Gibson et al. | |
| 6,507,947 B1 | 1/2003 | Schreiber et al. | |
| 6,513,077 B2 | 1/2003 | Vorbach et al. | |
| 6,516,382 B2 | 2/2003 | Manning | |
| 6,518,787 B1 | 2/2003 | Allegrucci et al. | |
| 6,519,674 B1 | 2/2003 | Lam et al. | |
| 6,523,107 B1 | 2/2003 | Stansfield et al. | |
| 6,525,678 B1 | 2/2003 | Veenstra et al. | |
| 6,526,520 B1 | 2/2003 | Vorbach et al. | |
| 6,538,468 B1 | 3/2003 | Moore | |
| 6,538,470 B1 | 3/2003 | Langhammer et al. | |
| 6,539,415 B1 | 3/2003 | Mercs | |
| 6,539,438 B1 | 3/2003 | Ledzius et al. | |
| 6,539,477 B1 | 3/2003 | Seawright | |
| 6,542,394 B2 | 4/2003 | Marshall et al. | |
| 6,542,844 B1 | 4/2003 | Hanna | |
| 6,542,998 B1 | 4/2003 | Vorbach et al. | |
| 6,553,395 B2 | 4/2003 | Marshall et al. | |
| 6,553,479 B2 | 4/2003 | Mirsky et al. | |
| 6,567,834 B1 | 5/2003 | Marshall et al. | |
| 6,571,381 B1 | 5/2003 | Vorbach et al. | |
| 6,587,939 B1 | 7/2003 | Takano | |

| | | |
|---|---|---|
| 6,598,128 B1 | 7/2003 | Yoshioka et al. |
| 6,631,487 B1 | 10/2003 | Abramovici et al. |
| 6,633,181 B1 | 10/2003 | Rupp |
| 6,657,457 B1 | 12/2003 | Hanrahan et al. |
| 6,658,564 B1 | 12/2003 | Smith et al. |
| 6,665,758 B1 | 12/2003 | Frazier et al. |
| 6,687,788 B2 | 2/2004 | Vorbach et al. |
| 6,697,979 B1 | 2/2004 | Vorbach et al. |
| 6,704,816 B1 | 3/2004 | Burke |
| 6,708,325 B2 | 3/2004 | Cooke et al. |
| 6,717,436 B2 | 4/2004 | Kress et al. |
| 6,721,830 B2 | 4/2004 | Vorbach et al. |
| 6,728,871 B1 | 4/2004 | Vorbach et al. |
| 6,745,317 B1 | 6/2004 | Mirsky et al. |
| 6,748,440 B1 | 6/2004 | Lisitsa et al. |
| 6,751,722 B2 | 6/2004 | Mirsky et al. |
| 6,754,805 B1 | 6/2004 | Juan |
| 6,757,847 B1 | 6/2004 | Farkash et al. |
| 6,757,892 B1 | 6/2004 | Gokhale et al. |
| 6,782,445 B1 | 8/2004 | Olgiati et al. |
| 6,785,826 B1 | 8/2004 | Durham et al. |
| 6,802,026 B1 | 10/2004 | Patterson et al. |
| 6,802,206 B2 | 10/2004 | Kurecka et al. |
| 6,803,787 B1 | 10/2004 | Wicker, Jr. |
| 6,820,188 B2 | 11/2004 | Stansfield et al. |
| 6,829,697 B1 | 12/2004 | Davis et al. |
| 6,847,370 B2 | 1/2005 | Baldwin et al. |
| 6,868,476 B2 | 3/2005 | Rosenbluth et al. |
| 6,871,341 B1 | 3/2005 | Shyr |
| 6,874,108 B1 | 3/2005 | Abramovici et al. |
| 6,886,092 B1 | 4/2005 | Douglass et al. |
| 6,901,502 B2 | 5/2005 | Yano et al. |
| 6,928,523 B2 | 8/2005 | Yamada |
| 6,961,924 B2 | 11/2005 | Bates et al. |
| 6,975,138 B2 | 12/2005 | Pani et al. |
| 6,977,649 B1 | 12/2005 | Baldwin et al. |
| 7,000,161 B1 | 2/2006 | Allen et al. |
| 7,007,096 B1 | 2/2006 | Lisitsa et al. |
| 7,010,667 B2 | 3/2006 | Vorbach et al. |
| 7,028,107 B2 | 4/2006 | Vorbach et al. |
| 7,038,952 B1 | 5/2006 | Zack et al. |
| 7,043,416 B1 | 5/2006 | Lin |
| 7,210,129 B2 | 4/2007 | May et al. |
| 7,216,204 B2 | 5/2007 | Rosenbluth et al. |
| 7,237,087 B2 | 6/2007 | Vorbach et al. |
| 7,249,351 B1 | 7/2007 | Songer et al. |
| 7,254,649 B2 | 8/2007 | Subramanian et al. |
| 7,340,596 B1 | 3/2008 | Crosland et al. |
| 7,346,644 B1 | 3/2008 | Langhammer et al. |
| 7,350,178 B1 | 3/2008 | Crosland et al. |
| 7,382,156 B2 | 6/2008 | Pani et al. |
| 7,595,659 B2 | 9/2009 | Vorbach et al. |
| 7,650,448 B2 | 1/2010 | Vorbach et al. |
| 2001/0001860 A1 | 5/2001 | Beiu |
| 2001/0003834 A1 | 6/2001 | Shimonishi |
| 2001/0010074 A1 | 7/2001 | Nishihara et al. |
| 2001/0018733 A1 | 8/2001 | Fujii et al. |
| 2001/0032305 A1 | 10/2001 | Barry |
| 2002/0013861 A1 | 1/2002 | Adiletta et al. |
| 2002/0038414 A1 | 3/2002 | Taylor et al. |
| 2002/0045952 A1 | 4/2002 | Blemel |
| 2002/0083308 A1 | 6/2002 | Pereira et al. |
| 2002/0103839 A1 | 8/2002 | Ozawa |
| 2002/0124238 A1 | 9/2002 | Metzgen |
| 2002/0138716 A1 | 9/2002 | Master et al. |
| 2002/0143505 A1 | 10/2002 | Drusinsky |
| 2002/0144229 A1 | 10/2002 | Hanrahan |
| 2002/0156962 A1 | 10/2002 | Chopra et al. |
| 2002/0165886 A1 | 11/2002 | Lam |
| 2003/0001615 A1 | 1/2003 | Sueyoshi et al. |
| 2003/0014743 A1 | 1/2003 | Cooke et al. |
| 2003/0046607 A1 | 3/2003 | May et al. |
| 2003/0052711 A1 | 3/2003 | Taylor et al. |
| 2003/0055861 A1 | 3/2003 | Lai et al. |
| 2003/0056085 A1 | 3/2003 | Vorbach |
| 2003/0056091 A1 | 3/2003 | Greenberg |
| 2003/0056202 A1 | 3/2003 | May et al. |
| 2003/0061542 A1 | 3/2003 | Bates et al. |
| 2003/0062922 A1 | 4/2003 | Douglass et al. |
| 2003/0086300 A1 | 5/2003 | Noyes et al. |
| 2003/0093662 A1 | 5/2003 | Vorbach et al. |
| 2003/0097513 A1 | 5/2003 | Vorbach et al. |
| 2003/0123579 A1 | 7/2003 | Safavi et al. |
| 2003/0135686 A1 | 7/2003 | Vorbach et al. |
| 2003/0192032 A1 | 10/2003 | Andrade et al. |
| 2004/0015899 A1 | 1/2004 | May et al. |
| 2004/0025005 A1 | 2/2004 | Vorbach et al. |
| 2004/0078548 A1 | 4/2004 | Claydon et al. |
| 2004/0168099 A1 | 8/2004 | Vorbach et al. |
| 2004/0199688 A1 | 10/2004 | Vorbach et al. |
| 2005/0066213 A1 | 3/2005 | Vorbach et al. |
| 2005/0144210 A1 | 6/2005 | Simkins et al. |
| 2005/0144212 A1 | 6/2005 | Simkins et al. |
| 2005/0144215 A1 | 6/2005 | Simkins et al. |
| 2006/0230096 A1 | 6/2006 | Thendean et al. |
| 2006/0230094 A1 | 10/2006 | Simkins et al. |
| 2009/0085603 A1 | 4/2009 | Paul et al. |

FOREIGN PATENT DOCUMENTS

| | | |
|---|---|---|
| DE | 44 16 881 | 11/1994 |
| DE | 38 55 673 | 11/1996 |
| DE | 196 51 075 | 6/1998 |
| DE | 196 54 593 | 7/1998 |
| DE | 196 54 595 | 7/1998 |
| DE | 196 54 846 | 7/1998 |
| DE | 197 04 044 | 8/1998 |
| DE | 197 04 728 | 8/1998 |
| DE | 197 04 742 | 9/1998 |
| DE | 198 22 776 | 3/1999 |
| DE | 198 07 872 | 8/1999 |
| DE | 198 61 088 | 2/2000 |
| DE | 199 26 538 | 12/2000 |
| DE | 100 28 397 | 12/2001 |
| DE | 100 36 627 | 2/2002 |
| DE | 101 29 237 | 4/2002 |
| DE | 102 04 044 | 8/2003 |
| EP | 0 208 457 | 1/1987 |
| EP | 0 211 360 | 5/1987 |
| EP | 0 428 327 | 5/1991 |
| EP | 0 463 721 | 1/1992 |
| EP | 0 477 809 | 4/1992 |
| EP | 0 485 690 | 5/1992 |
| EP | 0 497 029 | 8/1992 |
| EP | 0 539 595 | 5/1993 |
| EP | 0 638 867 A2 | 8/1994 |
| EP | 0 628 917 | 12/1994 |
| EP | 0 678 985 | 10/1995 |
| EP | 0 686 915 | 12/1995 |
| EP | 0 707 269 | 4/1996 |
| EP | 0 726 532 | 8/1996 |
| EP | 0 735 685 | 10/1996 |
| EP | 0 835 685 | 10/1996 |
| EP | 0 746 106 | 12/1996 |
| EP | 0 748 051 | 12/1996 |
| EP | 0 926 594 | 6/1999 |
| EP | 1 102 674 | 7/1999 |
| EP | 1 061 439 | 12/2000 |
| EP | 1 102 674 | 5/2001 |
| EP | 1 115 204 | 7/2001 |
| EP | 1 146 432 | 10/2001 |
| EP | 0 696 001 | 12/2001 |
| EP | 0 398 552 | 11/2002 |
| EP | 1 669 885 | 6/2006 |
| FR | 2 752 466 | 2/1998 |
| GB | 2 304 438 | 3/1997 |

| | | |
|---|---|---|
| JP | 58-58672 | 4/1983 |
| JP | 01-229378 | 9/1989 |
| JP | 2-130023 | 5/1990 |
| JP | 2-226423 | 9/1990 |
| JP | 8-250685 | 9/1993 |
| JP | 5-265705 | 10/1993 |
| JP | 5-276007 | 10/1993 |
| JP | 6-266605 | 9/1994 |
| JP | 07-086921 | 3/1995 |
| JP | 7-154242 | 6/1995 |
| JP | 8-148989 | 6/1995 |
| JP | 8-44581 | 2/1996 |
| JP | 08069447 | 3/1996 |
| JP | 08-101761 | 4/1996 |
| JP | 8-102492 | 4/1996 |
| JP | 8-221164 | 8/1996 |
| JP | 9-27745 | 1/1997 |
| JP | 09-294069 | 11/1997 |
| JP | 11-184718 | 7/1999 |
| JP | 11-307725 | 11/1999 |
| JP | 2000-076066 | 3/2000 |
| JP | 2000-181566 | 6/2000 |
| JP | 2001-201066 | 7/2000 |
| JP | 2000-311156 | 11/2000 |
| JP | 2001-500682 | 1/2001 |
| JP | 2001-167066 | 6/2001 |
| JP | 2001-510650 | 7/2001 |
| JP | 2002-0033457 | 1/2002 |
| JP | 05-509184 | 12/2003 |
| JP | 3-961028 | 8/2007 |
| WO | WO9004835 | 5/1990 |
| WO | WO90/11648 | 10/1990 |
| WO | WO92/01987 | 2/1992 |
| WO | WO93/11503 | 6/1993 |
| WO | WO94/06077 | 3/1994 |
| WO | WO94/08399 | 4/1994 |
| WO | WO95/00161 | 1/1995 |
| WO | WO95/26001 | 9/1995 |
| WO | WO98/10517 | 3/1998 |
| WO | WO98/26356 | 6/1998 |
| WO | WO98/28697 | 7/1998 |
| WO | WO98/29952 | 7/1998 |
| WO | WO98/31102 | 7/1998 |
| WO | WO98/35294 | 8/1998 |
| WO | WO98/35299 | 8/1998 |
| WO | WO99/00731 | 1/1999 |
| WO | WO99/00739 | 1/1999 |
| WO | WO99/12111 | 3/1999 |
| WO | WO99/32975 | 7/1999 |
| WO | WO99/40522 | 8/1999 |
| WO | WO99/44120 | 9/1999 |
| WO | WO99/44147 | 9/1999 |
| WO | WO00/17771 | 3/2000 |
| WO | WO00/38087 | 6/2000 |
| WO | 2000/045282 | 8/2000 |
| WO | WO00/49496 | 8/2000 |
| WO | WO00/77652 | 12/2000 |
| WO | WO01/55917 | 8/2001 |
| WO | WO02/13000 | 2/2002 |
| WO | WO02/21010 | 3/2002 |
| WO | WO02/29600 | 4/2002 |
| WO | WO02/50665 | 6/2002 |
| WO | WO02/071196 | 9/2002 |
| WO | WO02/71248 | 9/2002 |
| WO | WO02/71249 | 9/2002 |
| WO | WO02/103532 | 12/2002 |
| WO | WO03/017095 | 2/2003 |
| WO | WO03/023616 | 3/2003 |
| WO | WO03/025781 | 3/2003 |
| WO | WO03/032975 | 4/2003 |
| WO | WO03/32975 | 4/2003 |
| WO | WO03/36507 | 5/2003 |
| WO | WO03/036507 | 5/2003 |
| WO | WO 03/091875 | 11/2003 |
| WO | WO2004/053718 | 6/2004 |
| WO | WO2004/114128 | 12/2004 |
| WO | WO2005/045692 | 5/2005 |

OTHER PUBLICATIONS

Ade et al., "Minimum Memory Buffers in DSP Applications," Electronics Letters, vol. 30, No. 6, Mar. 17, 1994, pp. 469-471.

Athanas, Peter et al., "Quantitative analysis of floating point arithmetic on FPGA based custom computing machines," IEEE Symposium on FPGAs for Custom Computing Machines, IEEE Computer Society Press, Apr. 19-21, 1995, pp. i-vii, 1-222.

Athanas, Peter et al., "An Adaptive Hardware Machine Architecture and Compiler for Dynamic Processor Reconfiguration", IEEE, Laboratory for Engineering Man/Machine Systems Division of Engineering, Box D, Brown University Providence, Rhode Island, 1991, pp. 397-400.

Norman, Richard S., "Hyperchip Business Summary, The Opportunity," Jan. 31, 2000, pp. 1-3.

Ferrante J. et al., "The Program Dependence Graph and its Use in Optimization ACM Transactions on Programming Languages and Systems," Jul. 1987, USA, [online] Bd. 9, Nr., 3, pp. 319-349, XP002156651 ISSN: 0164-0935 ACM Digital Library.

Hwang L. et al., "Min-cut Replication in Partitioned Networks" IEEE Transactions on Computer-Aided Design of Integrated Circuits and Systems, [online] Bd. 14, Nr. 1, Jan. 1995, pp. 96-106, XP00053228 USA ISSN: 0278-0070 IEEE Xplore.

Baumgarte, V., et al., PACT XPP "A Self-reconfigurable Data Processing Architecture," PACT Info. GMBH, Munchen Germany 2001.

Jantsch, Axel et al., "A Case Study on Hardware/software Partitioning," Royal Institute of Technology, Kista, Sweden, Apr. 10, 1994 IEEE, pp. 111-118.

Becker, J. et al., "Parallelization in Co-compilation for Configurable Accelerators—a Host/accelerator Partitioning Compilation Method," proceedings of Asia and South Pacific Design Automation Conference, Yokohama, Japan, Feb. 10-13, 1998.

Isshiki, Tsuyoshi et al., "Bit-Serial Pipeline Synthesis for Multi-FPGA Systems with C++ Design Capture," 1996 IEEE, pp. 38-47.

Weinhardt, Markus, "Ubersetzingsmethoden fur strukturprogrammierbare rechner ," Dissertation for Doktors der Ingenieurwissenschaften der Universitat Karlsruhe: Jul. 1, 1997 [Weinhardt, M. "Compilation Methods for Structure-programmable Computers", dissertation, ISBN 3-89722-011-3, 1997].

Hammes, Jeff et al., "Cameron: High Level Language Compilation for Reconfigurable Systems," Department of Computer Science, Colorado State University, Conference on Parallel Architectures and Compilation Techniques, Oct. 12-16, 1999.

K. Wada et al., "A Performance Evaluation of Tree-based Coherent Distributed Shared Memory" Proceedings of the Pacific RIM Conference on Communications, Comput and Signal Processing, Victoria, May 19-21, 1993.

Nilsson et al., "The Scalable Tree Protocol—A Cache Coherence Approaches for Large-Scale Multiprocessors" IEEE, pp. 498-506 Dec. 1992.

Wu et al., "A New Cache Directory Scheme", IEEE, pp. 466-472, Jun. 1996.

Hauck "The Roles of FPGA's in Reprogrammable Systems," IEEE, Apr. 1998, pp. 615-638.

Wittig et al., "OneChip: An FPGA Processor with Reconfigurable Logic" IEEE, 1996 pp. 126-135.

Cadambi et al., "Managing Pipeline-reconfigurable FPGAs," ACM, 1998, pp. 55-64.

Hong Xu et al., "Parallel QR Factorization on a Block Data Flow Architecture" Conference Proceeding Article, Mar. 1, 1992, pp. 332-336 XPO10255276, p. 333, Abstract 2.2, 2.3, 2.4-p. 334.

Mirsky, E. DeHon, "MATRIX: A Reconfigurable Computing Architecture with Configurable Instruction Distribution and Deployable Resources," Proceedings of the IEEE Symposium on FPGAs for Custom Computing Machines, 1996, pp. 157-1666.

Cardoso, J.M.P., "Compilation of Java™ Algorithms onto Reconfigurable Computing Systems with Exploitation of Operation- Level Parallelism," Ph.D. Thesis, Universidade Tecnica de Lisboa (UTL), Lisbon, Portugal Oct. 2000 (English Abstract included).
Kung, "Deadlock Avoidance for Systolic Communication", 1988 Conference Proceedings of 15th Annual International Symposium on Computer Architecture, May 30, 1988, pp. 252-260.
TMS320C54X DSP: CPU and Peripherals, Texas Instruments, 1996, pp. 6-26 to 6-46.
TMS320C54x DSP: Mnemonic Instruction Set, Texas Instruments, 1996, p. 4-64.
XLINX, "Logic Cell Array Families: XC4000, XC4000A and XC4000H", product description, pp. 2-7 to 2-15, Additional XC3000, XC31000 and XC3100A Data, pp. 8-16 and 9-14.
Miller, Michael J. et al., "High-Speed FIFOs Contend with Widely Differing Data Rates: Dual-port RAM Buffer and Dual-pointer System Provide Rapid, High-density Data Storage and Reduce Overhead", Computer Design, Sep. 1, 1985, pp. 83-86.
Forstner, Peter "Wer Zuerst Kommt, Mahlt Zuerst!: Teil 3: Einsatzgebiete und Anwendungsbeispiele von FIFO-Speichern", Elektronik, Aug. 2000, pp. 104-109.
John R. Hauser et al., "Garp: A MIPS Processor with a Reconfigurable Coprocessor", University of California, Berkeley, IEEE, 1997, pp. 12-21.
Jorg Donandt, "Improving Response Time of Programmable Logic Controllers by Use of a Boolean Coprocessor", AEG Research Institute Berlin, IEEE, 1989, pp. 4-167-4-169.
Alexandre F. Tenca et al., "A Variable Long-Precision Arithmetic Unit Design for Reconfigurable Coprocessor Architectures", University of California, Los Angeles, 1998, pp. 216-225.
Andreas Koch et al, "Practical Experiences with the SPARXIL Co-Processor", 1998, IEEE, pp. 394-398.
Gokhale M. B. et al., "Automatic Allocation of Arrays to Memories in FPGA processors with Multiple Memory Banks", Field-Programmable Custom Computing Machines, 1999, IEEE, pp. 63-67.
Christian Siemers, "Rechenfabrik Ansaetze Fuer Extrem Parallele Prozessoren", Verlag Heinze Heise GmbH., Hannover, DE No. 15, Jul. 16, 2001, pp. 170-179.
Pedro Diniz et al., "Automatic Synthesis of Data Storage and Control Structures for FPGA-based Computing Engines", 2000, IEEE, pp. 91-100.
Markus Weinhardt et al., "Pipeline Vectorization for Reconfigurable Systems", 1999, IEEE, pp. 52-60.
Lizy John et al., "A Dynamically Reconfigurable Interconnect for Array Processors", vol. 6, No. 1, Mar. 1998, IEEE, pp. 150-157.
Fineberg, Samuel et al., "Experimental Analysis of a Mixed-Mode Parallel Architecture Using Bitonic Sequence Sorting", vol. 11. No. 3, Mar. 1991, pp. 239-251.
Jacob, Jeffrey et al., "Memory Interfacing and Instruction Specification for Reconfigurable Processors", ACM 1999, pp. 145-154.
Ye, Z.A. et al., "A Compiler for a Processor With a Reconfigurable Functional Unit," FPGA 2000 ACM/SIGNA International Symposium on Field Programmable Gate Arrays, Monterey, CA Feb. 9-11, 2000, pp. 95-100.
Ling, X., "WASMII: An MPLD with Data-Driven Control on a Virtual Hardware," Journal of Supercomputing, Kluwer Acdemic Publishers, Dordrecht, Netherlands, 1995, pp. 253-276.
Villasensor, J. et al., "Express Letters Video Communications Using Rapidly Reconfigurable Hardware," IEEE Transactions on Circuits and Systems for Video Technology, IEEE, Inc. NY, Dec. 1995, pp. 565-567.
Hedge, S.J., 3D WASP Devices for On-line Signal and Data Processing, 1994, International Conference on Wafer Scale Integration, pp. 11-21.
Iseli, C., et al. "A C++ Compiler for FPGA Custom Execution Units Synthesis," IEEE. 1995, pp. 173-179.
Alippi, C., et al., Determining the Optimum Extended Instruction Set Architecture for Application Specific Reconfigurable VLIW CPUs, IEEE., 2001, pp. 50-56.
Dutt, Nikil et al., If Software is King for Systems-on-Silicon, What's New in Compiler?, IEEE., 1997, pp. 322-325.
Piotrowski, Anton, "IEC-BUS, Die Funktionsweise des IEC-Bus und seine Anwendung in Geräten und Systemen", 1987, Franzis-Verlag GmbH, München, pp. 20-25.

Zhang, N. Et al., Architectural Evaluation of Flexible Digital Signal Processing for Wireless Receivers, Signals, Systems and Computers, 2000: Conference Record of the Thirty-Fourth Asilomar Conference, Bd.1, Oct. 29, 2000, pp. 78-83.
Fornaciari, W. Et al., System-level power evaluation metrics, 1997 Proceedings of the 2nd Annual IEEE International Conference on Innovative Systems in Silicon, New York, NY, Oct. 1997, pp. 323-330.
Schmit, H. Et al., Hidden Markov Modeling and Fuzzy Controllers in FPGAs, FPGAs for Custom Computing Machines. 1995; Proceedings, IEEE Symposium on Napa Valley, CA., Apr. 1995, pp. 214-221.
Simunic, T. Et al., Source Code Optimization and Profiling of Energy Consumation in Embedded Systems, Proceedings of the 13th International Symposium on System Synthesis, Sep. 2000, pp. 193-198.
The XPP White Paper, Release 2.1, PACT—A Technical Perspective, Mar. 27, 2002, pp. 1-27.
Abnous, A., et al., "The Pleiades Architecture," Chapter I of *The Application of Programmable DSPs in Mobile Communications*, A. Gatherer and A. Auslander, Ed., Wiley, 2002, pp. 1-33.
Athanas, "A Functional Reconfigurable Architecture and Compiler for Adoptive Computing," IEEE, pp. 49-55.
Beck et al., "From control flow to data flow," TR 89-1050, Oct. 1989, Dept. of Computer Science, Cornell University, Ithaca, NY, pp. 1-25.
Bittner, "Wormhole Run-time Reconfiguration: Conceptualization and VLSI Design of a High Performance Computing System," *Dissertation*, Jan. 23, 1997, pp. 1-XX, 1-415.
Callahan, et al., "The Garp Architecture and C Compiler," Computer, Apr. 2000, pp. 62-69.
Chen et al., "A reconfigurable multiprocessor IC for rapid prototyping of algorithmic-specific high-speed DSP data paths," IEEE Journal of Solid-State Circuits, vol. 27, No. 12, Dec. 1992, pp. 1895-1904.
DeHon, A., "DPGA Utilization and Application," MIT Artificial Intelligence Laboratory, Proceedings of the Fourth International ACM Symposium on Field-Programmable Gate Arrays (FPGA '96), IEEE Computer Society, pp. 1-7.
Hastie et al., "The implementation of hardware subroutines on field programmable gate arrays," Custom Integrated Circuits Conference, 1990, Proceedings of the IEEE 1990, May 16, 1990, pp. 31.3.1-31.4.3 (3 pages).
Kastrup, B., "Automatic Hardware Synthesis for a Hybrid Reconfigurable CPU Featuring Philips CPLDs," Proceedings of the PACT Workshop on Reconfigurable Computing, 1998, pp. 5-10.
Ling, X., "WASII: An MPLD with Data-Driven Control on a Virtual Hardware," Journal of Supercomputing, Kluwer Academic Publishers, Dordrecht, Netherlands, 1995, pp. 253-276.
Ling et al., "WASMII: A Multifunction Programmable Logic Device (MPLD) with Data Driven Control," The Transactions of the Institute of Electronics, Information and Communication Engineers, Apr. 25, 1994, vol. J77-D-I, Nr. 4, pp. 309-317. [This references is in Chinese, but should be comparable in content to the Ling et al. reference above].
Mano, M.M., "Digital Design," by Prentice Hall, Inc., Englewood Cliffs, New Jersey 07632, 1984, pp. 119-125, 154-161.
Maxfield,C., "Logic that Mutates While-U-Wait," EDN (Bur. Ed) (Usa), EDN (European Edition), Nov. 7, 1996, Cahners Publishing, USA, pp. 137-140, 142.
Myers, G. "Advances in Computer Architecture," Wiley-Interscience Publication, 2nd ed., John Wiley & Sons, Inc., 1978, pp. 463-494.
Razdan et al., A High-Performance Microarchitecture with Hardware-Programmable Functional Units, Micro-27, Proceedings of the 27th Annual International Symposium on Microarchitecture, IEEE Computer Society and Association for Computing Machinery, Nov. 30-Dec. 2, 1994, pp. 172-180.
Saleeba, M. "A Self-Contained Dynamically Reconfigurable Processor Architecture," Sixteenth Australian Computer Science Conference, ASCS-16, QLD, Australia, Feb. 1993, pp. 59-70.
Shirazi, et al., "Quantitative analysis of floating point arithmetic on FPGA based custom computing machines," IEEE Symposium on FPGAs for Custom Computing Machines, *IEEE Computer Society Press*, Apr. 19-21, 1995, pp. 155-162.
Siemers et al., "The .>S<puter: A Novel Micoarchitecture Mode for Execution inside Superscalar and VLIW Processors Using Reconfigurable Hardware," Australian Computer Science Communications, vol. 20, No. 4, Computer Architecture, Proceedings of the 3rd Australian Computer Architecture Conference, Perth, John Morris, Ed., Feb. 2-3, 1998, pp. 169-178.

Skokan, Z.E., "Programmable logic machine (A programmable cell array)," IEEE Journal of Solid-State Circuits, vol. 18, Issue 5, Oct. 1983, pp. 572-578.

Sueyoshi, T, "Present Status and Problems of the Reconfigurable Computing Systems Toward the Computer Evolution," Department of Artificial Intelligence, Kyushi Institute of Technology, Fukuoka, Japan; Institute of Electronics, Information and Communication Engineers, vol. 96, No. 426, IEICE Technical Report (1996), pp. 111-119 [English Abstract Only].

Tau, E., et al., "A First Generation DPGA Implementation," FPD'95, pp. 138-143.

Tenca, A.F., et al., "A Variable Long-Precision Arithmetic Unit Design for Reconfigurable Coprocessor Architectures," University of California, Los Angeles, 1998, pp. 216-225.

Villasenor, et al., "Configurable Computing Solutions for Automatic Target Recognition," IEEE, 1996 pp. 70-79.

Villasenor, et al., "Configurable Computing," *Scientific American*, vol. 276, No. 6, Jun. 1997, pp. 66-71.

Weinhardt, M., "Compilation Methods for Structure-programmable Computers," dissertation, ISBN 3-89722-011-3, 1997. [Table of Contents and English Abstract Provided].

Weinhardt, Markus et al., "Pipeline Vectorization," IEEE Transactions on Computer-Aided Design of Integrated Circuits and Systems, vol. 20, No. 2, Feb. 2001, pp. 234-248.

Yeung, A. et al., "A data-driven architecture for rapid prototyping of high throughput DSP algorithms," Dept. of Electrical Engineering and Computer Sciences, Univ. of California, Berkeley, USA, *Proceedings VLSI Signal Processing Workshop, IEEE Press*, pp. 225-234, Napa, Oct. 1992.

Yeung, A. et al., "A reconfigurable data-driven multiprocessor architecture for rapid prototyping of high throughput DSP algorithms," Dept. of Electrical Engineering and Computer Sciences, Univ. of California, Berkeley, USA, pp. 169-178, *IEEE* 1993.

Zhang, et al., Architectural Evaluation of Flexible Digital Signal Processing for Wireless Receivers, Signals, Systems and Computers, 2000; Conference Record of the Thirty-Fourth Asilomar Conference, Bd. 1, Oct. 29, 2000, pp. 78-83.

Abnous, A. et al., "Ultra-Low-Power Domain-Specific Multimedia Processors," U.C. Berkeley, 1996 IEEE, pp. 461-470.

Sutton et al., "A Multiprocessor DSP System Using PADDI-2," U.C. Berkeley, 1998 ACM, pp. 62-65.

Zhang, et al., "Abstract: Low-Power Heterogeneous Reconfigurable Digital Signal Processors with Energy-Efficient Interconnect Network," U.C. Berkeley, pp. 1-120.

Zhang, et al., "A IV Heterogeneous Reconfigurable Processor IC for Baseband Wireless Applications," L.C. Berkeley, 2000 IEEE, 12 pages.

Asari, et al., "FeRAM circuit technology for system on a chip," Proceedings First NASA/DoD Workshop on Evolvable Hardware, pp. 193-197 (1999).

Lee, et al., "Multimedia extensions for general-purpose processors," IEEE Workshop on Signal Processing Systems, SIPS 97—Design and Implementation, pp. 9-23 (1997).

Pirsch, et al., "VLSI implementations of image and video multimedia processing systems," IEEE Transactions on Circuits and Systems for Video Technology 8(7): 878-891 (Nov. 1998).

Salefski, et al., "Re-configurable computing in wireless," Annual ACM IEEE Design Automation Conference: Proceedings of the 38th conference on Design automation, pp. 178-183 (2001).

Schmidt, et al., "Datawave: A Single-Chip Multiprocessor for Video Applications," IEEE Microll(3): 22-25 and 88-94 (Jun. 1991).

Cardoso, et al., "Compilation and Temporal Partitioning for a Coarse-Grain Reconfigurable Architecture", LYSACHT, P. & Rosentiel, W. eds., "New Algorithms, Architectures and Applications for Reconfigurable Computing," pp. 105-115 (2005).

Cardoso, et al., "Macro-Based Hardware Compilation of Java™ Bytecodes into a Dynamic Reconfigurable Computing System," Field-Programmable Custom Computing Machines (1999) FCCM '99. Proceedings. Seventh Annual IEEE Symposium on NAPA Valley, CA, USA, Apr. 21-23, 1999, IEEE Comput. Soc, US, pp. 2-11.

Cook, "The Amalgam Compiler Infrastructure," Thesis at the University of Illinois at Urbana-Champaign Chapter 7 & Appendix G (2004).

Fawcett, "Map, Place and Route: The Key to High-Density PLD Implementation," Wescon Conference, IEEE Center, pp. 292-297 (Nov. 7, 1995).

Hendrich, et al., "Silicon Compilation and Rapid Prototyping of Microprogrammed VLSI-Circuits with MIIMOLA and SOLO 1400," Microprocessing & Microprogramming 35(1-5): 287-294 (Sep. 1992).

Koch, et al., "High-Level-Language Compilation for Reconfigurable Computers," Proceedings of European Workshop on Reconfigurable Communication-Centric SOCS, 8 pages (Jun. 2005).

Moraes, et al., "A Physical Synthesis Design Flow Based on Virtual Components," XV Conference on Design of Circuits and Integrated Systems, 6 pages (Nov. 2000).

Neumann, et al., "A Generic Library for Adaptive Computing Environments," Field Programmable Logic and Applications, 11th International Conference, FPL 2001, Proceedings (Lecture Notes in Computer Science, vol. 2147), pp. 503-512 (2001).

Schönfeld, et al., "The LISA Design Environment for the Synthesis of Array Processors Including Memories for the Data Transfer and Fault Tolerance by Reconfiguration and Coding Techniques," J. VLSI Signal Processing Systems for Signal, Image, and Video Technology 11(1/2): 51-74 (Oct. 1, 1995).

Shin, et al., "C-based Interactive RTL Design Methodology," Technical Report CECS-03-42, pp. 1-16 (Dec. 2003).

Sondervan, "Retiming and logic synthesis," Electronic Engineering 65(793): 33, 35-36 (Jan. 1993).

Advanced RISC Machines, "Introduction to AMBA," Section 1, pp. 1-1 to 1-7 (Oct. 1996).

Arm, "The Architecture for the Digital World," http://www.arm.com/products, 3 pages (Mar. 18, 2009).

Arm, "The Architecture for the Digital World; Milestones," http://www.arm.com/aboutarm/milestones.html, 5 pages (Mar. 18, 2009).

Del Corso, et al., "Microcomputer Buses and Links," Academic Press Inc. Ltd., pp. 138-143, 277-285 (1986).

"IEEE Standard Test Access Port and Boundary-Scan Architecture," IEEE Std. 1149.1-1990, pp. 1-127 (1993).

PCI Local Bus Specification, Production Version, Revision 2.1, Portland, OR, pp. 1-281 (Jun. 1, 1995).

"The Programmable Logic Data Book," XILINZ, Inc., Section 2, pp. 1-240, Section 8, pp. 1, 23-25, 29, 45-52, 169-172 (1994).

U.S. Appl. No. 60/109,417, filed Nov. 18, 1998, Jefferson et al.

Becker et al., "Automatic Parallelism Exploitation for FPL-Based Accelerators," 1998, Proc. 31st Annual Hawaii International Conference on System Sciences, pp. 169-178.

Kim et al., "A Reconfigurable Multifunction Computing Cache Architecture," IEEE Transactions on Very Large Scale Integration (VLSI) Systems vol. 9, Issue 4, Aug. 2001 pp. 509-523.

Parhami, B., "Parallel Counters for Signed Binary Signals," Signals, Systems and Computers, 1989, Twenty-Third Asilomar Conference, vol. 1, pp. 513-516.

Ohmsha, "Information Processing Handbook," edited by the Information Processing Society of Japan, pp. 376, Dec. 21, 1998.

Albahama, O.T. et al., "On the Viability of FPGA-Based Integrated Coprocessors," Dept. of Electrical and Electronic Engineering, Imperial College of Science, London, 1999 IEEE, pp. 206-215.

Altera, "Flex 8000 Programmable Logic Device Family," Altera Corporation product description, Jan. 2003, pp. 1-62.

Altera, "Flex 10K Embedded Programmable Logic Device Family," Altera Corporation product description, Jan. 2003, pp. 1-128.

Atmel, 5-K-50K Gates Coprocessor FPGA with Free Ram, Data Sheet, Jul. 2006, 55 pages.

Atmel, FPGA-based FIR Filter Application Note, Sep. 1999, 10 pages.

Atmel, "An Introduction to DSP Applications using the AT40K FPGA," FPGA Application Engineering, San Jose, CA, Apr. 2004, 15 pages.

Atmel, Configurable Logic Design & Application Book, Atmel Corporation, 1995, pp. 2-19 through 2-25.

Atmel, Field Programmable Gate Array Configuration Guide, AT6000 Series Configuration Data Sheet, Sep. 1999, pp. 1-20.

Athanas et al., "Processor Reconfiguration Through Instruction-Set Metamorphosis," 1993, IEEE Computers, pp. 11-18.
Bacon, D. et al., "Compiler Transformations for High-Performance Computing," ACM Computing Surveys, 26(4):325-420 (1994).
Bakkes, P.J., et al., "Mixing Fixed and Reconfigurable Logic for Array Processing," Dept. of Electrical and Electronic Engineering, University of Stellenbosch, South Africa, 1996 IEEE, pp. 118-125.
Becker, J. et al., "Architecture, Memory and Interface Technology Integration of an Industrial/Academic Configurable System-on-Chip (CSoC)," IEEE Computer Society Annual Workshop on VLSI (WVLSI 2003), (Feb. 2003).
Becker, J., "Configurable Systems-on-Chip (CSoC)," (Invited Tutorial), Proc. of 9th Proc. of XV Brazilian Symposium on Integrated Circuit, Design (SBCCI 2002), (Sep. 2002).
Bratt, A, "Motorola field programmable analogue arrays, present hardware and future trends," Motorola Programmable Technology Centre, Gadbrook Business Centre, Northwich, Cheshire, 1998, The Institute of Electrical Engineers, IEE. Savoy Place, London, pp. 1-5.
Cardoso, J.M.P. et al., "A novel algorithm combining temporal partitioning and sharing of functional units," University of Algarve, Faro, Portugal, 2001 IEEE, pp. 1-10.
Cardoso, Joao M.P. and Markus Weinhardt, "XPP-VC: A C Compiler with Temporal Partitioning for the PACT-XPP Architecture," Field-Programmable Logic and Applications. Reconfigurable Computing is Going Mainstream, 12$^{th}$ International Conference FPL 2002, Proceedings (Lecture Notes in Computer Science, vol. 2438) Springer-Verlag Berlin, Germany, 2002, pp. 864-874.
Clearspeed, CSX Processor Architecture, Whitepaper, PN-1110-0702, 2007, pp. 1-15, www.clearspeed.com.
Clearspeed, CSX Processor Architecture, Whitepaper, PN-1110-0306, 2006, pp. 1-14, www.clearspeed.com.
Compton, K. et al., "Configurable Computing: A Survey of Systems and Software," Northwestern University, Dept. of ECE, Technical Report, 1999, (XP-002315148), 39 pages.
Cronquist, D. et al., Architecture Design of Reconfigurable Pipelined Datapaths, Department of Computer Science and Engineering, University of Washington, Seattle, WA, Proceedings of the 20$^{th}$ Anniversary Conference on Advanced Research in VSLI, 1999, pp. 1-15.
DeHon, Andre, "Reconfigurable Architectures for General-Purpose Computing," Massachusetts Institute of Technology, Technical Report AITR-1586, Oct. 1996, XP002445054, Cambridge, MA, pp. 1-353.
Diniz, P., et al., "A behavioral synthesis estimation interface for configurable computing," University of Southern California, Marina Del Rey, CA, 2001 IEEE, pp. 1-2.
Ebeling, C. et al., "Mapping Applications to the RaPiD Configurable Architecture," Department of Computer Science and Engineering, University of Washington, Seattle, WA, *FPGAs for Custom Computing Machines, 1997. Proceedings., The 5th Annual IEEE Symposium*, Publication Date: Arp. 16-18, 1997, 10 pages.
Equator, Pixels to Packets, Enabling Multi-Format High Definition Video, Equator Technologies BSP-15 Product Brief, www.equator.com, 2001, 4 pages.
Franklin, Manoj et al., "A Fill-Unit Approach to Multiple Instruction Issue," Proceedings of the Annual International Symposium on Microarchitecture, Nov. 1994, pp. 162-171.
Freescale Slide Presentation, An Introduction to Motorola's RCF (Reconfigurable Compute Fabric) Technology, Presented by Frank David, Launched by Freescale Semiconductor, Inc., 2004, 39 pages.
Genius, D. et al., "A Case for Array Merging in Memory Hierarchies," Proceedings of the 9th International Workshop on Compilers for Parallel Computers, CPC'01 (Jun. 2001).
Hartenstein, R., "Coarse grain reconfigurable architectures," Design Automation Conference, 2001, Proceedings of the ASP-DAC 2001 Asia and South Pacific, Jan. 30-Feb. 2, 2001, IEEE Jan. 30, 2001, pp. 564-569.
Hartenstein, R. et al., "A new FPGA architecture for word-oriented datapaths," Proc. FPL'94, Springer LNCS, Sep. 1994, pp. 849.
Hwang, K., "Advanced Computer Architecture—Parallelism, Scalability, Programmability," 1993, McGraw-Hill, Inc., pp. 348-355.
Hwang, K., "Computer Architecture and Parallel Processing," Data Flow Computers and VLSI Computations, XP-002418655, 1985 McGraw-Hill, Chapter 10, pp. 732-807.

IBM Technical Disclosure Bulletin, IBM Corp., New York, XP000424878, Bd. 36, Nr. 11, Nov. 1, 1993, pp. 335-336.
Inside DSP, "Ambric Discloses Massively Parallel Architecture," Aug. 23, 2006, HTTP://insidedsp.com/tabid/64/articleType/ArticleView/articleId/155/Defa . . . , 2 pages.
Intel, Intel MXP5800/MXP5400 Digital Media Processors, Architecture Overview, Jun. 2004, Revision 2.4, pp. 1-14.
Kaul, M., et al., "An automated temporal partitioning and loop fission approach of FPGA based reconfigurable synthesis of DSP applications," University of Cincinnati, Cincinnati, OH, ACM 1999, pp. 616-622.
Kean, T.A., "Configurable Logic: A Dynamically Programmable Cellular Architecture and its VLSI Implementation," University of Edinburgh (Dissertation) 1988, pp. 1-286.
Kean, T., et al., "A Fast Constant Coefficient Multiplier for the XC6200," Xilinx, Inc., Lecture Notes in Computer Science, vol. 1142, Proceedings of the 6$^{th}$ International Workshop of Field-Programmable Logic, 1996, 7 pages.
Knittel, Gunter, "A PCI-compatible FPGA-Coprocessor for 2D/3D Image Processing," University of Turgingen, Germany, 1996 IEEE, pp. 136-145.
Koren et al., "A data-driven VLSI array for arbitrary algorithms," IEEE Computer Society, Long Beach, CA vol. 21, No. 10, Oct. 1, 1988, pp. 30-34.
Larsen, S. et al., "Increasing and Detecting Memory Address Congruence," Proceedings of the 2002 IEEE International Conference on Parallel Architectures and Compilation Techniques (PACT02), pp. 18-29 (Sep. 2002).
Lee et al., "A new distribution network based on controlled switching elements and its applications," IEEE/ACT Trans. of Networking, vol. 3, No. 1, pp. 70-81, Feb. 1995.
Lee, Jong-eun et al., "Reconfigurable ALU Array Architecture with Conditional Execution," International Soc. Design Conference (ISOOC) [online] Oct. 25, 2004, Seoul, Korea, 5 pages.
Margolus, N., "An FPGA architecture for DRAM-based systolic computations," Boston University Center for Computational Science and MIT Artificial Intelligence Laboratory, IEEE 1997, pp. 2-11.
Maxfield, C., "Logic that mutates while-u-wait," EDN Access 1996, EDN Magazine, www.edn.com/index, 4 pages.
Mei, Bingfeng, "A Coarse-Grained Reconfigurable Architecture Template and Its Compilation Techniques," Katholeike Universiteit Leuven, PhD Thesis, Jan. 2005, IMEC vzw, Universitair Micro-Electronica Centrum, Belgium, pp. 1-195 (and Table of Contents).
Mei, Bingfeng, et al., "Design and Optimization of Dynamically Reconfigurable Embedded Systems," IMEC vzw, 2003, Belgium, 7 pages, http://www.imec.be/reconfigurable/pdgICERSA_01_design.pdf.
Miyamori, T. et al., "REMARC: Reconfigurable Multimedia Array Coprocessor," Computer Systems Laboratory, Stanford University, IEICE Transactions on Information and Systems E Series D, 1999; (abstract): Proceedings of the 1998 ACM/SIGDA sixth international symposium on Field programmable gate arrays, p. 261, Feb. 22-25, 1998, Monterey, California, United States, pp. 1-12.
Muchnick, S., "Advanced Compiler Design and Implementation" (Morgan Kaufmann 1997), Table of Contents, 11 pages.
Murphy, C., "Virtual Hardware Using Dynamic Reconfigurable Field Programmable Gate Arrays," Engineering Development Centre, Liverpool John Moores University, UK, GERI Annual Research Symposium 2005, 8 pages.
Nageldinger, U., "Design-Space Exploration for Coarse Grained Reconfigurable Architectures," (Dissertation) Universitaet Kaiserslautern, 2000, Chapter 2, pp. 19-45.
Olukotun, K., "The Case for a Single-Chip Microprocessor," ACM Sigplan Notices, ACM, Association for Computing Machinery, New York, vol. 31, No. 9, Sep. 1996, pp. 2-11.
Ozawa, Motokazu et al., "A Cascade ALU Architecture for Asynchronous Super-Scalar Processors," IEICE Transactions on Electronics, Electronics Society, Tokyo, Japan, vol. E84-C, No. 2, Feb. 2001, pp. 229-237.
PACT Corporation, "The XPP Communication System," Technical Report 15 (2000), pp. 1-16.

Quenot, G.M., et al., "A Reconfigurable Compute Engine for Real-Time Vision Automata Prototyping," Laboratoire Systeme de Perception, DGA/Etablissement Technique Central de l'Armement, France, 1994 IEEE, pp. 91-100.

Saleeba, Z.M.G., "A Self-Reconfiguring Computer System," Department of Computer Science, Monash University (Dissertation) 1998, pp. 1-306.

Schmidt, H. et al., "Behavioral synthesis for FGPA-based computing," Carnegie Mellon University, Pittsburgh, PA, 1994 IEEE, pp. 125-132.

Singh, H. et al., "MorphoSys: An Integrated Reconfigurable System for Data-Parallel Computation-Intensive Applications," University of California, Irvine, CA. and Federal University of Rio de Janeiro, Brazil, 2000, IEEE Transactions on Computers, pp. 1-35.

Soni, M., "VLSI Implementation of a Wormhole Run-time Reconfigurable Processor," Jun. 2001, (Masters Thesis) Virginia Polytechnic Institute and State University, 88 pages.

Tsutsui, A., et al., "YARDS: FPGA/MPU Hybrid Architecture for Telecommunication Data Processing," NTT Optical Network Systems Laboratories, Japan, 1997 ACM, pp. 93-99.

Vasell et al., "The Function Processor: A Data-Driven Processor Array for Irregular Computations," Chalmers University of Technology, Sweden, pp. 1-21.

Waingold, E., et al., "Baring it all to software: Raw machines," IEEE Computer, Sep. 1997, at 86-93.

Weinhardt, Markus et al., "Memory Access Optimization for Reconfigurable Systems," IEEE Proceedings Computers and Digital Techniques, 48(3) (May 2001).

Wolfe, M. et al., "High Performance Compilers for Parallel Computing" (Addison-Wesley 1996).

XILINX, "Spartan and SpartanXL Families Field Programmable Gate Arrays," Jan. 1999, Xilinx, pp. 4-3 through 4-70.

XILINX, "XC6200 Field Programmable Gate Arrays," Apr. 24, 1997, Xilinx product description, pp. 1-73.

XILINX, "XC3000 Series Field Programmable Gate Arrays," Nov. 6, 1998, Xilinx product description, pp. 1-76.

XILINX, "XC4000E and XC4000X Series Field Programmable Gate Arrays," May 14, 1999, Xilinx product description, pp. 1-68.

XILINX, "Virtex-E 1.8 V Extended Memory Field Programmable Gate Arrays," Jul. 17, 2002, Xilinx Production Product Specification, pp. 1-118.

XILINX, "Virtex-II and Virtex-II Pro X FPGA User Guide," Mar. 28, 2007, Xilinx user guide, pp. 1-559.

Zima, H. et al., "Supercompilers for parallel and vector computers" (Addison-Wesley 1991).

Altera, "APEX 20K Programmable Logic Device Family," Altera Corporation Data Sheet, Mar. 2004, ver. 5.1, pp. 1-117.

Chaudhry, G.M. et al., "Separated caches and buses for multiprocessor system," Circuits and Systems, 1993; Proceedings of the 36th Midwest Symposium on Detroit, MI, USA, Aug. 16-18, 1993, New York, NY IEEE, Aug. 16, 1993, pp. 1113-1116, XP010119918 ISBN: 0-7803-1760-2.

Culler, D.E; Singh, J.P., "Parallel Computer Architecture," pp. 434-437, 1999, Morgan Kaufmann, San Francisco, CA USA, XP002477559.

Jantsch, Axel et al., "Hardware/Software Partitioning and Minimizing Memory Interface Traffic," Electronic System Design Laboratory, Royal Institute of Technology, ESDLab, Electrum 229, S-16440 Kista, Sweden (Apr. 1994), pp. 226-231.

Kanter, David, "NVIDIA's GT200: Inside a Parallel Processor," http://www.realworldtech.com/paue.cfrn?ArticleID=RWT090989195242&p=1, Sep. 8, 2008, 27 pages.

Lange, H. et al., "Memory access schemes for configurable processors," Field-Programmable Logic and Applications, International Workshop, FPL, Aug. 27, 2000, pp. 615-625, XP02283963.

Lee, Ming-Hau at al., "Designs and Implementation of the MorphoSys Reconfigurable Computing Processors," The Journal of VLSI Signal Processing, Kluwer Academic Publishers, BO, vol. 24, No. 2-3, Mar. 2, 2000, pp. 1-29.

Mei, Bingfeng et al., "Adres: An Architecture with Tightly Coupled VLIW Processor and Coarse-Grained Reconfigurable Matrix," Proc. *Field-Programmable Logic and Applications* (FPL 03), Springer, 2003, pp. 61-70.

Ryo, A., "Auszug aus Handbuch der Informationsverarbeitung," ed. Information Processing Society of Japan, *Information Processing Handbook, New Edition*, Software Information Center, Ohmsha, Dec. 1998, 4 pages. [Translation provided].

XILINX, "Virtex-E 1.8 V Extended Memory Field Programmable Gate Arrays," (v2.2) Sep. 10, 2002, Xilinx Production Product Specification, pp. 1-52.

XILINX, "Virtex-II and Virtex-II Pro X FPGA Platform FPGAs: Complete Data Sheet," (v4.6) Mar. 5, 2007, pp. 1-302.

XILINX, "Virtex-II Platform FPGAs: Complete Data Sheet," (v3.5) Nov. 5, 2007, pp. 1-226.

Agarwal, A., et al., "APRIL: A Processor Architecture for Multiprocessing," Laboratory for Computer Science, MIT, Cambridge, MA, IEEE 1990, pp. 104-114.

Almasi and Gottlieb, *Highly Parallel Computing*, The Benjamin/Cummings Publishing Company, Inc., Redwood City, CA, 1989, 3 pages (Fig. 4.1).

Advanced Risc Machines Ltd (ARM), "AMBA - Advanced Microcontroller Bus Architecture Specification," (Document No. ARM IHI 0001C), Sep. 1995, 72 pages.

Alfke, Peter; New, Bernie, *Xilinx Application Note*, "Additional XC3000 Data," XAPP 024.000, 1994, pp. 8-11 through 8-20.

Alfke, Peter; New, Bernie, *Xilinx Application Note*, "Adders, Subtracters and Accumulators in XC3000," XAPP 022.000, 1994, pp. 8-98 through 8-104.

Alike, Peter, *Xilinx Application Note*, "Megabit FIFO in Two Chips: One LCA Device and One DRAM," XAPP 030.000, 1994, pp. 8-148 through 8-150.

Alike, Peter, *Xilinx Application Note*, "Dynamic Reconfiguration," XAPP 093, Nov. 10, 1997, pp. 13-45 through 13-46.

Alike, Peter; New, Bernie, *Xilinx Application Note*, "Implementing State Machines in LCA Devices," XAPP 027.001, 1994, pp. 8-169 through 8-172.

Algotronix, Ltd., CAL64K Preliminary Data Sheet, Apr. 1989, pp. 1-24.

Algotronix, Ltd., CAL4096 Datasheet, 1992, pp. 1-53.

Algotronix, Ltd., CHS2x4 User Manual, "CHA2x4 Custom Computer," 1991, pp. 1-38.

Allaire, Bill; Fischer, Bud, *Xilinx Application Note*, "Block Adaptive Filter," XAPP 055, Aug. 15, 1996 (Version 1.0), pp. 1-10.

Altera Application Note (73), "Implementing FIR Filters in FLEX Devices," Altera Corporation, Feb. 1998, ver. 1.01, pp. 1-23.

Athanas, P. (Thesis), "An adaptive machine architecture and compiler for dynamic processor reconfiguration," Brown University 1992, pp. 1-157.

Berkeley Design Technology, Inc., Buyer's Guide to DSP Processors, 1995, Fremont, CA., pp. 673-698.

Bittner, R. et al., "Colt: An Experiment in Wormhole Run-Time Reconfiguration," Bradley Department of Electrical and Computer Engineering, Blacksburg, VA, SPIE—International Society for Optical Engineering, vol. 2914/187, Nov. 1996, Boston, MA, pp. 187-194.

Camilleri, Nick; Lockhard, Chris, *Xilinx Application Note*, "Improving XC4000 Design Performance," XAPP 043.000, 1994, pp. 8-21 through 8-35.

Cartier, Lois, *Xilinx Application Note*, "System Design with New XC4000EX I/O Features," Feb. 21, 1996, pp. 1-8.

Chen, D., (Thesis) "Programmable arithmetic devices for high speed digital signal processing," U. California Berkeley 1992, pp. 1-175.

Churcher, S., et al., "The XC6200 FastMap TM Processor Interface," Xilinx, Inc., Aug. 1995, pp. 1-8.

Cowie, Beth, *Xilinx Application Note*, "High Performance, Low Area, Interpolator Design for the XC6200," XAPP 081, May 7, 1997 (Version 1.0), pp. 1-10.

Duncan, Ann, *Xilinx Application Note*, "A32x16 Reconfigurable Correlator for the XC6200," XAPP 084, Jul. 25, 1997 (Version 1.0), pp. 1-14.

Ebeling, C., et al., "RaPiD—Reconfigurable Pipelined Datapath," Dept. of Computer Science and Engineering, U. Washington, 1996, pp. 126-135.

Epstein, D., "IBM Extends DSP Performance with Mfast—Powerful Chip Uses Mesh Architecture to Accelerate Graphics, Video," 1995 MicroDesign Resources, vol. 9, No. 16, Dec. 4, 1995, pp. 231-236.

Fawcett, B., "New SRAM-Based FPGA Architectures Address New Applications," Xilinx, Inc. San Jose, CA, Nov. 1995, pp. 231-236.
Goslin, G; Newgard, B, *Xilinx Application Note*, "16-Tap, 8-Bit FIR Filter Applications Guide," Nov. 21, 1994, pp. 1-5.
Iwanczuk, Roman, *Xilinx Application Note*, "Using the XC4000 RAM Capability," XAPP 031.000, 1994, pp. 8-127 through 8-138.
Knapp, Steven, "Using Programmable Logic to Accelerate DSP Functions," Xilinx, Inc., 1995, pp. 1-8.
New, Bernie, *Xilinx Application Note*, "Accelerating Loadable Counters in SC4000," XAPP 023.001, 1994, pp. 8-82 through 8-85.
New, Bernie, *Xilinx Application Note*, "Boundary Scan Emulator for XC3000," XAPP 007.001, 1994, pp. 8-53 through 8-59.
New, Bernie, *Xilinx Application Note*, "Ultra-Fast Synchronous Counters," XAPP 014.001, 1994, pp. 8-78 through 8-81.
New, Bernie, *Xilinx Application Note*, "Using the Dedicated Carry Logic in XC4000," XAPP 013.001, 1994, pp. 8-105 through 8-115.
New, Bernie, *Xilinx Application Note*, "Complex Digital Waveform Generator," XAPP 008.002, 1994, pp. 8-163 through 8-164.
New, Bernie, *Xilinx Application Note*, "Bus-Structured Serial Input-Output Device," XAPP 010.001, 1994, pp. 8-181 through 8-182.
Ridgeway, David, *Xilinx Application Note*, "Designing Complex 2-Dimensional Convolution Filters," XAPP 037.000, 1994, pp. 8-175 through 8-177.
Rowson, J., et al., "Second-generation compilers optimize semicustom circuits," Electronic Design, Feb. 19, 1987, pp. 92-96.
Schewel, J., "A Hardware/Software Co-Design System using Configurable Computing Technology," Virtual Computer Corporation, Reseda, CA, IEEE 1998, pp. 620-625.
Segers, Dennis, Xilinx Memorandum, "MIKE—Product Description and MRD," Jun. 8, 1994, pp. 1-29.
Texas Instruments, "TMS320C8x System-Level Synopsis," Sep. 1995, 75 pages.
Texas Instruments, "TMS320C80 Digital Signal Processor," Data Sheet, Digital Signal Processing Solutions 1997, 171 pages.
Texas Instruments, "TMS320C80 (MVP) Parallel Processor," User's Guide, Digital Signal Processing Products 1995, 73 pages.
Trainor, D.W., et al., "Implementation of the 2D DCT Using A Xilinx XC6264 FPGA," 1997, IEEE Workshop of Signal Processing Systems SiPS 97, pp. 541-550.
Trimberger, S, (Ed.) et al., "Field-Programmable Gate Array Technology," 1994, Kluwer Academic Press, pp. 1-258 (and the Title Page, Table of Contents, and Preface) [274 pages total].
Trimberger, S., "A Reprogrammable Gate Array and Applications," IEEE 1993, Proceedings of the IEEE, vol. 81, No. 7, Jul. 1993, pp. 1030-1041.
Trimberger, S., et al., "A Time-Multiplexed FPGA," Xilinx, Inc., 1997 IEEE, pp. 22-28.
Ujvari, Dan, *Xilinx Application Note*, "Digital Mixer in an XC7272," XAPP 035.002, 1994, p. 1.
Veendrick, H., et al., "A 1.5 GIPS video signal processor (VSP)," Philips Research Laboratories, The Netherlands, IEEE 1994 Custom Integrated Circuits Conference, pp. 95-98.
Wilkie, Bill, *Xilinx Application Note*, "Interfacing XC6200 to Microprocessors (TMS320C50 Example)," XAPP 064, Oct. 9, 1996 (Version 1.1), pp. 1-9.
Wilkie, Bill, *Xilinx Application Note*, "Interfacing XC6200 to Microprocessors (MC68020 Example)," XAPP 063, Oct. 9, 1996 (Version 1.1), pp. 1-8.
XCELL, Issue 18, Third Quarter 1995, "Introducing three new FPGA Families!"; "Introducing the XC6200 FPGA Architecture: The First FPGA Architecture Optimized for Coprocessing in Embedded System Applications," 40 pages.
*Xilinx Application Note*, Advanced Product Specification, "XC6200 Field Programmable Gate Arrays," Jun. 1, 1996 (Version 1.0), pp. 4-253-4-286.
*Xilinx Application Note*, A Fast Constant Coefficient Multiplier for the XC6200, XAPP 082, Aug. 24, 1997 (Version 1.0), pp. 1-5.
Xilinx Technical Data, "XC5200 Logic Cell Array Family," Preliminary (v1.0), Apr. 1995, pp. 1-43.
Xilinx Data Book, "The Programmable Logic Data Book," 1996, 909 pages.
Xilinx, Series 6000 User's Guide, Jun. 26, 1997, 223 pages.
Yeung, K., (Thesis) "A Data-Driven Multiprocessor Architecture for High Throughput Digital Signal Processing," Electronics Research Laboratory, U. California Berkeley, Jul. 10, 1995, pp. 1-153.
Yeung, L., et al., "A 2.4GOPS Data-Driven Reconfigurable Multiprocessor IC for DSP," Dept. of EECS, U. California Berkeley, 1995 IEEE International Solid State Circuits Conference, pp. 108-110.
ZILOG Preliminary Product Specification, "Z86C95 CMOS Z8 Digital Signal Processor," 1992, pp. 1-82.
ZILOG Preliminary Product Specification, "Z89120 Z89920 (ROMless) 16-Bit Mixed Signal Processor," 1992, pp. 1-82.
Defendants' Invalidity Contentions in *PACT XPP Technologies, AG v. XILINX, Inc.*, et al., (E.D. Texas Dec. 28. 2007) (No. 2:07cv563)., including Exhibits A through K in separate PDF files.
IMEC, "ADRES multimedia processor & 3MF multimedia platform," Transferable IP, IMEC Technology Description, (Applicants believe the date to be Oct. 2005), 3 pages.
Becker, J., "A Partitioning Compiler for Computers with Xputer-based Accelerators," 1997, Kaiserslautern University, 326 pp.
Hartenstein et al., "Parallelizing Compilation for a Novel Data-Parallel Architecture," 1995, PCAT-94, Parallel Computing: Technology and Practice, 13 pp.
Hartenstein et al., "A Two-Level Co-Design Framework for Xputer-based Data-driven Reconfigurable Accelerators," 1997, Proceedings of the Thirtieth Annual Hawaii International Conference on System Sciences, 10 pp.
Huang, Libo et al., "A New Architecture for Multiple-Precision Floating-Point Multiply-Add Fused Unit Design," School of Computer National University of Defense Technology, China, IEEE 2007, 8 pages.
Jo, Manhwee et al., "Implementation of Floating-Point Operations for 3D Graphics on a Coarse-Grained Reconfigurable Architecture," Design Automation Laboratory, School of EE/CS, Seoul National University, Korea, IEEE 2007, pp. 127-130.
XILINX, White Paper 370: (Virtex-6 and Spartan-6 FPGA Families) "Reducing Switching Power with Intelligent Clock Gating," Frederic Rivoallon, May 3, 2010, pp. 1-5.
XILINX, White Paper 298: (Spartan-6 and Virtex-6 Devices) "Power Consumption at 40 and 50 nm," Matt Klein, Apr. 13, 2009, pp. 1-21.

\* cited by examiner

PROCESS FOR AUTOMATIC DYNAMIC RELOADING OF DATA FLOW PROCESSORS (DFPS) AND UNITS WITH TWO- OR THREE-DIMENSIONAL PROGRAMMABLE CELL ARCHITECTURES (FPGAS, DPGAS, AND THE LIKE)

CROSS-REFERENCE TO RELATED APPLICATIONS

This application is a continuation of U.S. patent application Ser. No. 10/265,846, filed Oct. 7, 2002, now U.S. Pat. No. 7,028,107 which is a continuation of U.S. patent application Ser. No. 09/613,217, filed Jul. 10, 2000, now U.S. Pat. No. 6,477,643, which is a continuation of U.S. patent application Ser. No. 08/947,002 filed on Oct. 8, 1997, now U.S. Pat. No. 6,088,795, expressly incorporated herein by reference in the entirety.

FIELD OF THE INVENTION

The present invention is directed to a process for automatic dynamic reloading of data flow processors.

BACKGROUND INFORMATION

Programmable units presently used (DFPs, FPGAs—Field Programmable Gate Arrays) can be programmed in two different ways:
  one-time only, i.e., the configuration can no longer be changed after programming. All configured elements of the unit perform the same function over the entire period during which the application takes place.
  on site, i.e., the configuration can be changed after the unit has been installed by loading a configuration file when the application is started. Most units (in particular FPGA units) cannot be reconfigured during operation. For reconfigurable units, data usually cannot be further processed while the unit is being reconfigured, and the time required is very long.

Configuration data is loaded into programmable units through a hardware interface. This process is slow and usually requires hundreds of milliseconds due to the limited band width accessing the external memory where the configuration data is stored, after which the programmable unit is available for the desired/programmed function as described in the configuration file.

A configuration is obtained by entering a special bit pattern of any desired length into the configurable elements of the unit. Configurable elements can be any type of RAM cells, multiplexers, interconnecting elements or ALUs. A configuration string is stored in such an element, so that the element preserves its configuration determined by the configuration string during the period of operation.

The existing methods and options present a series of problems, such as:
  If a configuration in a DFP (see German Patent Application No. DE 44 16 881 A1) or an FPGA is to be modified, a complete configuration file must always be transmitted to the unit to be programmed, even if only a very small part of the configuration is to be modified.
  As a new configuration is being loaded, the unit can only continue to process data to a limited extent or not at all.
  With the increasing number of configurable elements in each unit (in particular in FPGA units), the configuration files of these units also become increasingly large (several hundred Kbytes on average). Therefore it takes a very long time to configure a large unit and often makes it impossible to do it during operation or affects the function of the unit.
  When a unit is partially configured during operation, a central logic entity is always used, through which all reconfigurations are managed. This requires considerable communication and synchronization resources.

SUMMARY OF THE INVENTION

The present invention makes it possible to reconfigure a programmable unit considerably more rapidly. The present invention allows different configurations of a programmable unit to be used in a flexible manner during operation without affecting or stopping the operability of the programmable unit. Unit configuration changes are performed simultaneously, so they are rapidly available without need for additional configuration data to be occasionally transmitted. The method can be used with all types of configurable elements of a configurable unit and with all types of configuration data, regardless of the purpose for which they are provided within the unit.

The present invention makes it possible to overcome the static limitations of conventional units and to improve the utilization of existing configurable elements. By introducing a buffer storage device, a plurality of different functions can be performed on the same data.

In a programmable unit, there is a plurality of ring memories, i.e., memories with a dedicated address control, which, upon reaching the end of the memory, continues at the starting point, thus forming a ring. These ring memories have read-write access to configuration registers, i.e., the circuits that receive the configuration data, of the elements to be configured. Such a ring memory has a certain number of records, which are loaded with configuration data by a PLU as described in German Patent Application No. 44 16 881 A1. The architecture of the records is selected so that their data format corresponds to the configurable element(s) connected to the ring memory and allows a valid configuration to be set.

Furthermore, there is a read position pointer, which selects one of the ring memory records as the current read record. The read position pointer can be moved to any desired position/record within the ring memory using a controller. Furthermore there is a write position pointer, which selects one of the ring memory records as the current write record. The write position pointer can be moved to any desired position/record within the ring memory using a controller.

At run time, to perform reconfiguration, a configuration string can be transmitted into the element to be configured without the data requiring management by a central logic or transmission. By using a plurality of ring memories, several configurable elements can be configured simultaneously.

Since a ring memory with its complete controller can switch configurable cells between several configuration modes, it is referred to as a switching table.

DETAILED DESCRIPTION OF THE INVENTION

Figure 1:
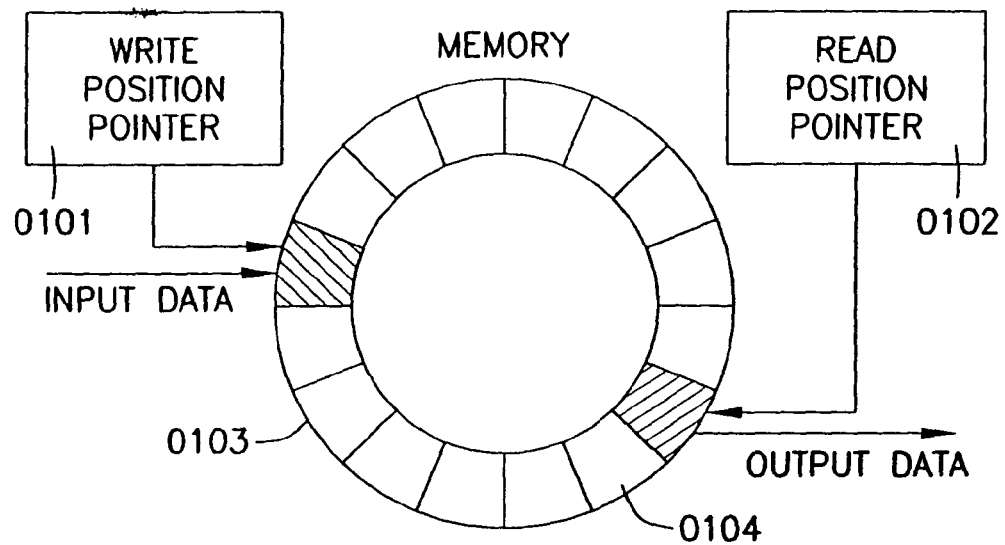
FIG. 1 illustrates a schematic architecture of a ring memory.

There is a plurality of ring memories in a programmable unit or connected externally to said unit. The one or more ring memories have one or more controllers controlling the one or more ring memories. These controllers are part of the PLU named in German Patent Application No. DE 44 16 881 A1. The ring memories contain configuration strings for the configurable elements of one or a plurality of configurable units; the configurable elements can also be expressly used for interconnecting function groups and they can be crossbar circuits or multiplexers for interconnecting bus architectures, which are conventional.

Ring memories and ring memory controllers can be either directly hardware-implemented or first obtained by configuring one or more configurable cells of a configurable unit (e.g., FPGA).

Conventional ring memories can be used as ring memories, in particular ring memories and/or controllers with the following properties:

where not all records are used, and which have the capability of providing a position where the read and/or write position pointer of the ring memory is set to the beginning or the end of the ring memory. This can be implemented, for example, by using command strings (STOP, GOTO, etc.), counters, or registers storing the start and stop positions;

which make it possible to divide the ring memory into independent sections, and the controller of the ring memory can be set, for example, via the events listed below as examples, so that it works on one of these sections;

which make it possible to divide the ring memory into independent sections and there is a plurality of controllers, each one working on one section; a plurality of controllers may work on the same section. This can be implemented via arbiter switching, in which case certain processing cycles are lost. Registers can also be used instead of RAMs;

each controller has one or more read position pointers and/or one or more write position pointers;

this position pointer can be moved forward and/or backward;

this position pointer can be set to the start, end, or a given position on the basis of one or more events;

the controller has a mask register with which a subset can be selected from the set of all possible events by entering a data string. Only this subset of results is relayed to the controller as an event and triggers the forwarding of the position pointer(s);

controllers working with a multiple of the actual system clock rate (oversampling) to allow the processing of several records within a system cycle.

The switching table controller is implemented using a regular state machine. In addition to simple controllers required by a conventional ring memory, controllers with the following properties are best suited for performing or possibly expanding the control of the switching tables of a programmable unit (in particular also of FPGAs and DPGAs (Dynamically Programmable Gate Arrays, a new subgroup of FPGAs)) according to the present invention:

controllers capable of recognizing specific command strings. A command string is distinguished by the fact that it has an identifier, which allows the controller to recognize the data of a ring memory record as a command string rather than a data string;

controllers capable of executing specific command strings; specifically commands that change the sequence of the state machine and/or modify records of the ring memory through a data processing function;

controllers capable of recognizing an identifier and of processing additional records of the ring memory through the internal, higher-speed cycle (oversampling) on the basis of this identifier, until an end identifier is reached, or the next cycle of the clock that controls the oversampling cycle is reached.

In particular the following commands or a subset of those commands can be used as command strings for the appropriate control of a switching table requiring command string control. The command strings concerning position pointers can be used on the read position pointer(s) or on the write position pointer(s). Possible command strings include:

a WAIT command.

The WAIT command causes the controller to wait until the next event or (possibly several) events occur. During this state, the read/write position pointer(s) is(are) not moved. If the event(s) occur(s), the read/write position pointer(s) is (are) positioned on the next record.

a SKIP command.

The SKIP command causes a given number of ring memory records to be skipped by one of the following two methods:

The SKIP1 command is executed fully in a single processing cycle. If, for example, SKIP 5 is issued, the pointer jumps to the record located five records before (after) the current read/write record in a processing cycle.

The SKIP2 command is only executed after a number of processing cycles. It is conceivable, for example, that the SKIP 5 command is executed only after five processing cycles. Here again five records are skipped counting from the current record. The parameter (in this case the 5) is thus used twice.

The indication of the direction of jump can end either in a forward movement or in a backward movement of the position pointer with the use of a positive or negative number.

A SWAP command.
> The SWAP command swaps the data of two given records.

RESET command.
> The RESET command sets the read/write position pointer(s) to the start and/or a given record position within the ring memory.

A WAIT-GOTO command.
> The WAIT-GOTO command waits like the above-described WAIT command for one or more specific events and then positions the read/write position pointer to a specific start state within one or more processing cycles.

A NOP command.
> The NOP command executes no action. No data is transmitted from the ring memory to the element(s) to be configured, neither are the position pointers modified. Thus the NOP command identifies a record as non-relevant. However, this record is addressed and evaluated by the ring memory controller it requires using one or more processing cycles.

A GOTO command.
> The GOTO command positions the read/write position pointer(s) on the given record position.

A MASK command.
> The MASK command writes a new data string into the multiplexer, which selects the different events. Therefore, this command allows the events to which the controller responds to be changed.

An LLBACK command.
> The LLBACK command generates a feedback to the PLU (as described in German Patent Application No. DE 44 16 881 A1). The switching table can cause greater regions of the unit to be reloaded, in particular it can cause the switching table itself to be reloaded.

A command triggering a read/modify/write cycle. The command triggers the reading of commands or data in another record, for example, by the controller, the PLU or an element located outside the switching table. This data is then processed in any desired fashion and written into the same or another position of the switching table ring memory. This can take place during one processing cycle of the switching table. The sequence is then terminated before a position pointer is repositioned.

The ring memory record architecture has the following format:

| Data/Command | Run/Stop | Data |
| --- | --- | --- |

The first bit identifies a record as a command or a data string. The controller of the switching table thus decides whether the bit string in the data portion of the record should be treated as a command or as configuration data.

The second bit identifies whether the controller should proceed immediately even without the occurrence of another event, should proceed with the next record, or wait for the next event. If an oversampling process is used and the RUN bit is set, the subsequent records will be processed with the help of this oversampling cycle. This continues until a record without a RUN bit set has been reached or the number of records that can be processed at the oversampling cycle rate within one system cycle has been reached.

If an oversampling process is used, the normal system cycle and the RUN bit set cause commutation to take place. Events occurring during the execution of a command sequence marked with the RUN bit are analyzed and the trigger signal is stored in a flip-flop. The controller then analyzes this flip-flop again when a record without a RUN bit set is reached.

The rest of a record contains, depending on the type (data or command), all the necessary information, so that the controller can fully perform its function.

The size of the ring memory can be implemented according to the application; this is true in particular for programmable units, where the ring memory is obtained by configuring one or more configurable cells.

A ring memory is connected to an element to be configured (or a group of elements to be configured), so that a selected configuration string (in the ring memory) is entered in the configuration register of the element to be configured or group of elements to be configured.

Thus a valid and operational configuration of the element or group to be configured is obtained.

Each ring memory has one controller or a plurality of controllers, which control the positioning of the read position pointer and/or the write position pointer.

Using the feedback channels described in German Patent Application DE 44 16 881 A1, the controller can respond to events of other elements of the unit or to external events that are transmitted into the unit (e.g., interrupt, I0 protocols, etc.) and, in response to these internal or external events, moves the read position pointer and/or the write position pointer to another record.

The following events are conceivable, for example:
clock signal of a CPU,
internal or external interrupt signal,
trigger signal of other elements within the unit,
comparison of a data stream and/or a command stream with a value,
input/output events,
counter run, overrun, reset,
evaluation of a comparison.

If a unit has several ring memories, the controller of each ring memory can respond to different events.

After each time the pointer is moved to a new record, the configuration string in this record is transferred to the configurable element(s) connected to the ring memory.

This transfer takes place so that the operation of the unit parts that are not affected by the reconfiguration remains unchanged.

The ring memory(ies) may be located either in a unit or connected to the unit from the outside via an external interface.

Each unit may have a plurality of independent ring memories, which can be concentrated in a region of the unit, but can also be distributed in a reasonable manner on the surface of the unit.

The configuration data is loaded by a PLU, such as described in German Patent Application No. DE 44 16 881 A1, or by other internal cells of the unit into the memory of the switching table. The configuration data can also be simultaneously transferred by the PLU or other internal cells of the unit to several different switching tables in order to allow the switching tables to load simultaneously.

The configuration data can also be in the main memory of a data processing system and be transferred by known methods, such as DMA or other processor-controlled data transfer, instead of the PLU.

After the PLU has loaded the ring memory of the switching table, the controller of the switching table is set to a start status, which establishes a valid configuration of the complete unit or parts of the unit. The control of the switching table starts now with repositioning of the read position pointer and/or the write position pointer as a response to events taking place.

In order to cause new data to be loaded into the switching table or a number of switching tables, the controller can return a signal to the PLU, as described in German Patent Application No. DE 44 16 881 A1, or other parts of the unit that are responsible for loading new data into the ring memory of the switching table. Such a feedback can be triggered by the analysis of a special command, a counter status, or from the outside (the State-Back UNIT described in Patent Application PACT02).

The PLU or other internal cells of the unit analyze this signal, respond to the signal by executing a program possibly in a modified form, and transfer new or different configuration data to the ring memory(ies). Only the data of each ring memory that is involved in a data transfer as determined by the signal analysis, rather than the configuration data of a complete unit, must be transferred.

Buffer: A memory can be connected to individual configurable elements or groups thereof (hereinafter referred to as functional elements). Several known procedures can be used to configure this memory; FIFOs are well-known, in particular. The data generated by the functional elements are stored in the memory until a data packet with the same operation to be performed is processed or until the memory is full. Thereafter the configuration elements are reconfigured through switching tables, i.e., the functions of the elements are changed. FullFlag showing that the memory is full can be used as a trigger signal for the switching tables. In order to freely determine the amount of data, the position of the FullFlag is configurable, i.e., the memory can also be configured through the switching table. The data in the memory is sent to the input of the configuration elements, and a new operation is performed on the data; the data is the operand for the new computation. The data can be processed from the memory only, or additional data can be requested from the outside (outside the unit or other functional elements) for this purpose. As the data is processed, it (the result of the operation) can be forwarded to the next configuration elements or written into the memory again. In order to provide both read and write access to the memory, the memory can have two memory arrays, which are processed alternately, or separate read and write position pointers can exist in the same memory.

One particular configuration option is the connection of a plurality of memories as described above, which allows several results to be stored in separate memories; then, at a given time, several memory regions are sent to the input of a functional element and processed in order to execute a given function.

Architecture of a ring memory record: One possible structure of the records in a switching table ring memory, used in a data processing system as described in German Patent Application No. DE 44 16 881 A1 is described below. The following tables show the command architecture using the individual bits of a command string.

| Bit Number | Name | Description |
| --- | --- | --- |
| 0 | Data/Command | Identifies a record as a data or command string |
| 1 | Run/Stop | Identifies Run or Stop mode |

Thus, if a record is a data record, bit number 0 has the value 0, so the bits from position two have the following meanings:

| Bit Number | Name | Description |
| --- | --- | --- |
| 2-6 | Cell number | Provides the cell numbers within a group using the same switching table |
| 7-11 | Configuration data | Provides the function that the cell (e.g., an EALU) should execute |

If the record is a command, bit number 0 has the value 1, and the bits from position two have the following meanings:

| Bit Number | Name | Description |
| --- | --- | --- |
| 2-6 | Command number | Provides the number of the command that is executed by the switching table controller |
| 7 | Read/Write position pointer | Shows whether the command is to be applied to the read position pointer or the write position pointer. If the command does not change either position pointer, the bit status is undefined. |
| 8-n | Data | Depending on the command, the data needed for the command are stored starting with bit 8. |

In the following table, bits 2-6 and 8-n are shown for each of the commands listed. The overall bit length of a data string depends on the unit where the switching table is used. The bit length must be chosen so as to code all data needed for the commands in the bits starting from position 8.

| Command | Bit 2-6 | Description of bit 8-n |
| --- | --- | --- |
| WAIT | 00 00 0 | Number indicating how often an event is to be waited for |
| SKIP1 | 00 00 1 | Number with plus or minus sign showing how many records are to be skipped forward (backward if negative) |
| SKIP2 | 00 01 0 | See SKIP1 |
| SWAP | 00 01 1 | $1^{st}$ record position, $2^{nd}$ record position |
| RESET | 00 10 0 | Number of the record on which the position pointer is to be set |
| WAIT-GOTO | 00 10 1 | Number indicating how often an event is to be waited for, followed by the number of the record on which the position pointer is to be positioned |
| NOP | 00 11 0 | No function! |
| GOTO | 00 11 1 | Number of the record on which the position pointer is to be positioned |
| MASK | 01 00 0 | Bit pattern entered into the multiplexer to select the events |
| LLBACK | 01 00 1 | A trigger signal is generated for the PLU (feedback) |

Reconfiguring ALUs: One or more switching tables can be used for controlling an ALU.

The present invention can be used, for example, to improve on Patent PACT02, where the switching table is connected to the M/F PLUREG registers or the M/F PLUREG registers are fully replaced by a switching table.

FIG. 1 shows the schematic architecture of a ring memory. It comprises a write position pointer 0101 and a read position pointer 0102, which access a memory 0103. This memory can be configured as a RAM or as a register. Using the read/write position pointer, an address of RAM 0104 is selected, where input data is written or data is read, depending on the type of access.

Figure 2:
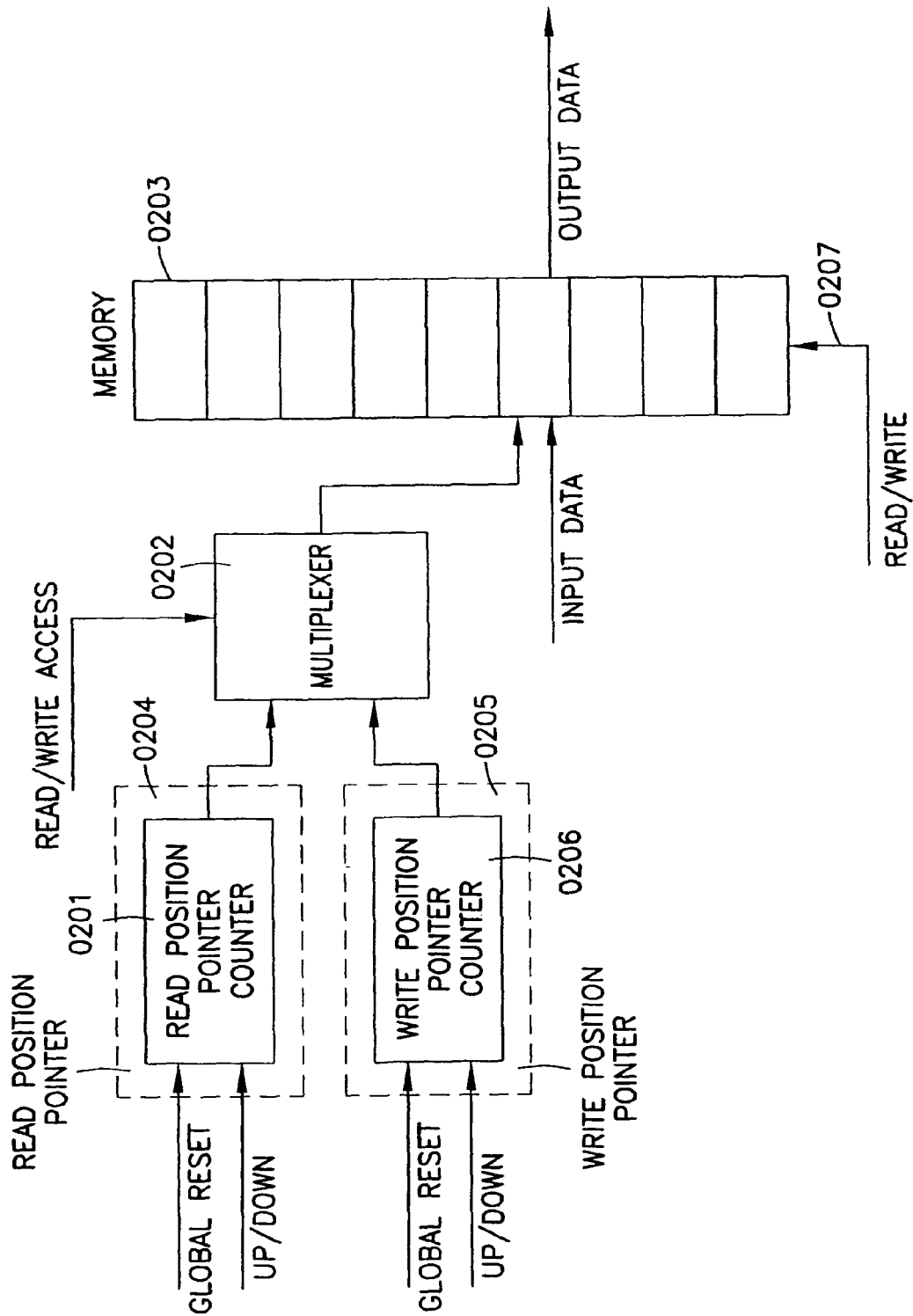
FIG. 2 illustrates the internal architecture of a ring memory.

FIG. 2 shows the internal architecture of a simple ring memory. Read position pointer 0204 has a counter 0201 and write position pointer 0205 has a counter 0206. Each counter 0201, 0206 has a global reset input and an up/down input, through which the counting direction is defined. A multiplexer 0202, whose inputs are connected to the outputs of the counters, is used to switch between write 0205 and read 0204 position pointers, which point to an address of memory 0203. Read and write access is performed through signal 0207. The respective counter is incremented by one position for each read or write access. When the read 0204 or write 0205 position pointer points at the last position of the memory (last address for an upward counting counter or first address for a downward counting counter), the read or write position pointer 0204, 0205 is set to the first position of memory 0203 in the next access (first address for an upward counting counter or the last address for a downward counting counter). This provides the ring memory function.

Figure 3A:
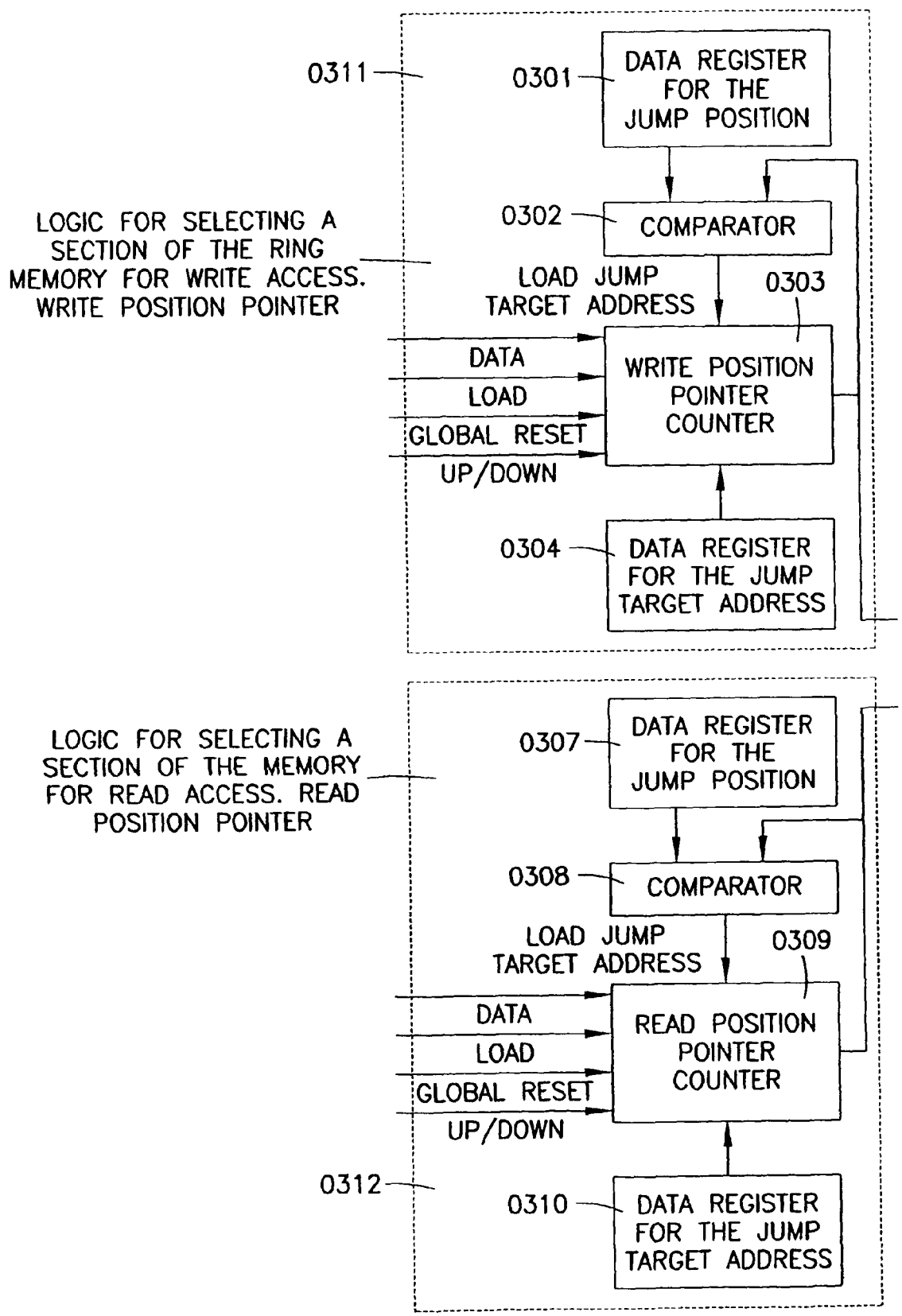
FIG. 3 illustrates a ring memory with a selectable work area.
Figure 3B:
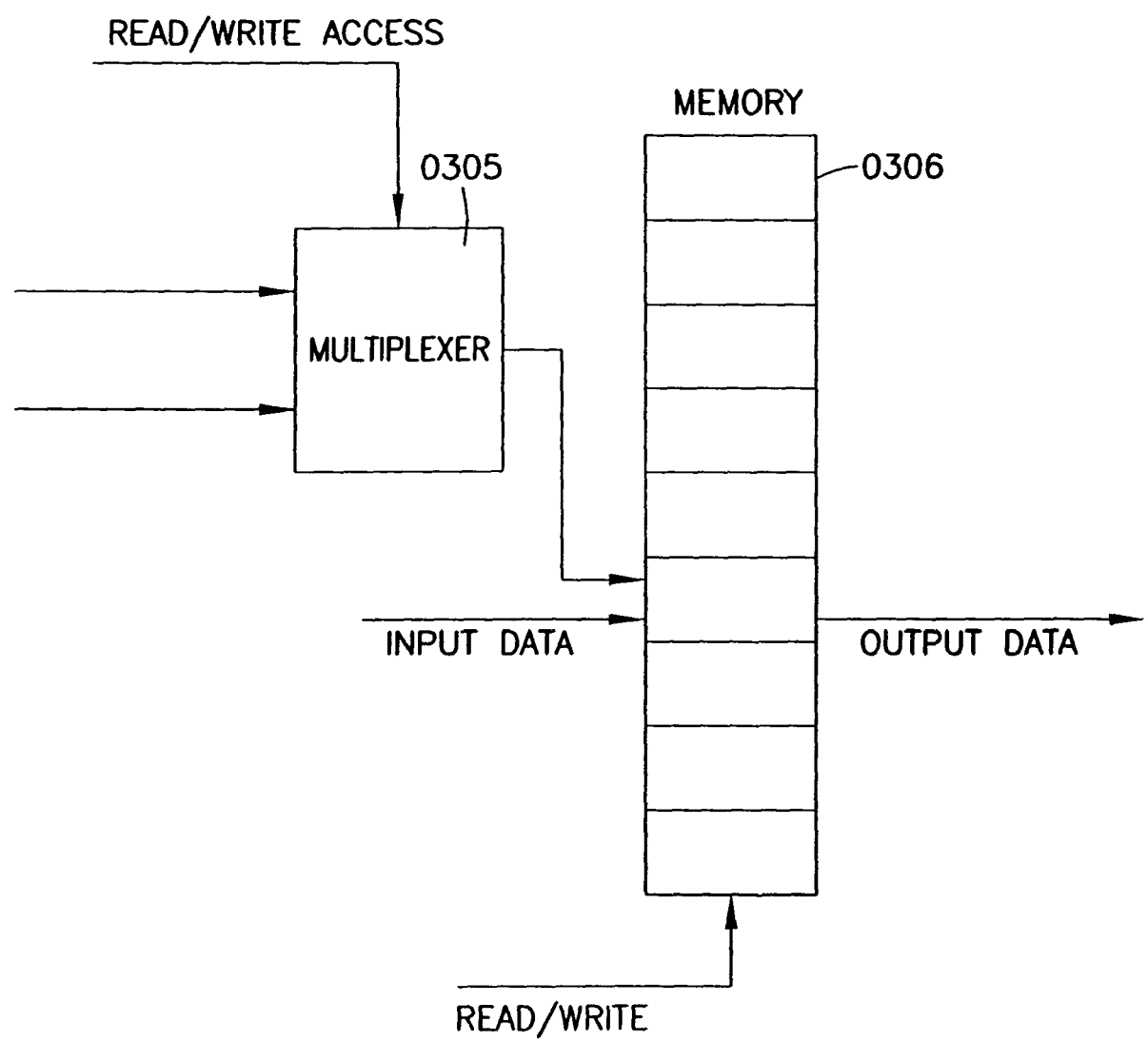

FIG. 3 shows an extension of the normal ring memory. In this extension, counter 0303 of the write position pointer 0311 and counter 0309 of the read position pointer 0312 can be loaded with a value, so that each address of the memory can be set directly. This loading sequence takes place, as usual, through the data and load inputs of the counters. In addition, the work area of the ring memory can be limited to a certain section of internal memory 0306. This is accomplished using an internal logic controlled by counters 0303, 0309 of the write/read position pointers 0311, 0312. This logic is designed as follows: The output of one counter 0303, 0309 is connected to the input of the respective comparator 0302, 0308, where the value of the counter is compared with the value of the respective data register (0301, 0307) where the jump position, i.e., the end of the ring memory section, is stored. If the two values are the same, the comparator (0302, 0308) sends a signal to the counter (0303, 0309), which then loads the value from the data register for the target address of the jump (0304, 0310), i.e., the beginning of the ring memory section. The data register for the jump position (0301, 0307) and the data register for the target address (0304, 0310) are loaded by the PLU (see PACT01). With this extension, it is possible that the ring memory does not use the entire region of the internal memory, but only a selected portion. In addition, the memory can be subdivided into different sections when several such read/write position pointers (0312, 0311) are used.

Figure 4A:
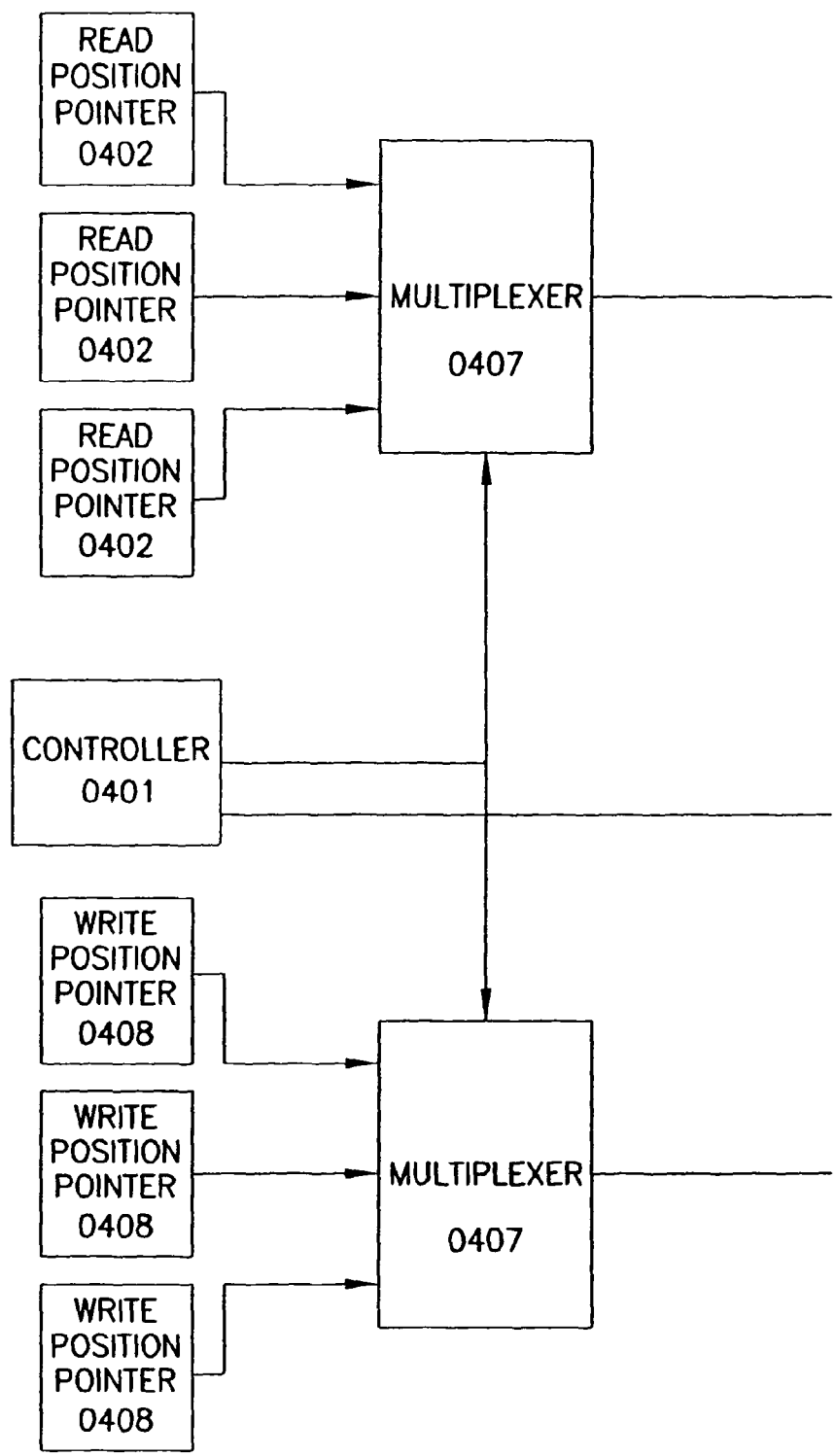
FIG. 4 illustrates a ring memory and a controller capable of working on different ring memory sections using several read and write position pointers.
Figure 4B:
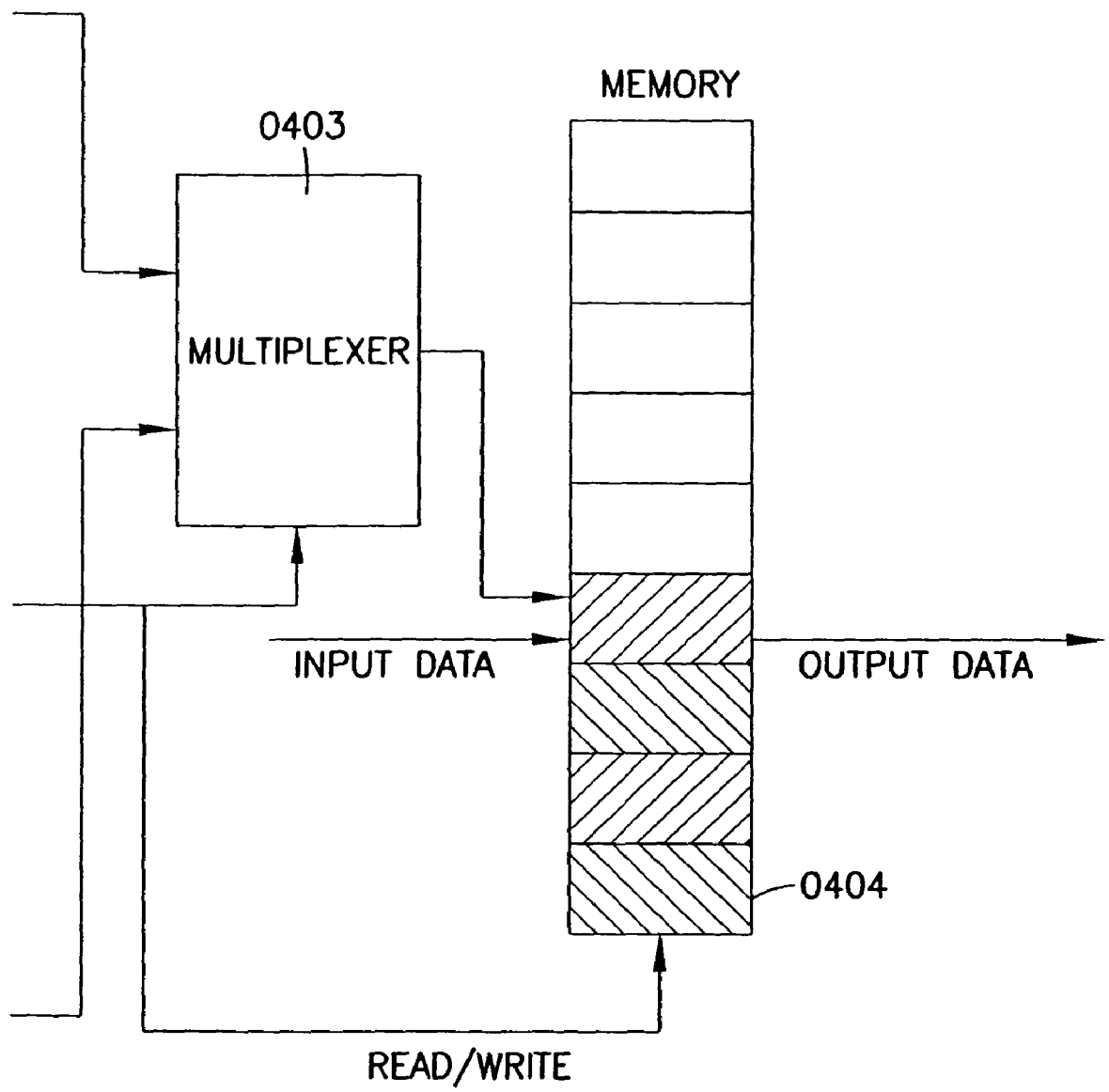

FIG. 4 shows the architecture of a ring memory divided into several sections with controller 0401 working on one of said sections. The controller is described in more detail in FIG. 7. In order to allow the ring memory to be divided into several sections, several read/write position pointers (0408, 0402), whose architecture was shown in FIG. 3, are used. The controller selects the region where it operates through multiplexer 0407. Read or write access is selected via multiplexer 0403. Thus the selected read/write position pointer addresses an address of memory 0404.

Figure 5A:
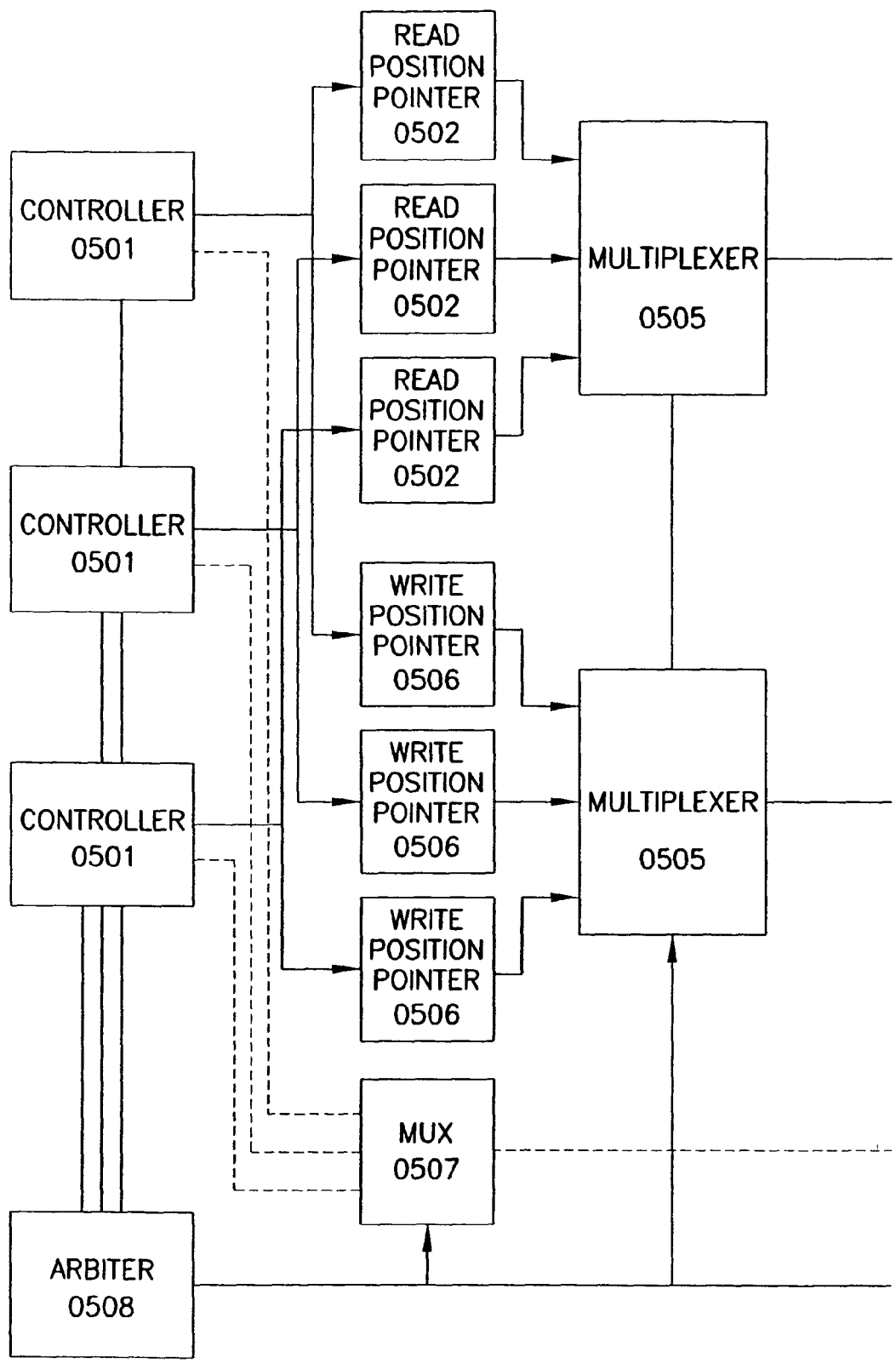
FIG. 5 illustrates a ring memory where different controllers access different sections.
Figure 5B:
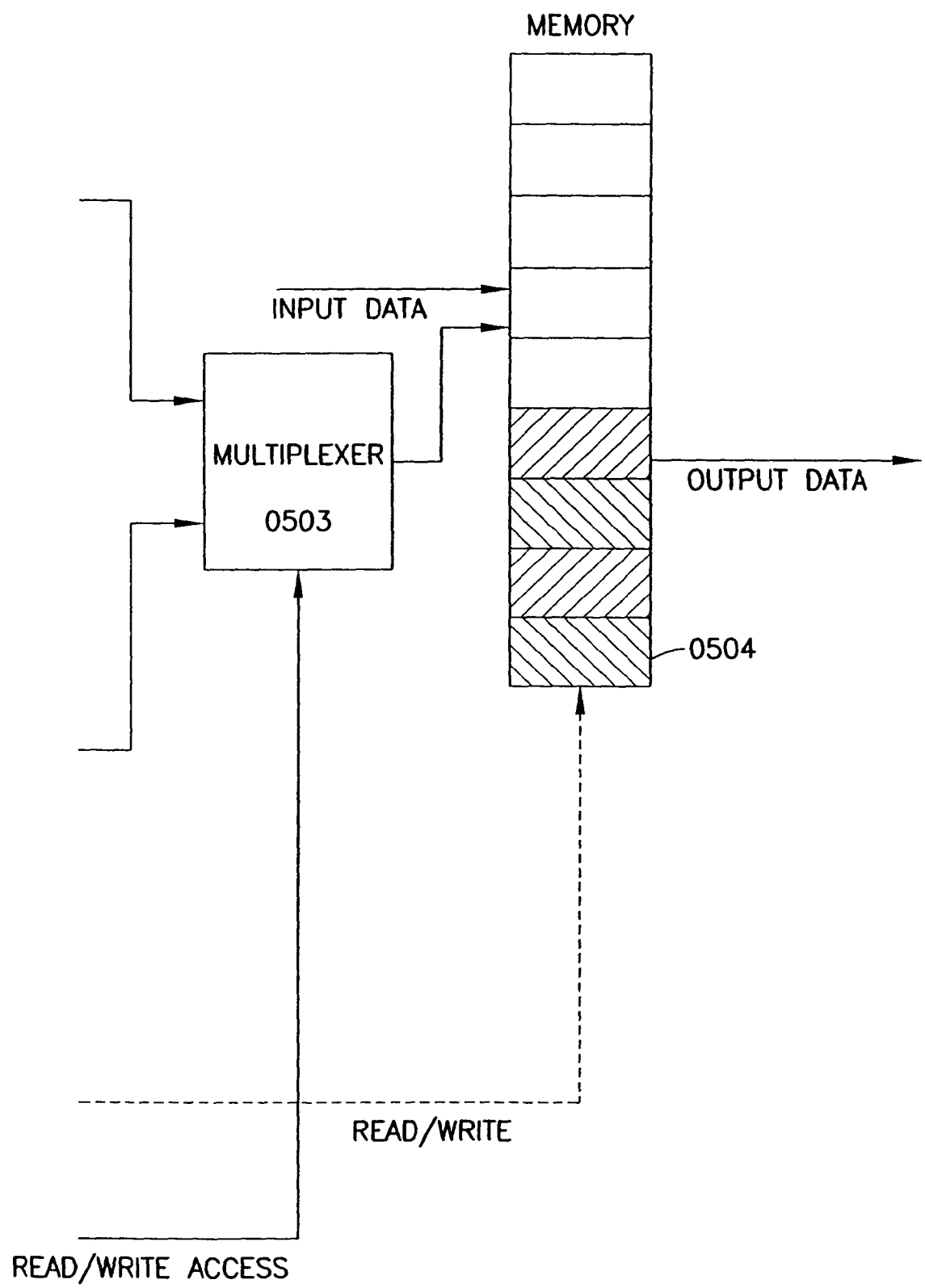

FIG. 5 shows the case where each of a plurality of controllers 0501 operates in its own region of the ring memory via one read- and write-position pointer 0502, 0506 per controller. Each controller 0501 has a write position pointer 0506 and a read position pointer 0502. Using multiplexer 0503, which of the read and write position pointers 0502, 0506 accesses memory 0504 is selected. Either a read access or a write access is selected via multiplexer 0503. The read/write signal of controllers 0501 is sent to memory 0504 via multiplexer 0507. The control signal of multiplexers 0507, 0505, 0503 goes from controllers 0501 via an arbiter 0508 to the multiplexers. Arbiter 0508 prevents several controllers from accessing multiplexers 0507, 0505, 0503 simultaneously.

Figure 6:
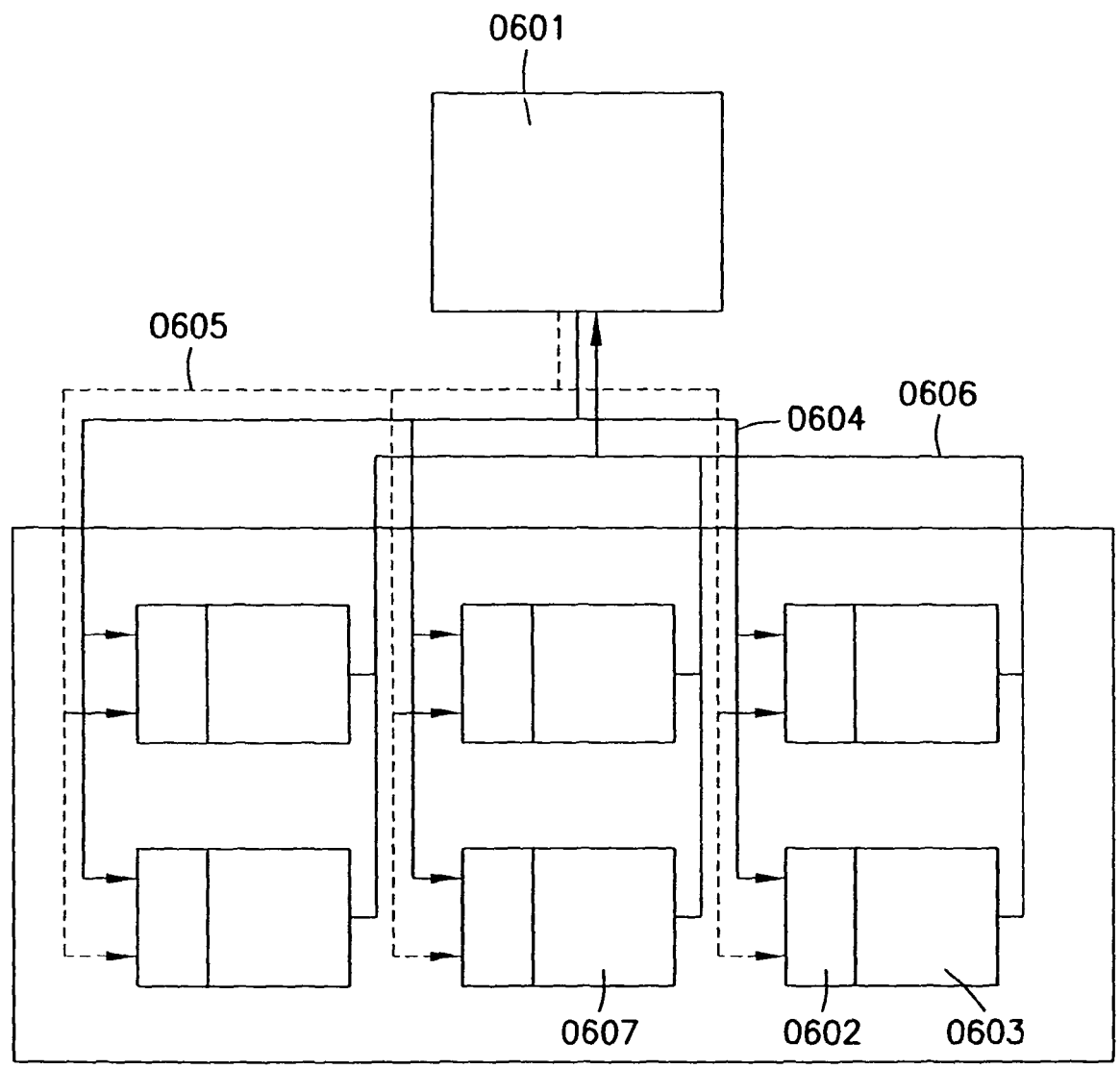
FIG. 6 illustrates a ring memory and its connection to the configurable elements.

FIG. 6 shows a ring memory 0601 and its connection with configuration elements 0602. Ring memory 0601 is connected via lines 0604, 0605, 0606. The addresses of the addressed cells 0607 are transmitted via 0604. Line 0605 transmits the configuration data from the ring memory. Via line 0606, cells 0607 transmit the feedback whether reconfiguration is possible. The data stored in the ring memory is entered in configuration element 0602. This configuration element 0602 determines the configuration of configurable elements 0603. Configurable elements 0603 may comprise logical units, ALUs, for example.

Figure 7:
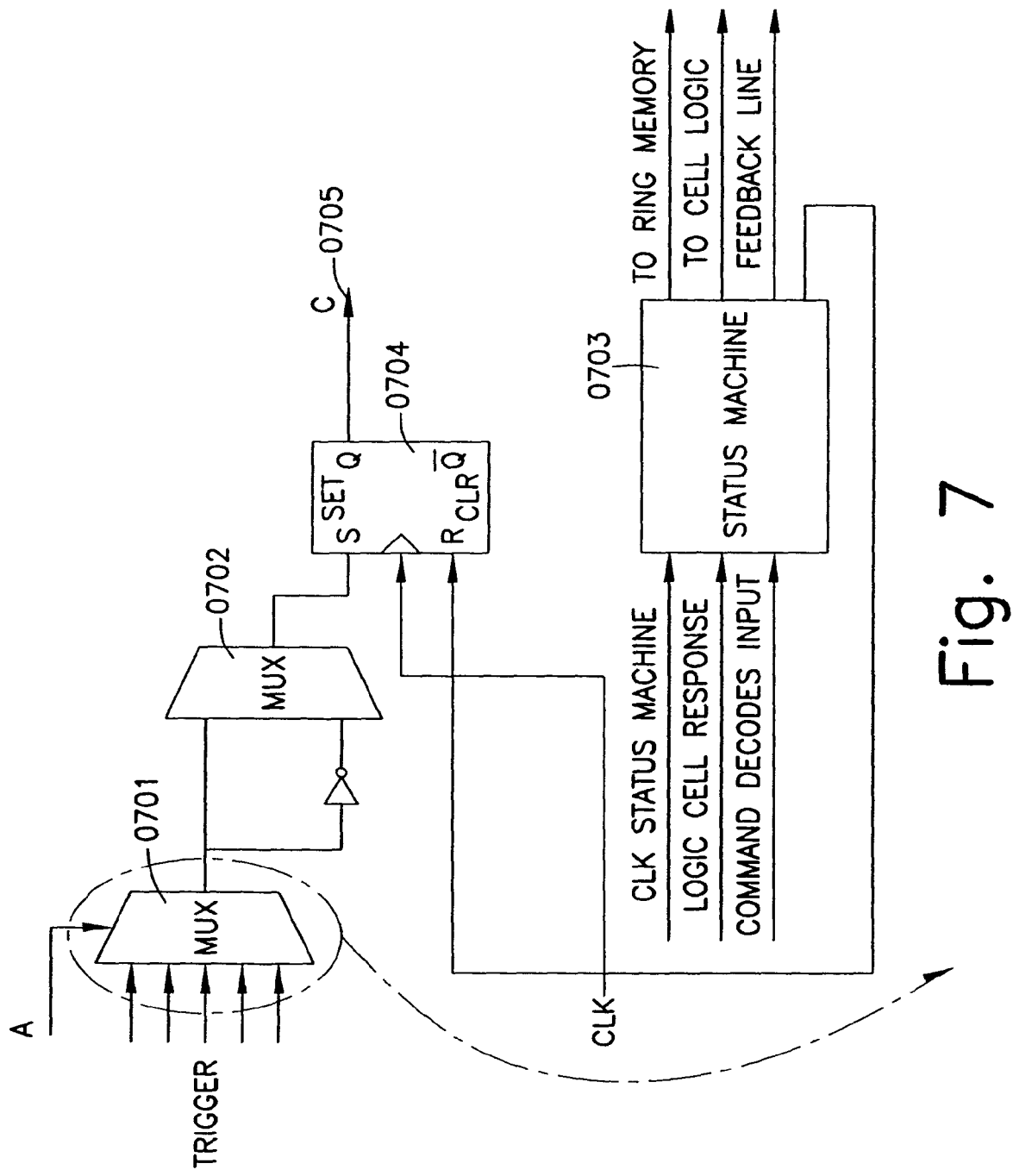
FIG. 7 illustrates the controller with a logic for responding to different trigger signals; a) implementation of the trigger pulse mask.

FIG. 7 shows a controller that may respond to different triggering events. The individual triggering events can be masked, so that only one triggering event is accepted at any time. This is achieved using multiplexer 0701. The trigger signal is stored with flip-flop 0704. Multiplexer 0702, which can be configured as a mask via AND gates (see FIG. 7a), is used to process low active and high active triggering signals. The triggering signal stored in the flip-flop is relayed via line 0705 to obtain a clock signal, which is described in FIG. 8. The state machine 0703 receives its clock signal from the logic that generates the clock signal and, depending on its input signals, delivers an output signal and a reset signal to reset flip-flop 0704 and stop processing until the next trigger signal. The advantage of this implementation is the power savings when the clock is turned off, since state machine 0703 is then idle. An implementation where the clock is permanently applied and the state machine is controlled by the status of the command decoder and the run bit is also conceivable.

Figure 7A:
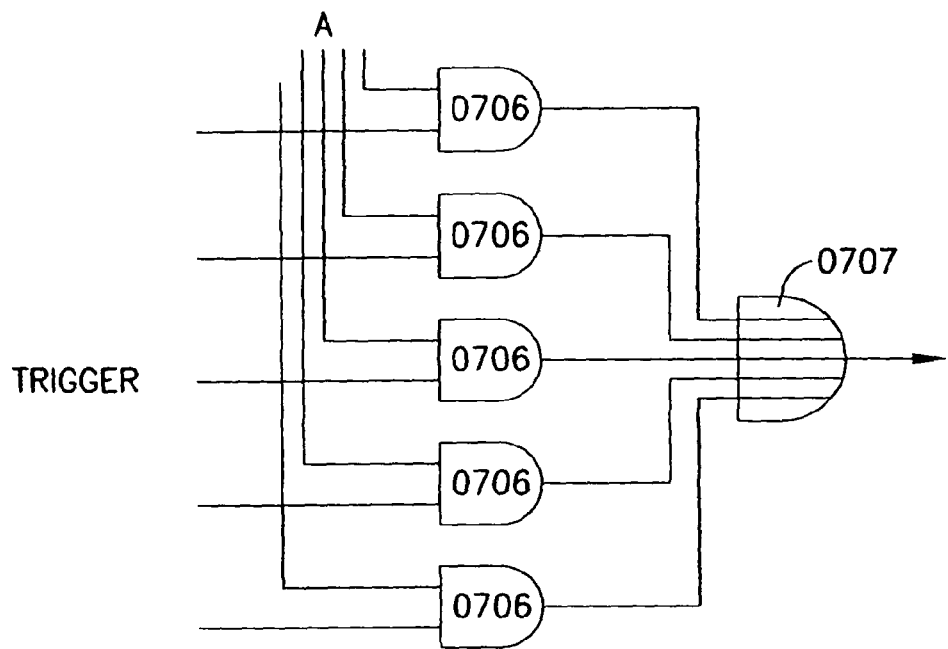

FIG. 7a shows the masking of the trigger signals. The trigger signals and lines from A are connected to the inputs of AND gate 0706. The outputs of AND gate 0706 are OR-linked with 0707 to generate the output signal.

Figure 8:
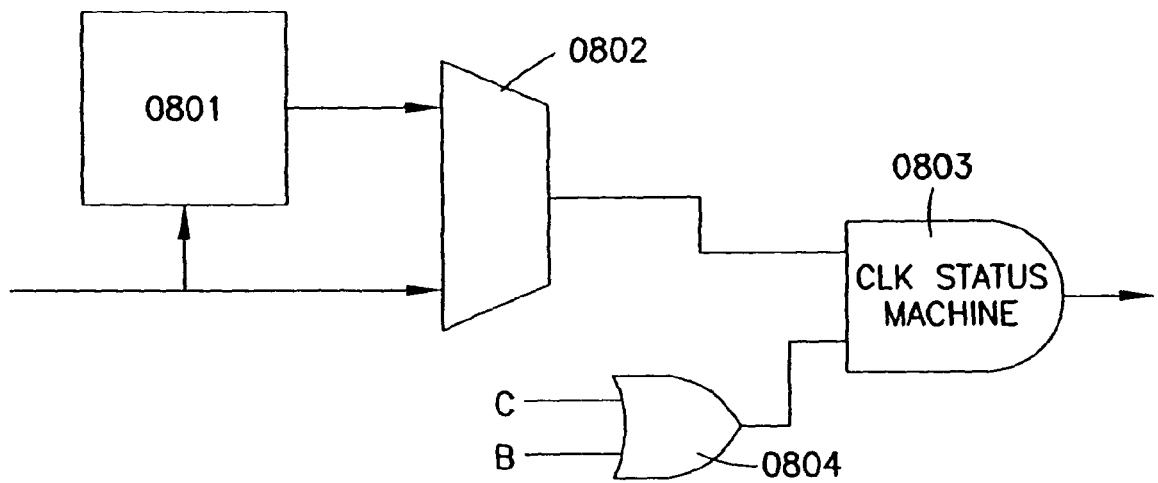
FIG. 8 illustrates the clock generator for the controller.

FIG. 8 shows the logic for generating the clock signal for the state machine. Another clock signal is generated in 0801 with the help of a PLL. Using multiplexer 0802, the normal chip clock or the clock of PLL 0801 can be selected. Signals C and B are sent to OR gate 0804. Signal C is generated as a result of a trigger event in the controller (see FIG. 7, 0705). Signal B originates from bit 1 of the command string (see FIG. 10, 1012). This bit has the function of a run flag, so that the controller continues to operate, independently of a trigger pulse, if the run flag is set. The output of OR gate 0804 is AND-linked with the output of multiplexer 0802 to generate the clock signal for the state machine.

Figure 9:
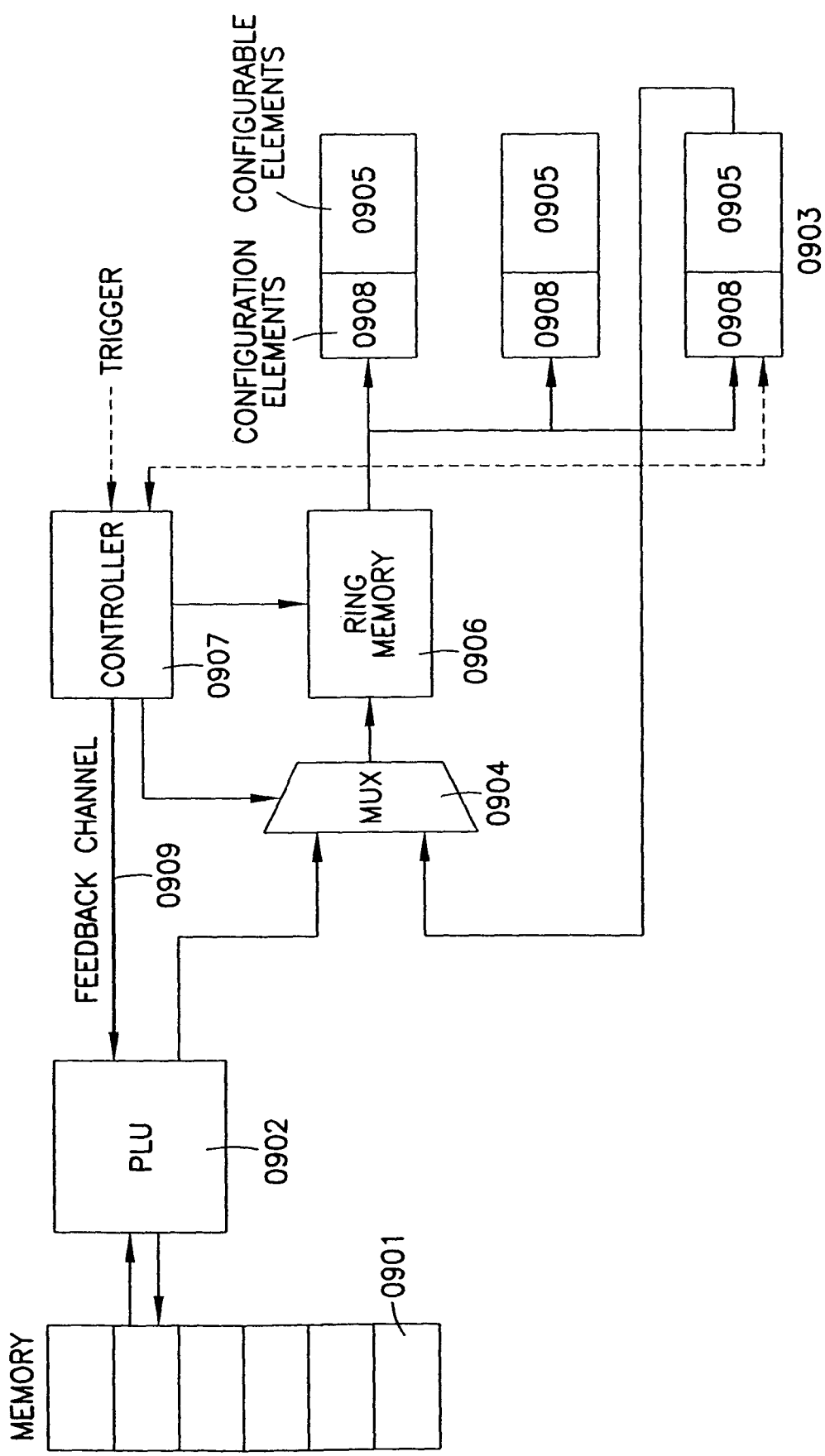
FIG. 9 illustrates the wiring of the controller and the internal cells allowing the configurable elements to be configured.

FIG. 9 shows the connection between controller 0907, PLU 0902 with memory 0901, ring memory 0906, configurable elements 0905, and configuration elements 0908, as well as the internal cells 0903 used for the configuration. The internal cell 0903 used for configuration is shown here as a normal cell with configurable elements 0905 and configuration elements 0908. Ring memory 0906 is connected to configuration elements 0908 and is in turn controlled by controller 0907. Controller 0907 responds to different trigger pulses, which may also originate from the internal cell 0903 used for configuration. Controller 0907 informs PLU 0902, via feedback channel 0909, if new data is to be loaded into ring memory 0906 due to a trigger event. In addition to sending this feedback, controller 0907 also sends a signal to multiplexer 0904 and selects whether data is sent from PLU 0902 or internal cell 0903 used for configuration to the ring memory.

In addition to the configuration of the ring memory by the PLU, the ring memory can also be set as follows: Configurable element 0903 is wired so that it generates, alone or as the last element of a group of elements, records for ring memory 0906. It generates a trigger pulse, which advances the write position pointer in the ring memory. In this mode, multiplexer 0904 switches the data from 0903 through to the ring memory, while with a configuration by the PLU the data are switched through by the PLU. It would, of course, be conceivable that additional permanently implemented functional units might serve as sources of the configuration signals.

Figure 10:
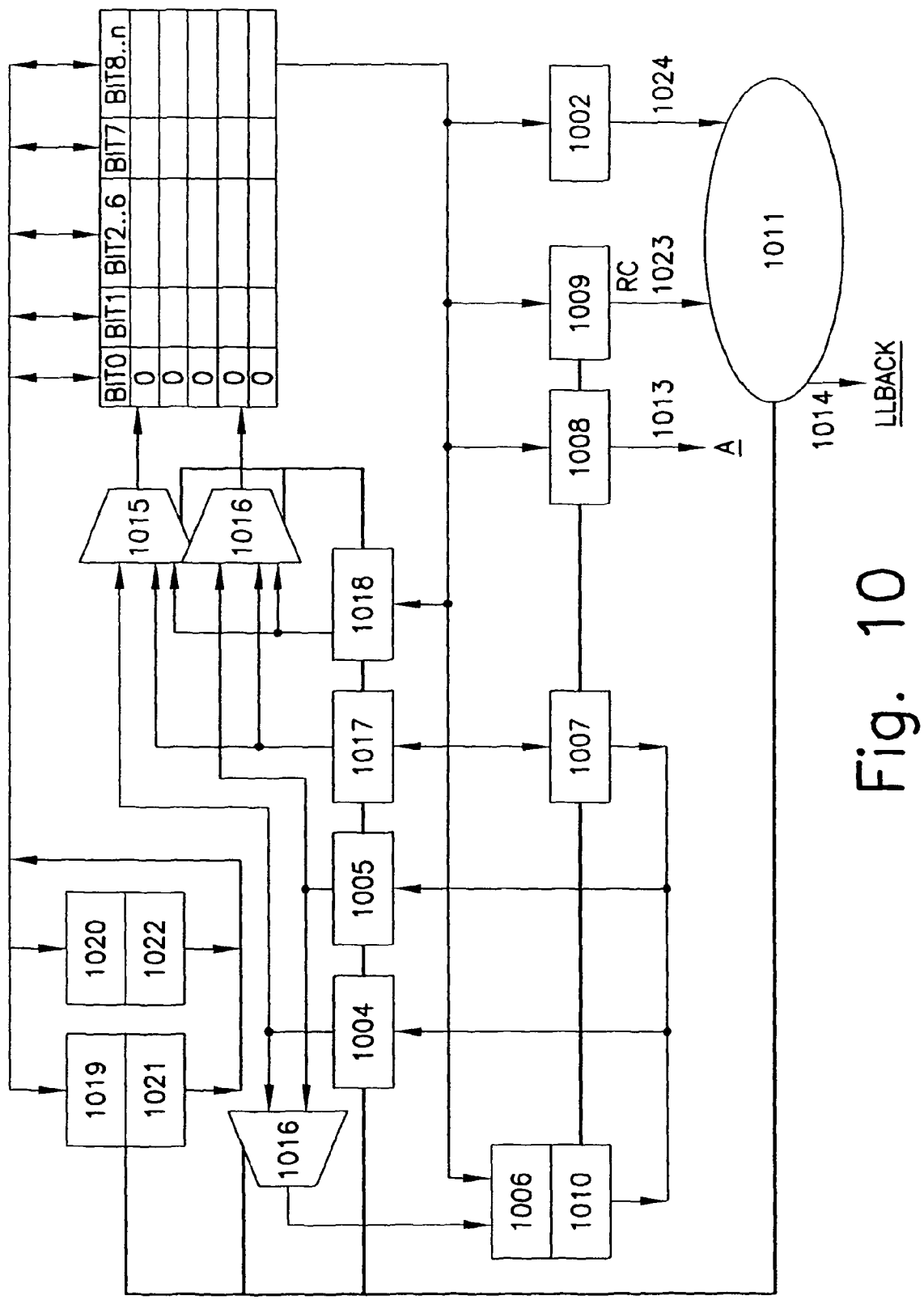
FIG. 10 illustrates the processing by the controller of the commands stored in the ring memory.

FIG. 10 shows the processing by the controller of the commands stored in the ring memories. 1001 represents the memory of the ring memory with the following bit assignment. Bit 0 identifies the record as a data or command string. Bit 1 identifies the run and stop modes. Bits 2-6 identify the command number coding the commands. Bit 7 tells whether the command is to be applied to the read or write position pointer. If the command affects no position pointer, bit 7 is undefined. The data needed for a command is stored in bits 8-n. Counters 1004, 1005 form the write and read position pointers of the ring memory. If the controller receives a trigger pulse, the state machine sends a pulse to the read position pointer. The write position pointer is not needed to read a command, but is only used for entering data in the ring memory. The selected read position pointer moves forward one position, and a new command is selected (bit 0=0). Now bits 2-6 and bit 7 are sent to command decoder 1002, are decoded, and the result is relayed to the state machine (1024), which recognizes the type of command and switches accordingly.

If it is a SKIP command, state machine 1011 sends a pulse to adder/subtractor 1006 so it can add/subtract the bit 8-n command string data to/from the data sent by counters 1004, 1005 via multiplexer 1003. Depending on bit 7, multiplexer 1003 selects the counter of write position pointer 1004 or the counter of read position pointer 1005. After the data has been added/subtracted, state machine 1011 activates gate 1010 and sends a receive signal to counter 1004, 1005. Thus the selected position pointer points as many positions forward or backward as set forth in the data of the SKIP command.

Upon a GOTO command, gate 1007 is activated by state machine 1011 so that the data goes to read position pointer 1005 or write position pointer 1004 and is received there.

Upon a MASK command, the data is received in a latch 1008 and stored there. This data is then available to the controller described in FIGS. 7/7a via line A (1013) where it masks all the trigger inputs which should receive no trigger pulse.

Upon a WAIT command, an event is waited for as often as set forth in the data bits. If this command is registered by state machine 1011, it sends a pulse to wait cycle counter 1009 which receives the data. The wait cycle counter then counts one position downward for each event relayed by state machine 1011. As soon as it has counted to zero, the carry flag is set and sent to state machine 1011 (1023). The state machine then continues to operate due to the carry flag.

Upon a WAIT-GOTO command, the data providing the number of wait events is received in the wait cycle counters. After receipt of the number of events given in the data, the state machine activates gate 1007 and relays the jump position data to the selected counter.

The SWAP command is used for swapping two records between two positions of the ring memory. The address of the first record to be swapped is stored in latch 1017; the address of the second record is stored in latch 1018. The addresses are sent to multiplexers 1015 and 1016 of the read/write pointer. Initially, record 1 is selected via 1016 and stored in latch 1019; then record 2 is selected via 1016 and stored in 1020. The write pointer is first positioned on the first record via 1015, and the data formerly of the second record is stored via gate 1022. Then the write pointer is positioned on the second record via 1015 and the data formerly of the first record is stored via gate 1021.

State machine 1011 sends feedback to the PLU via 1014 (e.g., via a State-Back UNIT, see PACT02). The state machine sends a signal via this connection as soon as an LLBack command is registered.

Bit 1, used as a run flag, is sent to the controller for generating a clock signal, which is described in FIG. 8.

The NOP command is registered in the state machine, but no operation is performed.

Figure 11:
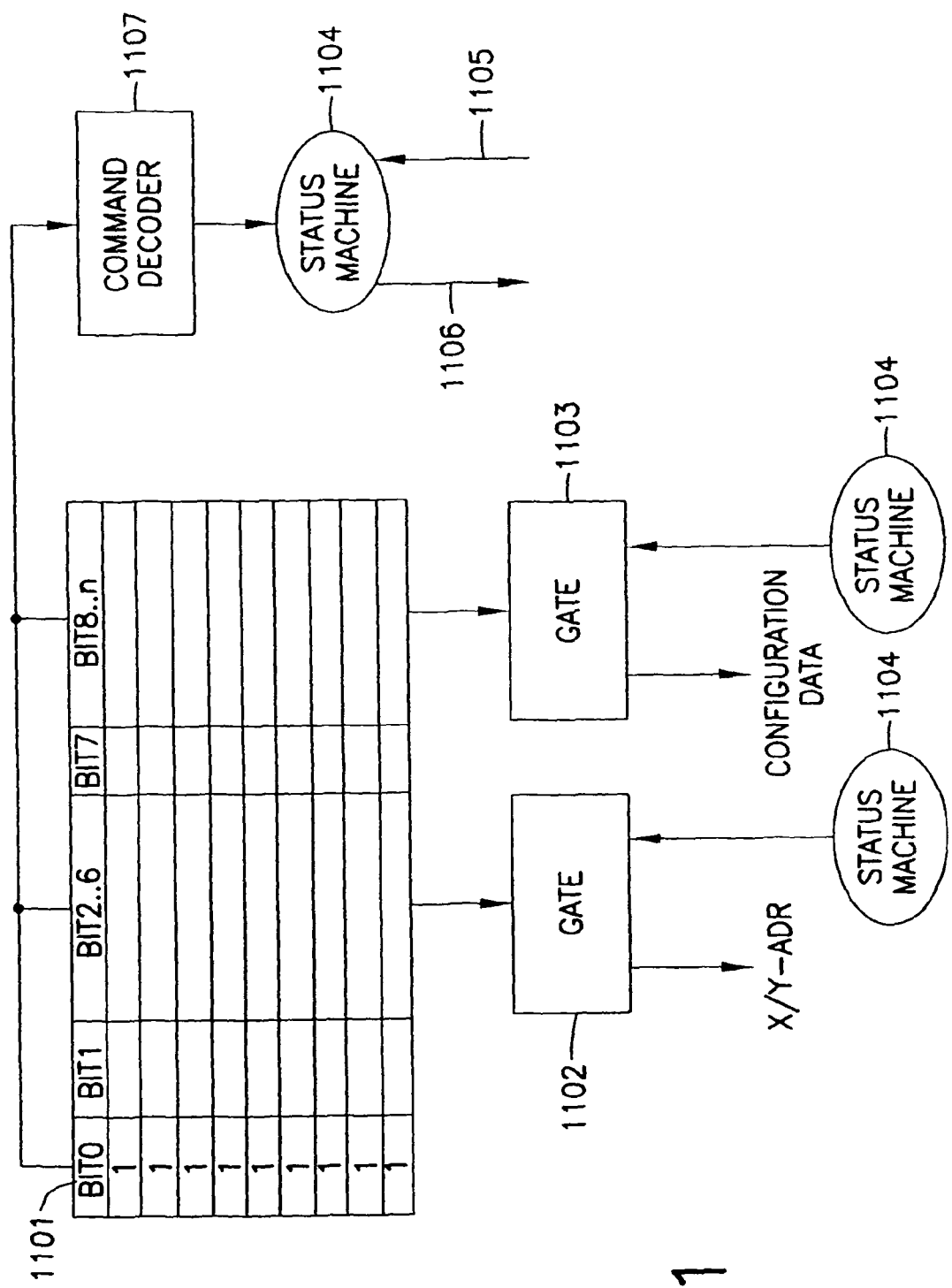
FIG. 11 illustrates the processing of the data stored in the ring memory.

FIG. 11 shows the processing of a data string stored in the ring memory. 1101 corresponds to 1001 in FIG. 10. Since this is a data string, bit 0 is set to one. Command decoder 1107 recognizes the data string as such and sends a query 1106 to the cell addressed in bits 2-6 to verify if reconfiguration is possible. The query is sent at the same time gate 1102 is activated, which causes the address of the cell to be transmitted. The cell shows via 1105 whether reconfiguration is possible. If so, the configuration data is transmitted to the cell via gate 1103. If no reconfiguration is possible, processing continues, and reconfiguration is attempted again in the next cycle in the ring memory. Another possible sequence would be the following: The state machine activates gates 1102 and 1103 and transmits the data to the cell addressed. If the cell can be reconfigured, the cell acknowledges receipt of the data via 1105. If no configuration is possible, the cell does not send a receive signal, and reconfiguration is attempted again in the next cycle of the ring memory.

Figure 12:
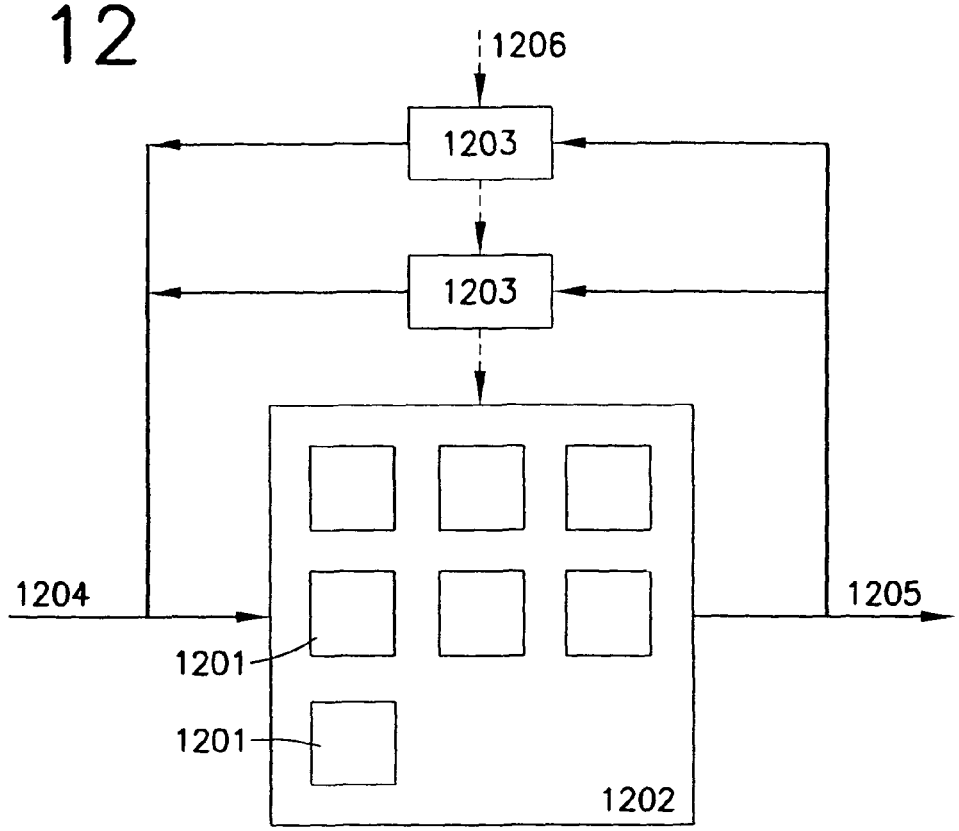
FIG. 12 illustrates the connection of a buffer comprising two memory arrays to a set of configurable elements.

FIG. 12 shows a group (functional element) 1202 of configurable elements 1201. The data is sent to the functional element via input bus 1204, and the results are sent forth via output bus 1205. Output bus 1205 is also connected to two memory arrays 1203, which operate alternately as a read or write memory. Their outputs are connected to input bus 1204. The entire circuit can be configured via a bus leading to switching tables 1206; the trigger signals are transmitted to the switching table and the configuration data is transmitted from the switching table via this bus. In addition to the function of the functional element, the write/read memory active at that time and the depth of the respective memory are set.

Figure 12A:
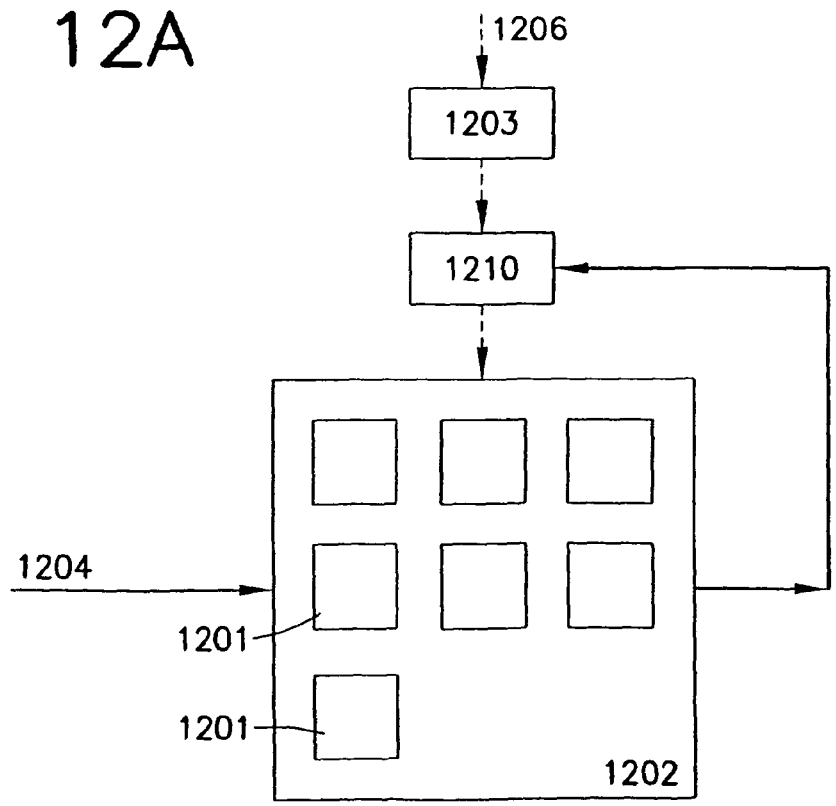
FIG. 12a shows a step in the data processing sequence.

FIG. 12a shows how external data 1204, i.e., data of another functional unit or from outside the unit, is computed in the functional element 1202 and then written into write memory 1210.

Figure 12B:
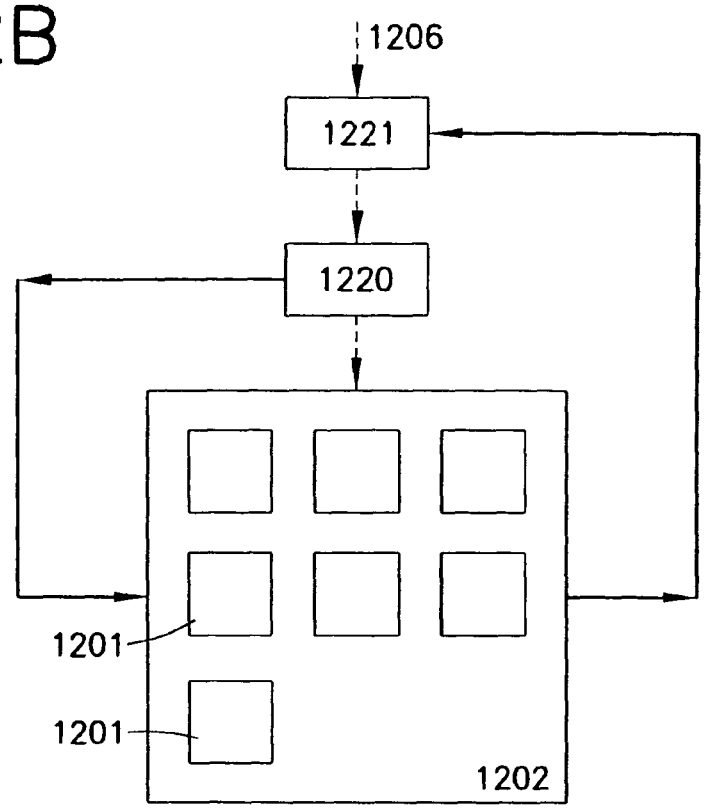
FIG. 12b shown another step in the data processing sequence.

FIG. 12b shows the next step after FIG. 12a. Functional element 1202 and memories 1220, 1221 are reconfigured upon a trigger generated by the functional element or the memories or another unit and transmitted over 1206. Write memory 1210 is now configured as a read memory 1220 and delivers the data for the functional element. The results are stored in write memory 1221.

Figure 12C:
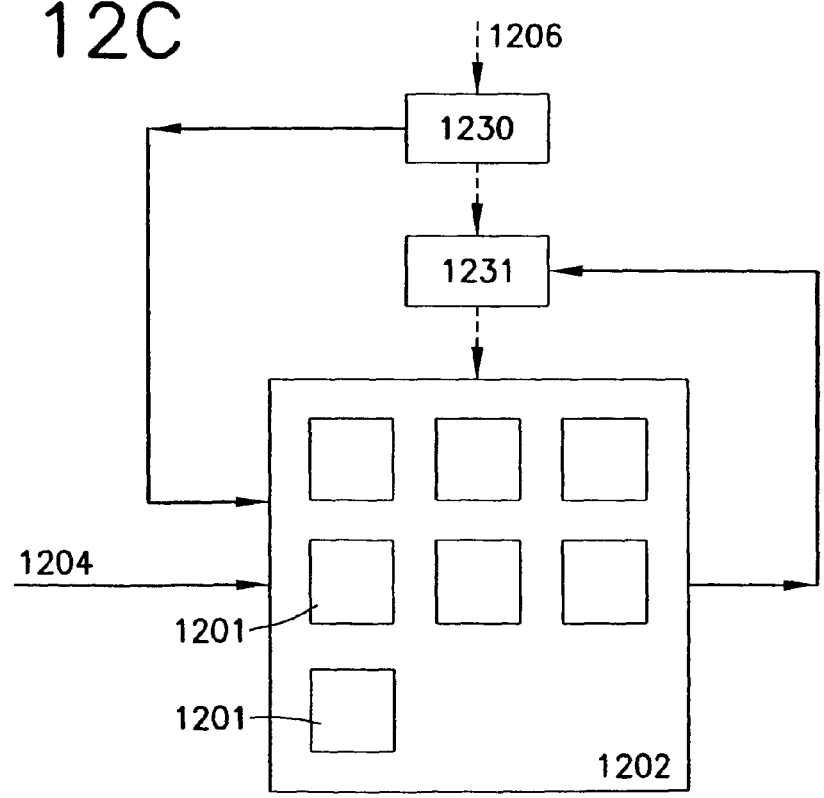
FIG. 12c shown another step in the data processing sequence.

FIG. 12c shows the step following FIG. 12b. Functional element 1202 and memories 1230, 1231 were reconfigured upon a trigger generated by the functional element or the memories or another unit and transmitted over 1206. Write memory 1221 is now configured as a read memory 1230 and delivers the data to the functional element. The results are stored in write memory 1231. In this example, additional external operands 1204, i.e., from another functional unit or from outside the unit, are also processed.

Figure 12D:
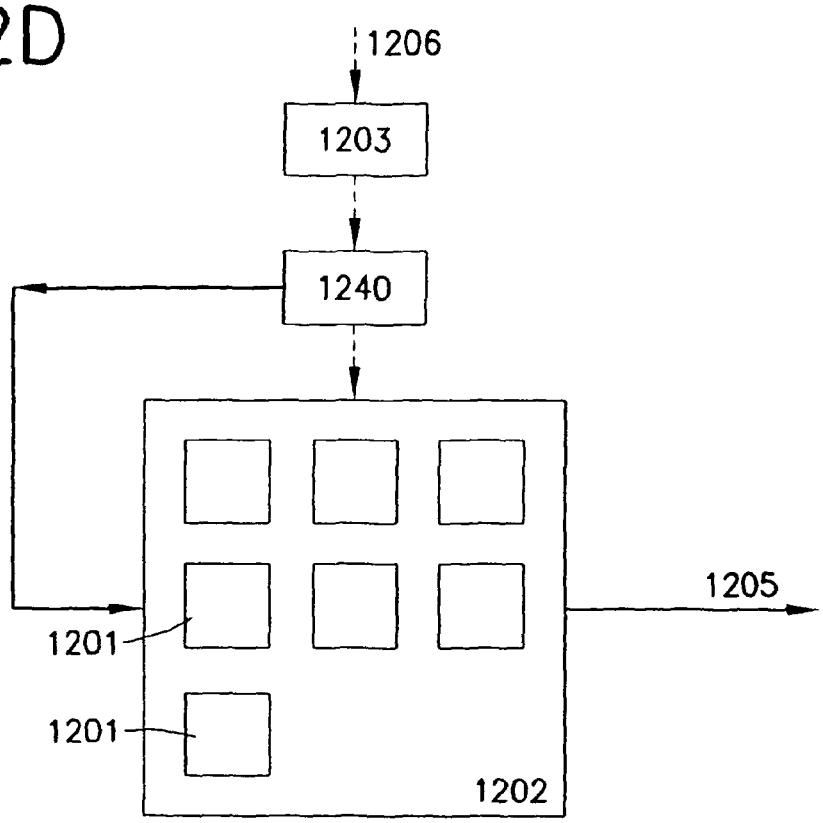
FIG. 12d shown another step in the data processing sequence.

FIG. 12d shows the next step after FIG. 12c. Functional element 1202 and memories 1203, 1240 were reconfigured upon a trigger generated by the functional element or the memories or another unit and transmitted over 1206. Write memory 1231 is now configured as a read memory 1240 and delivers the data to the functional element. The results are forwarded via output bus 1205.

Figure 13:
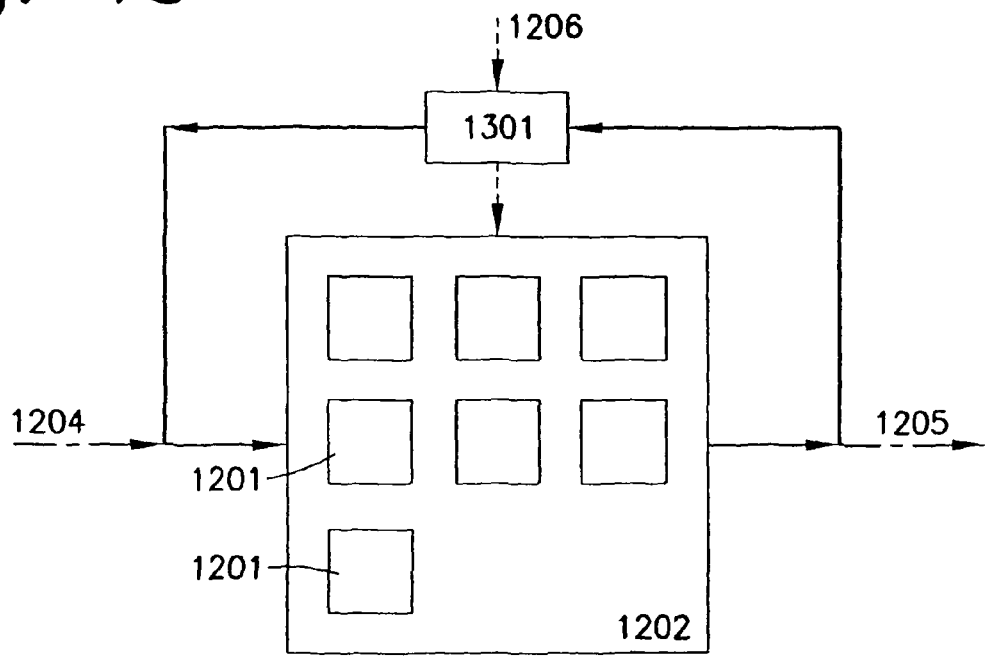
FIG. 13 illustrates the connection of a buffer with separate read/write pointers to a set of configurable elements.

FIG. 13 shows a circuit according to FIG. 12, where a memory with separate read and write pointers 1301 is used instead of the two memory arrays.

Figure 14:
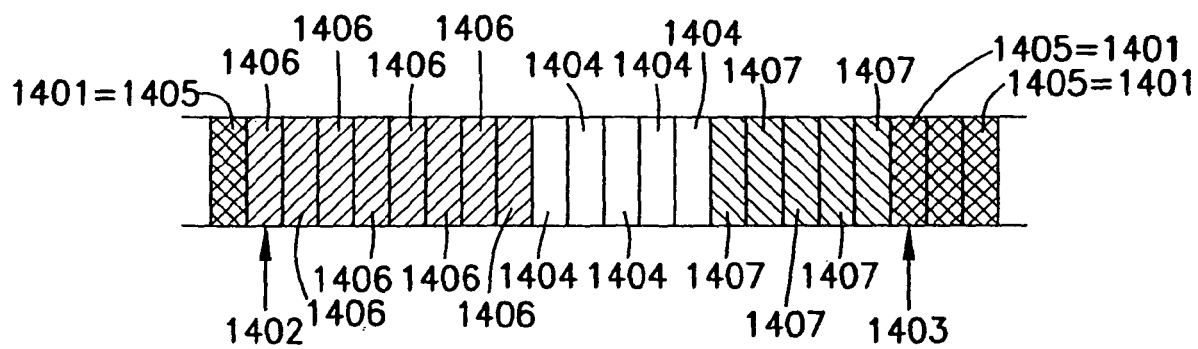
FIG. 14 illustrates the operation of a buffer with separate read/write pointers.

FIG. 14 shows memory 1401 according to FIG. 13. The record in front of read pointer 1402 has already been read or is free 1405. The pointer points to a free record. Data 1406 still to be read are located behind the read position pointer. A free area 1404 and data already re-written 1407 follow. Write position pointer 1403 points at a free record, which is either empty or already has been read. The memory can be configured as a ring memory, as described previously.

Figure 15:
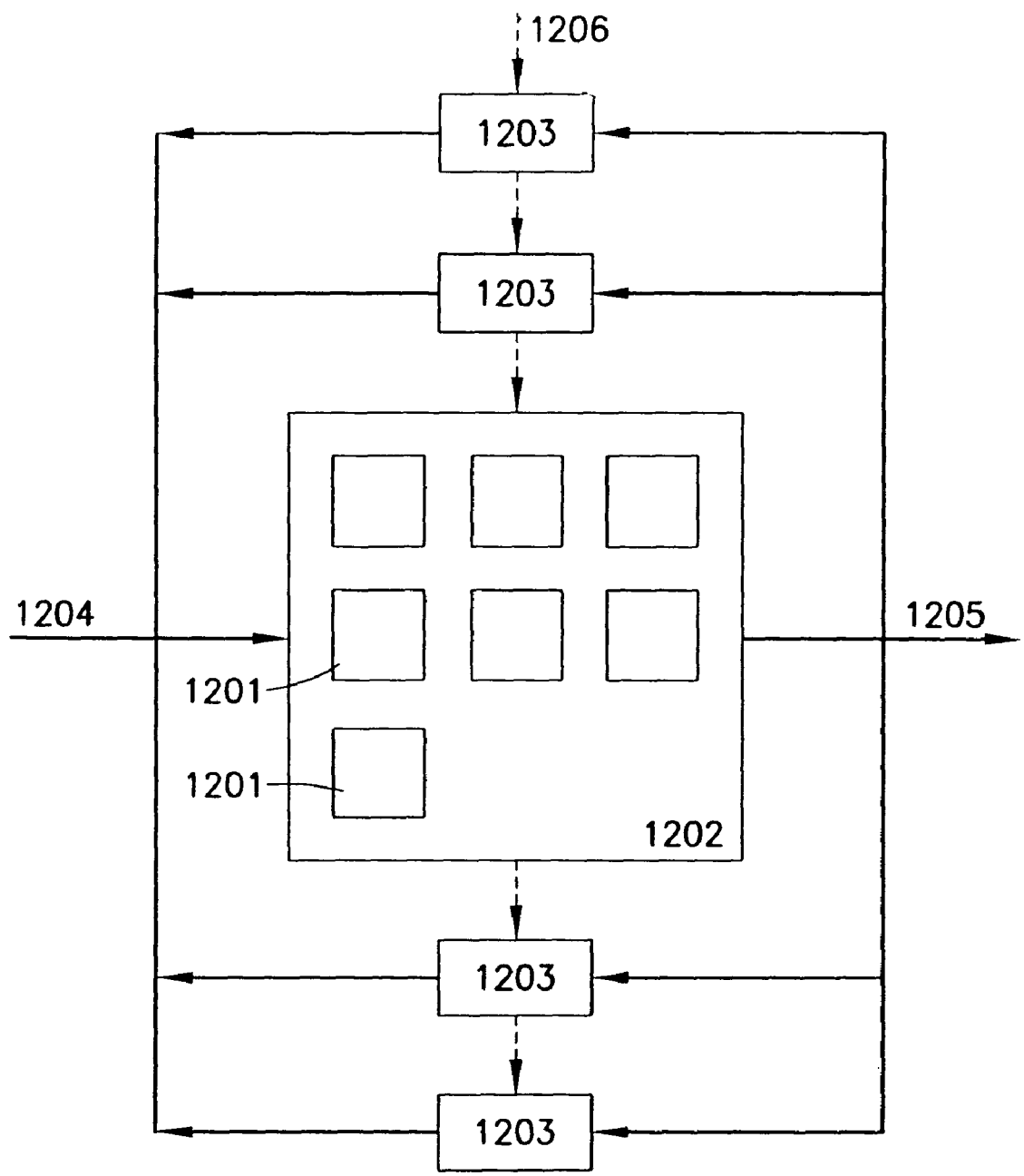
FIG. 15 illustrates the connection of two buffers each comprising two memory arrays to a set of configurable elements; Figures a-c show the data processing sequence.

FIG. 15 shows a circuit according to FIG. 12, where both memory banks 1203 are present in duplicate. This makes it possible to store and then simultaneously process a plurality of results.

Figure 15A:
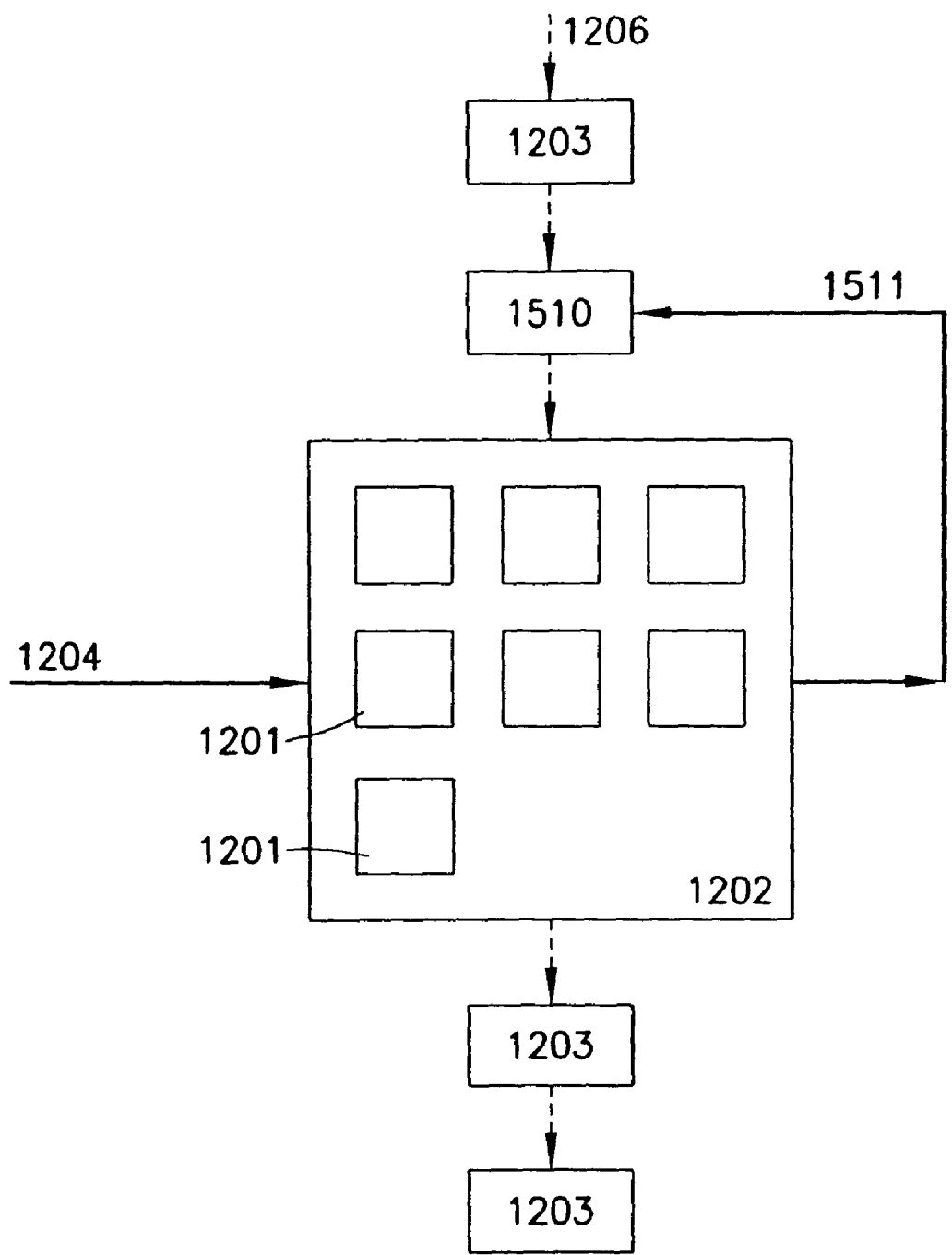

FIG. 15a shows how external data 1204, i.e., from another functional unit or from outside the unit, is computed in functional element 1202 and then written in write memory 1510 via bus 1511.

Figure 15B:
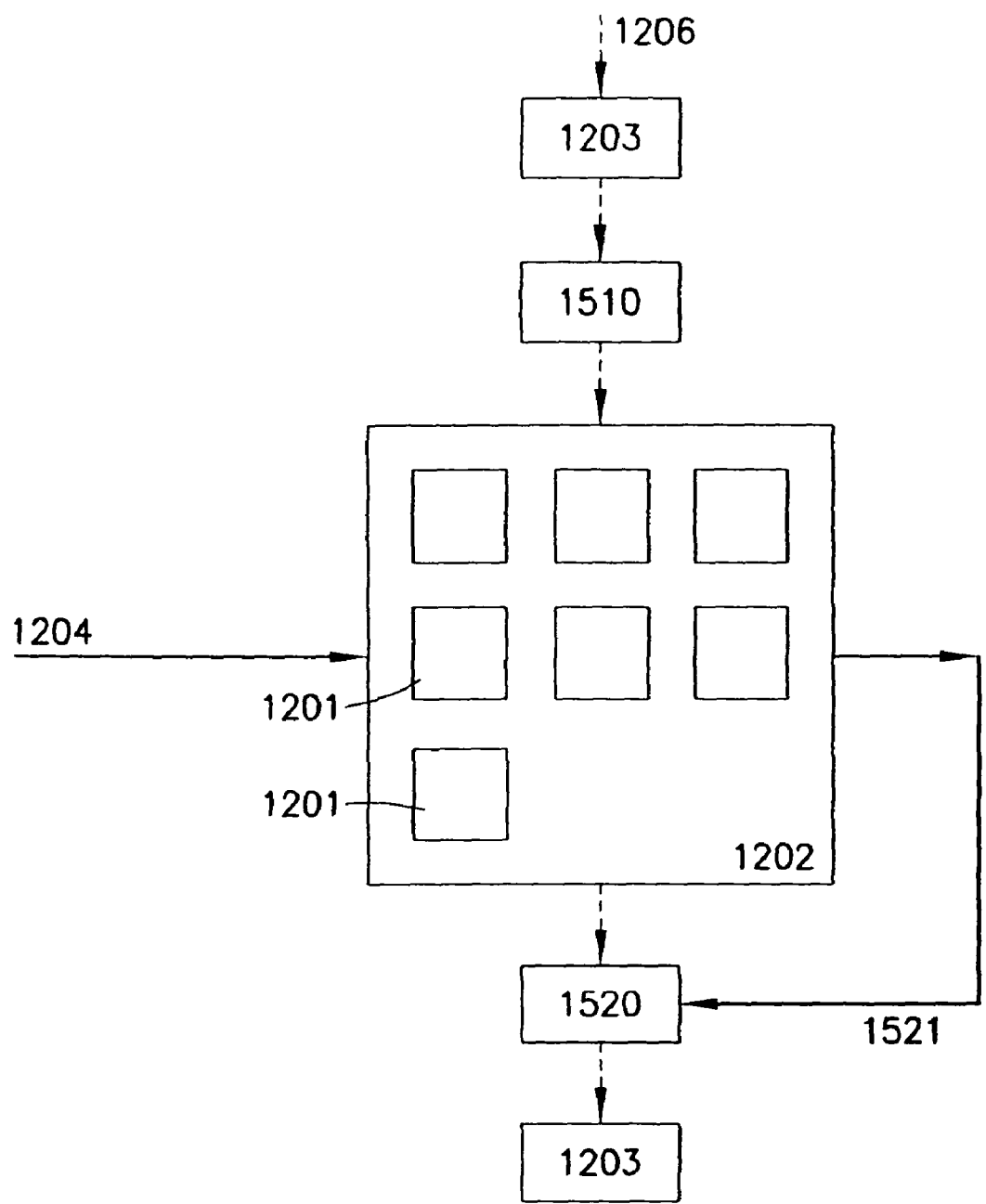

FIG. 15b shows the next step after FIG. 15a. Functional element 1202 and memories 1203, 1510, 1520 have been reconfigured following a trigger generated by the functional element or the memories or another unit and transmitted over 1206. External data 1204, i.e., from another functional unit or from outside the unit, is computed in functional element 1202 and then written in write memory 1520 via bus 1521.

Figure 15C:
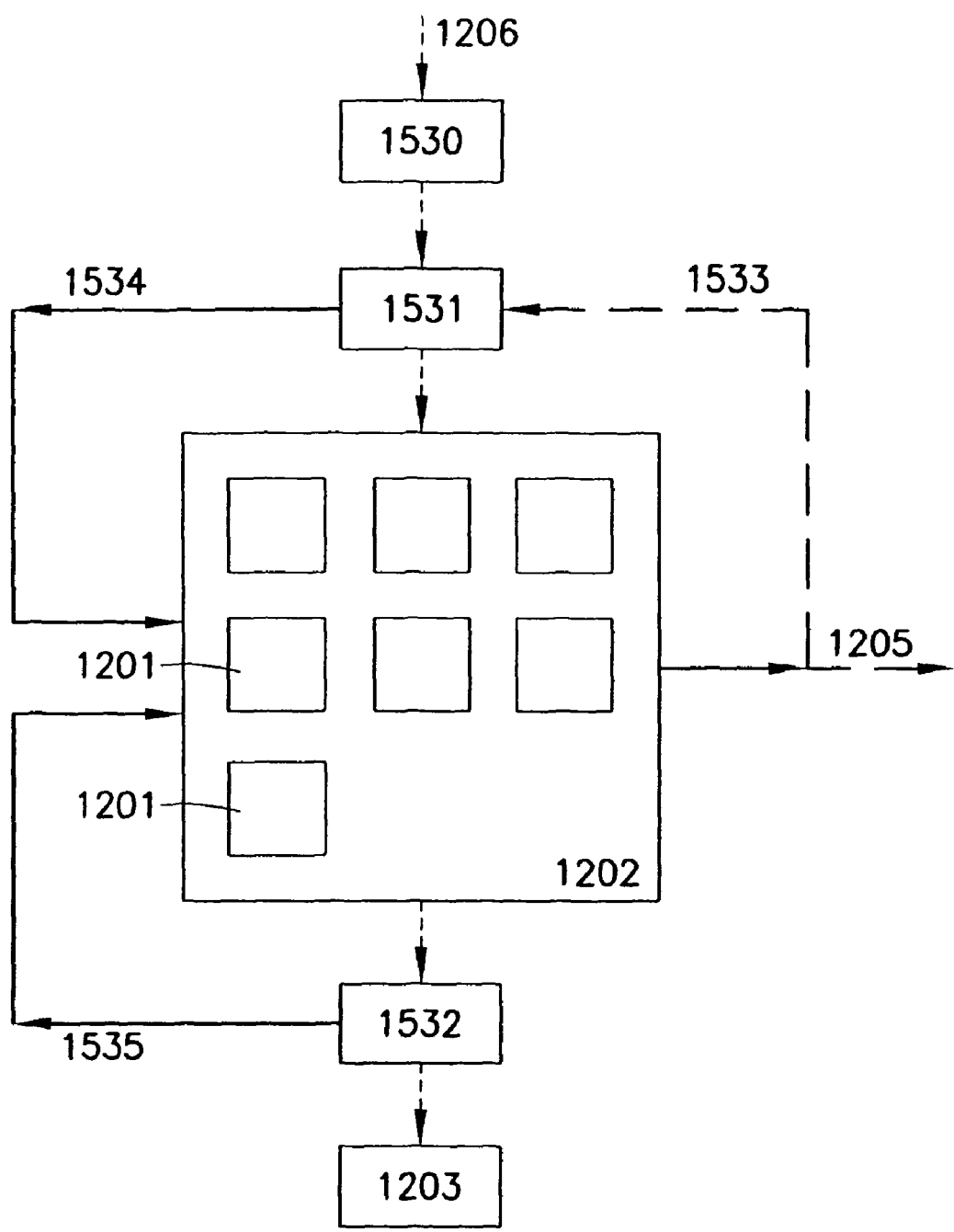

FIG. 15c shows the next step after FIG. 15b. Functional element 1202 and memories 1203, 1530, 1531, 1532 have been reconfigured following a trigger generated by the functional element or the memories or another unit and transmitted over 1206. Write memories 1510, 1520 are now configured as read memories 1531, 1532 and deliver several operands simultaneously to functional elements 1202. Each read memory 1531, 1532 is connected to 1202 via an independent bus system 1534, 1535. The results are either stored in write memory 1530 via 1533 or forwarded via 1205.

| Glossary | |
|---|---|
| ALU | Arithmetic Logic Unit. Basic unit for data processing. The unit can perform arithmetic operations such as addition, subtraction, and occasionally also multiplication, division, expansions of series, etc. The unit can be configured as an integer unit of a floating-point unit. The unit can also perform logic operations such as AND, OR, as well as comparisons. |
| data string | A data string is a series of bits, of any length. This series of bits represents a processing unit for a system. Both commands for processors or similar components and data can be coded in a data string. |
| DFP | Data flow processor according to German Patent No. DE 44 16 881. |
| DPGA | Dynamically Configurable FPGAs. Related art. |
| D Flip-Flop | Memory element, which stores a signal at the rising edge of a cycle. |
| EALU | Expanded Arithmetic Logic Unit, ALU which has been expanded to perform special functions needed or convenient for the operation of a data processing device according to German Patent Application No. DE 441 16 881 A1. These are, in particular, counters. |
| Elements | Generic concept for all enclosed units used as a part in an electronic unit. Thus, the following are defined as elements:<br>configurable cells of all types<br>clusters<br>RAM blocks<br>logics<br>arithmetic units<br>registers<br>multiplexers<br>I/O pins of a chip |
| Event | An event can be analyzed by a hardware element in any manner suitable for the application and trigger an action as a response to this analysis. Thus, for example, the following are defined as events:<br>clock pulse of a CPU<br>internal or external interrupt signal<br>trigger signal from other elements within the unit<br>comparison of a data stream and/or a command stream with a value<br>input/output events<br>run, overrun, reset of a counter<br>analysis of a comparison |
| flag | Status bit in a register showing a status. |
| FPGA | Programmable logic unit. Related art. |
| gate | Group of transistors that performs a basic logic function. Basic functions include NAND, NOR. Transmission gates. |
| configurable element | A configurable element represents a component of a logic unit, which can be set for a special function using a configuration string. Configurable elements are therefore all types of RAM cells, multiplexers, arithmetic logic units, registers, and all types of internal and external interconnecting units, etc. |
| configure | Setting the function and interconnections of a logic unit, an FPGA cell or a PAE (see reconfigure). |

-continued

| Glossary | |
|---|---|
| configuration data | Any set of configuration strings. |
| configuration memory | The configuration memory contains one or more configuration strings. |
| configuration string | A configuration string consists of a series of bits, of any length. This bit series represents a valid setting for the element to be configured, so that an operable unit is obtained. |
| PLU | Unit for configuring and reconfiguring the PAE. Constituted by a microcontroller designed specifically for this purpose. |
| latch | Memory element that usually relays a signal transparently during the H level and stores it during the L level. Latches where the level function is reversed are used in some PAEs. Here an inverter is normally connected before the cycle of a normal latch. |
| read position pointer | Address of the current record for read access within a FIFO or a ring memory. |
| logic cells | Cells used in DFPs, FPGAs, and DPGAs, performing simple logic and arithmetic functions, depending on their configuration. |
| oversampling | A clock runs with a frequency that is a multiple of the base clock, synchronously with the same. The faster clock is usually generated by a PLL. |
| PLL | Phase Locked Loop. Unit for generating a multiple of a clock frequency on the basis of a base clock. |
| PLU | Units for configuring and reconfiguring the PAE. Constituted by a microcontroller specifically designed for this purpose. |
| ring memory | Memory with its own read/write position pointer, which-upon reaching the end of the memory-is positioned at the beginning of the memory. An endless ring-shaped memory is thus obtained. |
| RS flip-flop | Reset/Set flip-flop. Memory element that can be switched by two signals. |
| write position pointer | Address of the current record for write access within a FIFO or ring memory. |
| State-Back unit | Unit that controls the feedback of status signals to the PLU, comprising a multiplexer and an open-collector bus driver element. |
| switching table | A switching table is a ring memory, which is addressed by a controller. The records of a switching table may contain any configuration strings. The controller can execute commands. The switching table responds to trigger signals and reconfigures configurable elements using a record in a ring memory. |
| gate | Switch that forwards or blocks a signal. Simple comparison: relay. |
| reconfigure | New configuration of any number of PAEs, while any remaining number of PAEs continue their functions (see configure). |
| processing cycle | A processing cycle describes the time required by a unit to go from a specific and/or valid state into the next specific and/or valid state. |
| state machine | Logic that can assume different states. The transition between the states depends on different input parameters. These machines are used for controlling complex functions and correspond to the related art. |

Conventions

| Naming conventions | |
|---|---|
| unit | UNIT |
| mode | MODE |
| multiplexer | MUX |
| negated signal | not- |
| register visible to PLU | PLUREG |
| internal register | REG |
| shift register | sft |

| Function conventions | |
|---|---|
| shift | registersft |

| AND function & | | |
|---|---|---|
| A | B | Q |
| 0 | 0 | 0 |
| 0 | 1 | 0 |
| 1 | 0 | 0 |
| 1 | 1 | 1 |

| OR function# | | |
|---|---|---|
| A | B | Q |
| 0 | 0 | 0 |
| 0 | 1 | 1 |
| 1 | 0 | 1 |
| 1 | 1 | 1 |

| NOT function! | |
|---|---|
| A | Q |
| 0 | 1 |
| 1 | 0 |

| GATE functionG | | |
|---|---|---|
| EN | D | Q |
| 0 | 0 | — |
| 0 | 1 | — |
| 1 | 0 | 0 |
| 1 | 1 | 1 |

The invention claimed is:

1. A method of processing data in a packet-wise manner using (a) an array of elements configurable with respect to function and interconnection, said array being at least two dimensional and having at least some elements that comprise arithmetic-logic units, and (b) a memory arrangement comprising at least one reading pointer separate from at least one writing pointer, said method comprising the steps of:

processing, with a plurality of said configurable elements, data comprising at least a first packet of data to ascertain a first packet of result data;

writing the first packet of result data into a memory block, said memory block being part of the memory arrangement and said at least one writing pointer being positioned so as to allow writing into a memory area of said memory block; and subsequent to the processing:

reconfiguring at least one of a first group of at least some of the plurality of said configurable elements, wherein the reconfiguring includes using a configuration data from the memory arrangement, the configuration data being provided only for said first group of at least some of the plurality of said configurable elements, while retaining a configuration of at least one other of the plurality of said configurable elements;

reading out result data of the first packet of result data from the memory after reconfiguration of said at least some of the plurality of said configurable elements in accordance with the position of the reading pointer, said reading pointer being positioned so as to allow reading undisturbed by writing of packet data into said memory arrangement; and using the reconfigured at least some of the plurality of said configurable elements to process the result data of the first packet of result data in order to obtain second result data.

2. The data-processing method as recited in claim 1, wherein the memory arrangement includes a first memory area and a second memory area, the first and second memory areas being spatially separate, the method further comprising:

in a first configuration:
using the first memory area as a write memory; and
using the second memory area as a read memory; and
subsequent to writing and reading in accordance with the first configuration, reconfiguring the at least some of the plurality of configurable elements to use the first memory area as a read memory and the second memory area as a write memory.

3. The method of claim 1, further comprising:

determining, by a controller and based on a record-type identifier within a data record, whether the data record includes configuration data or a memory control command;

writing, by the controller, at least a portion of the data record to the memory arrangement if the determination is that the data record includes configuration data; and controlling, by the controller, at least one of the at least one reading pointer and the at least writing pointer in accordance with the data record if the determination is that the data record includes a memory control command.

4. A method of processing data in a packet-wise manner using (a) an array of elements configurable with respect to function and interconnection, said array being at least two dimensional and having at least some elements that comprise arithmetic-logic units, and (b) a memory arrangement comprising at least one reading pointer separate from at least one writing pointer, said method comprising the steps of:

processing, with a plurality of said configurable elements, data comprising at least a first packet of data to ascertain a first packet of result data;

writing the first packet of result data into a memory block, said memory block being part of the memory arrangement and said at least one writing pointer being positioned so as to allow writing into a memory area of said memory block; and subsequent to the processing:

reconfiguring at least one of a first group of at least some of the plurality of said configurable elements, wherein the reconfiguring includes transferring a configuration data from the memory arrangement to the configurable elements of the first group, the configurable elements being adapted for locally storing the transferred configuration data in respective memory elements, the configuration data being provided only for said first group of at least some of the plurality of said configurable elements, while retaining a configuration of at least one other of the plurality of said configurable elements;

reading out result data of the first packet of result data from the memory after reconfiguration of said at least some of the plurality of said configurable elements in accordance with the position of the reading pointer, said reading pointer being positioned so as to allow reading undisturbed by writing of packet data into said memory arrangement; and using the reconfigured at least some of the plurality of said configurable elements to process the result data of the first packet of result data in order to obtain second result data.

* * * * *